(12) United States Patent
Kouma et al.

(10) Patent No.: US 6,969,629 B2
(45) Date of Patent: Nov. 29, 2005

(54) METHOD FOR MANUFACTURING MICRO-STRUCTURAL UNIT

(75) Inventors: Norinao Kouma, Kawasaki (JP); Osamu Tsuboi, Kawasaki (JP); Hisao Okuda, Kawasaki (JP); Hiromitsu Soneda, Kawasaki (JP); Mi Xiaoyu, Kawasaki (JP); Satoshi Ueda, Kawasaki (JP); Ippei Sawaki, Kawasaki (JP); Yoshitaka Nakamura, Yokohama (JP)

(73) Assignees: Fujitsu Limited, Kawasaki (JP); Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/791,903

(22) Filed: Mar. 4, 2004

(65) Prior Publication Data

US 2005/0037531 A1  Feb. 17, 2005

(30) Foreign Application Priority Data

Aug. 12, 2003 (JP) .............................. 2003-292555
Dec. 5, 2003 (JP) .............................. 2003-407838

(51) Int. Cl.⁷ .............................................. H01L 29/84
(52) U.S. Cl. .............................. 438/50; 438/52; 438/53; 438/706
(58) Field of Search .............................. 438/50, 52, 53, 438/706

(56) References Cited

U.S. PATENT DOCUMENTS 6,423,563 B2   7/2002  Fukada et al.

FOREIGN PATENT DOCUMENTS

| JP | 10-190007 | 7/1998 |
| JP | 10-270714 | 10/1998 |
| JP | 2000-31502 | 1/2000 |
| JP | 2003-136497 | 5/2003 |

*Primary Examiner*—Long Pham
(74) *Attorney, Agent, or Firm*—Armstrong, Kratz, Quintos, Hanson & Brooks, LLP

(57) ABSTRACT

A method for manufacturing a micro-structural unit is provided. By the method, micro-machining is performed on a material substrate including first through third conductive layers and two insulating layers, one of which is interposed between the first and the second conductive layers, and the other between the second and the third conductive layers. The method includes several etching steps performed on the layers of the material substrate that are different in thickness.

8 Claims, 28 Drawing Sheets

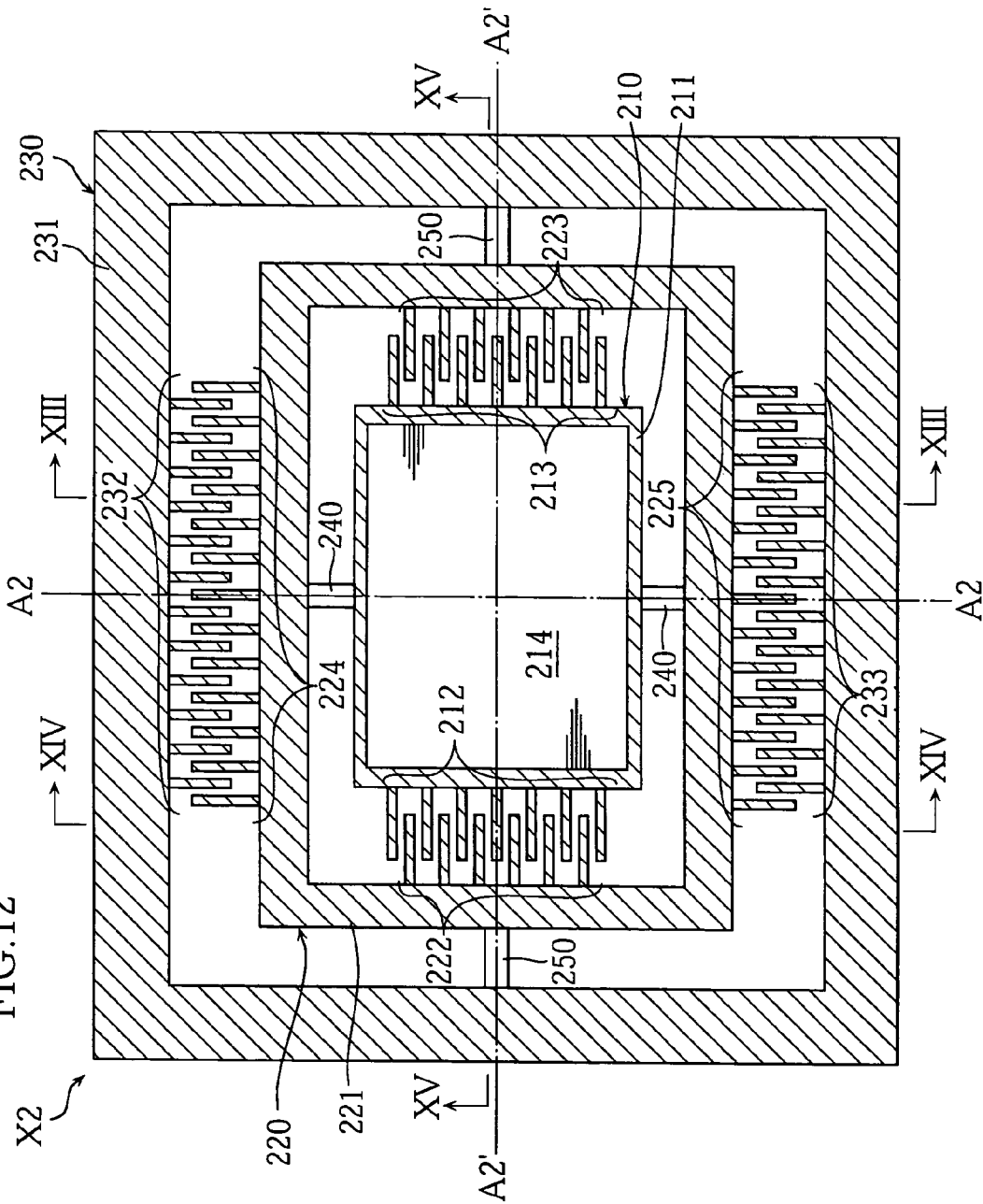

METHOD FOR MANUFACTURING MICRO-STRUCTURAL UNIT

BACKGROUND OF THE INVENTION

1. Field of the Invention

The present invention relates to a method for manufacturing micro-structural units such as micro-mirror elements, acceleration sensors, angular velocity sensors, transducer element and the like that are manufactured by micro-machining techniques.

2. Description of the Related Art

In recent years, elements having microscopic structures that are formed by micro-machining techniques have been applied in various technical fields. For example, extremely small micro-mirror elements that have a light reflecting function have attracted attention in the field of optical communications technology.

In optical communications, light signals are transmitted using optical fibers as a medium, and so-called optical switching devices are generally used for the switching of light signals from fibers that form the transmission paths to other fibers. Examples of characteristics that are required in an optical switching device in order to achieve favorable optical communications include high capacity, high speed, high reliability and the like in the switching operation. From the standpoint of such characteristics, there have been increased expectations for devices that incorporate micro-mirror elements manufactured by micro-machining techniques as optical switching devices. The reason for this is as follows: if micro-mirror elements are used, switching processing between the optical transmission path on the input side and the optical transmission path on the output side in the optical switching device can be performed without converting the light signals into electrical signals, so that such a system is suitable for obtaining the characteristics described above.

Micro-mirror elements comprise a mirror surface that is used to reflect light, and the elements can vary the direction of reflection of the light by swinging this mirror surface. Electrostatically driven micro-mirror elements which utilize an electrostatic force to swing the mirror surface are used in most devices. Electrostatically driven micro-mirror elements can be divided into two main categories, i.e., micro-mirror elements that are manufactured by so-called surface micro-machining techniques, and micro-mirror elements that are manufactured by so-called bulk micro-machining techniques.

In the case of surface micro-machining techniques, thin films of materials corresponding to the respective constituent parts are machined into desired patterns on the surface of a substrate, and respective parts that constitute the element, such as the supporting body, mirror surface, electrode parts and the like, as well as sacrifice layers that are later removed, are formed by successively laminating such patterns. On the other hand, in the case of bulk micro-machining techniques, the supporting body, mirror part and the like are formed into desired shapes by etching substrates of the materials themselves, and the mirror surface and electrodes are formed as thin films if necessary. For example, bulk micro-machining techniques are described in Japanese Patent Application Laid-Open No. H10-190007, Japanese Patent Application Laid-Open No. H10-270714 and Japanese Patent Application Laid-Open No. 2000-31502.

One technical feature that is required in micro-mirror elements is a high degree of flatness of the mirror surface that reflects the light. However, if a surface micro-machining technique is used, since the mirror surface that is ultimately formed is thin, this mirror surface tends to become easily curved. Accordingly, it is difficult to achieve a high degree of flatness in a mirror surface that has a broad area. On the other hand, if a bulk micro-machining technique is used, the mirror part is formed by etching a relatively thick material substrate itself by means of an etching technique, and a mirror surface is disposed on top of this mirror part. Accordingly, even in the case of a mirror surface with a broad area, the rigidity of this mirror surface can be ensured. Consequently, a mirror surface that has a sufficiently high degree of optical flatness can be formed.

FIG. 32 is a partially cut-away perspective view of a conventional micro-mirror element X5 mad by a bulk micro-machining technique. This micro-mirror element X5 has a mirror part 510 which has a mirror surface (not shown in the figures) formed on the upper surface, an inner frame 520 and an outer frame 530 (partially omitted), and comb tooth-shaped electrodes are integrally formed on each of these parts. In the mirror part 510, comb tooth-shaped electrodes 511 and 512 are formed on a pair of the end portions. In the inner frame 520, comb tooth-shaped electrodes 521 and 522 that extend inward are formed facing the comb tooth-shaped electrodes 511 and 512, and comb tooth-shaped electrodes 523 and 524 that face outward are also formed. In the outer frame 530, comb tooth-shaped electrodes 531 and 532 that extend inward are formed facing the comb tooth-shaped electrodes 523 and 524. Furthermore, the mirror part 510 and inner frame 520 are connected by a pair of torsion bars 540, and the inner frame 520 and outer frame 530 are connected by a pair of torsion bars 550. The pair of torsion bars 540 define the axis of rotation A5 of the rotating action of mirror part 510 with respect to the inner frame 520, and the pair of torsion bars 550 define the axis of rotation A5' of the rotating action of the inner frame 520 with respect to the outer frame 530, and the accompanying rotating action of the mirror part 510.

In the micro-mirror element X5 constructed in this manner, the set of comb tooth-shaped electrodes that are disposed in close proximity in order to generate an electrostatic force, e.g., the comb tooth-shaped electrodes 511 and 521, adopt an orientation in which the electrodes are separated into two tiers above and below as shown in FIG. 33A when no voltage is applied. On the other hand, when a specified voltage is applied, the comb tooth-shaped electrode 511 is drawn into the comb tooth-shaped electrode 521 as shown in FIG. 33B; as a result, the mirror part 510 swings. More specifically, when the comb tooth-shaped electrode 511 is positively charged and the comb tooth-shaped electrode 521 is negatively charged, for example, the mirror part 510 rotates about the axis of rotation A5 while twisting the pair of torsion bars 540. On the other hand, when the comb tooth-shaped electrode 523 is positively charged and the comb tooth-shaped electrode 531 is negatively charged, the inner frame 520 and accompanying mirror part 510 rotate about the axis of rotation A5' while twisting the pair of torsion bars 550. Such rotational driving of the mirror part 510 allows the switching of the direction of reflection of the light that is reflected by the mirror surface (not shown in the figures) disposed on the mirror part 510.

FIG. 34 shows a conventional method used to manufacture the micro-mirror element X5. In FIG. 34, the formation processes of a portion of the mirror part 510, the inner frame 520, the outer frame 530, the torsion bars 540 and portions of the set of comb tooth-shaped electrodes 511 and 521 shown in FIG. 32 are expressed by changes in a single cross section. This single cross section is expressed as a continuous cross section by modeling a plurality of cross sections contained in a single micro-switching element formation region in the material substrate (wafer) on which machining is performed.

In the manufacturing method of the micro-mirror element X5, a wafer S5 such as that shown in FIG. 34A is first prepared. The wafer S5 is a so-called SOI (silicon on insulator) wafer, and has a laminated structure comprising a silicon layer 501, a silicon layer 502 and an insulating layer 503 located between these silicon layers. Next, as shown in FIG. 34B, anisotropic etching is performed on the silicon layer 501 via a specified mask so that the structural parts that are to be formed in the silicon layer 501, such as the mirror part 510, a portion of the inner frame 520, a portion of the outer frame 530, the torsion bars 540, the comb tooth-shaped electrode 511 and the like, are formed.

Next, as shown in FIG. 34C, anisotropic etching is performed on the silicon layer 502 via a specified mask so that the structural parts that are to be formed in the silicon layer 502, such as a portion of the inner frame 520, a portion of the outer frame 530, the comb tooth-shaped electrode 521 and the like, are formed. Next, as shown in FIG. 34D, isotropic etching is performed on the insulating layer 502 so that locations that are exposed in the insulating layer 503 are removed. In this way, the mirror part 510, inner frame 520, outer frame 530, torsion bars 540 and set of comb tooth-shaped electrodes 511 and 512 are formed. The other sets of comb tooth-shaped electrodes are formed in the same manner as the comb tooth-shaped electrodes 511 and 521, and the torsion bars 550 are formed in the same manner as the torsion bars 540.

In the micro-mirror element X5, since the respective comb tooth-shaped electrodes are displaced along with the rotating action of the mirror part 510 and inner frame 520, the respective comb tooth-shaped electrodes must have a sufficient thickness that is suited to the inclination angle of the mirror part 510 and inner frame 520. This thickness corresponds to the dimension of the wafer S5 in the direction of thickness. For example, in a case where the length D of the body part 513 of the mirror part 510 is 1 mm, if the mirror part 510 is inclined by 5° about the axis of rotation A5 with respect to the inner frame 520, then one body end part 513' will sink in by 44 μm. Accordingly, the thickness of the comb tooth-shaped electrodes 511 and 512 of the mirror part 510 must be 44 μm or greater.

From the standpoint of obtaining a large inclination angle using a small applied voltage, it is desirable to form the torsion bars 540 and 550 (which have a resistance to twisting) with a small thickness in order to reduce this resistance to twisting. However, in the case of the conventional micro-mirror element X5 described above, the torsion bars 540 and 550 are formed with the same thickness as the respective comb tooth-shaped electrodes, and are therefore thick. For example, if the thickness of the comb tooth-shaped electrodes 511 and 512 is set at 44 μm or greater as described above, then the thickness of the torsion bars 540 and 550 is also 44 μm or greater. In the micro-mirror element X5, since the torsion bars 540 and 550 are thus thick, the electrostatic force that must be generated between the comb tooth-shaped electrodes in order to twist these torsion bars is relatively large; accordingly, the required driving voltage is relatively large.

Furthermore, from the standpoint of reducing the weight of the mirror part 510 and thus lessening the inertia of this part, it is desirable to form the mirror part 510 with a small thickness. However, in the conventional micro-mirror element X5 described above, the mirror part 510 as a whole is formed (for example) with the same thickness as the comb tooth-shaped electrodes 511, 512, 523 and 524, and is thus thick. Since the mirror part 510 as a whole is thus thick, the mass of the mirror part 510, and therefore the inertia of this part, is relatively large. As a result, in the micro-mirror element X5, there may be cases in which the desired frequency response characteristics cannot be obtained with regard to the rotational displacement of the mirror part 510. Furthermore, in order to increase the rotational angle in the rotational displacement of the mirror part 510, it is necessary to increase the thickness of the comb tooth-shaped electrodes and increase the driving force. However, in the micro-mirror element X5, this increase in the thickness of the comb tooth-shaped electrodes leads to an increase in the mass of the mirror part 510, and thus to an increase in the inertia of the mirror part 510. Thus, in the micro-mirror element X5, there is some difficulty involved in obtaining good frequency response characteristics while achieving a large rotational angle of the mirror part 510.

Meanwhile, in the micro-mirror element manufacturing process described above, it is desirable from the standpoint of preventing damage to the wafer S5 that this wafer S5 be thick. However, in the above-described manufacturing method of the micro-mirror element X5, since the thickness of the wafer S5 is directly reflected in the total thickness of one set of comb tooth-shaped electrodes (e.g., the set of comb tooth-shaped electrodes 511 and 521), a wafer S5 with a thickness that is substantially the same as the total thickness of one set of comb tooth-shaped electrodes in the micro-mirror element X5 that is the object of manufacture must be used. For example, in a case where the total thickness of one set of comb tooth-shaped electrodes that is to be formed is 200 μm, a wafer S5 with a thickness of 200 μm must be used in order to form a micro-mirror element X5 that has such a pair of comb tooth-shaped electrodes. In cases where the total thickness of the wafer S5 is less than about 200 μm, damage to the wafer S5 tends to occur in the element manufacturing process; accordingly, the mass production of such elements is difficult.

In micro-structural units that are manufactured by micromachining techniques, the various structural parts that are formed by etching in the material substrate (wafer) have respective desired thicknesses in most cases (as was described above). However, in conventional bulk micromachining techniques, since the degree of freedom regarding the thickness dimensions of the respective structural parts in a single micro-structural unit is low as was described above, it tends to be difficult to realize the desired thickness dimensions for each of a plurality of structural parts that have different thicknesses.

SUMMARY OF THE INVENTION

The present invention has been proposed under the circumstances described above. It is therefore an object of the present invention to provide a method for manufacturing micro-structural units which is suitable for realizing desired thickness dimensions for each of a plurality of structural parts that have different thicknesses.

In a first aspect of the present invention, a method is provided for manufacturing a micro-structural unit by performing machining on a material substrate which has a laminated structure that comprises a first conductive layer, a second conductive layer, a third conductive layer, a first insulating layer that is interposed between the first conductive layer and second conductive layer, and a second insulating layer that is interposed between the second conductive layer and third conductive layer. This method comprises a first etching step for performing an etching treatment on the first conductive layer to an intermediate point in the direction of thickness of the first conductive layer via a first mask pattern and a second mask pattern formed on the surface of the first conductive layer. Then, the second mask is removed, which is followed by a second etching step for performing an etching treatment on the first conductive layer via the first mask pattern until the first insulating layer is reached. Thus, residual mask parts that contact the first insulating layer are residually formed. Then, in a third etching step, an etching treatment is performed, via the residual mask parts, on the portions of the first insulating layer that were exposed in the second etching step, and the etching treatment is continued until the second insulating layer is reached. In a fourth etching step, the residual mask parts are removed by etching, and the portions of the second insulating layer that were exposed in the third etching step are subjected to etching.

If such a method is used, desired thickness dimensions can be realized with a high degree of freedom or each of a plurality of structural parts with different thicknesses in the micro-structural unit that is manufactured.

The first mask pattern in the first aspect of the present invention covers specified regions on the outer surface of the first conductive layer (i.e., the surface that is on the opposite side from the surface that contacts the first insulating layer). In the solid region (first region) which extends in the direction of thickness of the material substrate from the first conductive layer to the third conductive layer of the substrate, and in which the outer surface of the first conductive layer is covered by the first mask pattern, the respective layers (first through third conductive layers and first and second insulating layers) are not deliberately etched in the first through fourth etching steps. Accordingly, in cases where the respective layers in the first region are not etched by etching treatments other than the etching treatments performed in the first through fourth etching steps, a structural part which has the total thickness of the first through third conductive layers and first and second insulating layers is formed in the first region. Furthermore, a structural part that has a different thickness can be formed in the first region by performing a specified etching treatment other than the etching treatments performed in the first through fourth etching steps. For example, in a case where the third conductive layer, third conductive layer and second insulating layer, region extending from the third conductive layer to the second conductive layer or region extending from the third conductive layer to the first insulating layer within the first region is removed by performing a specified etching treatment from the side of the third conductive layer at some point up to the fourth etching step or following the fourth etching step, a structural part which has some thickness dimension that is set from the beginning within the material substrate (e.g., the total thickness of the first conductive layer, first insulating layer and second conductive layer in a case where the third conductive layer and second insulating layer are removed) is formed in the first region.

The second mask pattern in the first aspect of the present invention covers specified regions on the outer surface of the first conductive layer. In the solid region (second region) which extends in the direction of thickness of the material substrate from the first conductive layer to the third conductive layer of the substrate, and in which the outer surface of the first conductive layer is covered by the second mask pattern, the first conductive layer is not deliberately etched in the first or third etching steps, but is etched in the second and fourth etching steps. In the second etching step, residual mask parts are formed by the first conductive layer in the second region, and these residual mask parts are removed in the fourth etching step. The other layers (second and third conductive layers and first and second insulating layers) in the second region are not deliberately etched in the first through fourth etching steps. Accordingly, in cases where the layers other than the first conductive layer in the second region are not etched by etching treatments other than the etching treatments performed in the first through fourth etching steps, a structural part which has the total thickness of the second and third conductive layers and first and second insulating layers is formed in the second region. Furthermore, a structural part which has a different thickness can be formed in the second region by performing a specified etching treatment other than the etching treatments performed in the first through fourth etching steps. For example, the first insulating layer within the second region can be removed by etching (if necessary) following the fourth etching step. The third conductive layer or the third conductive layer and second insulating layer within the second region can also be removed (if necessary) by performing an etching treatment from the side of the third conductive layer at some point up to the fourth etching step or following the fourth etching step.

A region that is not covered by any mask pattern in the first etching step is present on the outer surface of the first conductive layer. In the solid region (third region) which extends in the direction of thickness of the material substrate from the first conductive layer to the third conductive layer of the substrate, and in which the outer surface of the first conductive layer is not covered by any mask pattern, the first conductive layer is etched in the first and second etching steps, the first insulating layer is etched in the third etching step, and the second conductive layer is etched to at least an intermediate point in the direction of thickness in the fourth etching step. In a case where the second conductive layer within the third region is removed in the fourth etching step, and the third conductive layer within the third region is not etched by an etching treatment other than the etching treatments performed in the first through fourth etching steps, a structural part that has the total width of the of the third conductive layer and second insulating layer is formed in the third region. Furthermore, a structural part that has a different width can be formed in the third region by performing a specified etching treatment other than the etching treatments performed in the first through fourth etching steps. For example, in a case where the second conductive layer within the third region is removed in the fourth etching step, the second insulating layer within the third region can be removed by etching (if necessary) following the fourth etching step. A portion of the third conductive layer within the third region can be removed (if necessary) by performing a specified etching treatment from the side of the third conductive layer at some point up to the fourth etching step or following the fourth etching step.

Thus, if the micro-structural unit manufacturing method of the first aspect of the present invention is used, desired thickness dimensions can be realized with a high degree of freedom for each of a plurality of structural parts in a single micro-structural unit that is manufactured. This micro-structural unit manufacturing method is suitable for the appropriate formation of respective structural parts in accordance with desired functions in a micro-structural unit used as a specified element.

In the fourth etching step of the first aspect of the present invention, an etching treatment is preferably performed on the portions of the second conductive layer that were exposed in the third etching step, until the second insulating layer is reached. If such a construction is used, a structural part that lacks at least portions originating in the first conductive layer, portions originating in the first insulating layer and portions originating in the second conductive layer can be formed in the third region described above.

The method according to the first aspect of the present invention preferably may comprise a fifth etching step for performing an etching treatment on the third conductive layer via a third mask pattern formed on top of the third conductive layer, until the second insulating layer is reached. Such a construction is suitable for the separate realization of desired thicknesses with a high degree of freedom for each of a plurality of structural parts formed in the first through third regions described above, and for forming specified partial shapes for specified structural parts are required. This fifth etching step in which an etching treatment is performed on the material substrate from the side of the first conductive layer may be performed at any timing prior to the first etching step (involved in the etching treatment that is performed from the side of the first conductive layer), following the fourth etching step, or at some point following the first etching step and prior to the fourth etching step. The same is true regarding the timing of other etching steps (described later) in which an etching treatment is performed from the side of the third conductive layer in the first aspect of the present invention.

In a preferred embodiment of the first aspect of the present invention, the first mask pattern comprises mask parts for a comb tooth-shaped electrode, first conductive parts of the comb tooth-shaped electrode are formed (corresponding to the comb tooth-shaped electrode mask parts) in the first conductive layer in the first and second etching steps, insulating parts of the comb tooth-shaped electrode are formed (corresponding to these first conductive parts) in the first insulating layer in the third etching step, and second conductive parts of the comb tooth-shaped electrode are formed (corresponding to these insulating parts) in the second conductive layer in the fourth etching step. For example, the expression "first conductive parts of the comb tooth-shaped electrode are formed (corresponding to the comb tooth-shaped electrode mask parts) in the first conductive layer" means that the first conductive parts that form portions of the comb tooth-shaped electrode are formed with a pattern shape that corresponds to the pattern shape of the comb tooth-shaped electrode mask parts installed on the surface of the first conductive layer. In the case of such a construction, a comb tooth-shaped electrode can be formed, which has a laminated structure comprising first conductive parts that originate in the first conductive layer, insulating parts that originate in the first insulating layer and second conductive parts that originate in the second conductive layer. There may be cases in which a set of so-called comb tooth-shaped electrodes that are used to generate an electrostatic force between the electrodes is required in a micro-structural unit used as a specified element.

In another preferred embodiment of the first aspect of the present invention, the third mask pattern comprises first mask parts for a comb tooth-shaped electrode, the second mask pattern comprises second mask parts for the comb tooth-shaped electrode, first conductive parts of the comb tooth-shaped electrode are formed (corresponding to the first mask parts for comb tooth-shaped electrodes) in the third conductive layer in the fifth etching step, residual mask parts for the comb tooth-shaped electrode are formed (corresponding to the second mask parts for comb tooth-shaped electrodes) in the first conductive layer in the second etching step, second conductive parts of the comb tooth-shaped electrode are formed (corresponding to the residual mask parts for comb tooth-shaped electrodes) in the second conductive layer in the fourth etching step, and the residual mask parts for comb tooth-shaped electrodes are also removed in this fourth etching step. Furthermore, the present method may further comprise a sixth etching step for forming insulating parts of the comb tooth-shaped electrode (that are interposed between the first conductive parts and second conductive parts) in the second insulating layer. As a result of this construction, comb tooth-shaped electrode which have a laminated structure comprising first conductive parts originating in the third conductive layer, insulating parts originating in the second insulating layer and second conductive parts originating in the second conductive layer can be formed.

In another preferred embodiment of the first aspect of the present invention, the third mask pattern comprises first mask parts for a first comb tooth-shaped electrode, the second mask pattern comprises second mask parts for the first comb tooth-shaped electrode, the first mask pattern comprises mask parts for a second comb tooth-shaped electrode, first conductive parts of the first comb tooth-shaped electrode are formed (corresponding to the first mask parts for the first comb tooth-shaped electrodes) in the third conductive layer in the fifth etching step, residual mask parts for the first comb tooth-shaped electrode are formed corresponding to the second mask parts for the first comb tooth-shaped electrode, and first conductive parts of the second comb tooth-shaped electrode are formed corresponding to the mask parts for the second comb tooth-shaped electrode, in the first conductive layer in the second etching step, and insulating parts of the second comb tooth-shaped electrode are formed (corresponding to the first conductive parts of the second comb tooth-shaped electrodes) in the first insulating layer in the third etching step; furthermore, in the fourth etching step, second conductive parts of the first comb tooth-shaped electrode are formed (corresponding to the residual mask parts for the first comb tooth-shaped electrodes) in the second conductive layer, second conductive parts of the second comb tooth-shaped electrode are formed (corresponding to the insulating parts of the second comb tooth-shaped electrode parts) in the second conductive layer, and the residual mask parts for the first comb tooth-shaped electrode are removed by etching. In addition, in this preferred embodiment, a sixth etching step for forming insulating parts of the first comb tooth-shaped electrode (that are interposed between the first and second conductive parts of the first comb tooth-shaped electrode parts) in the second insulating layer is further performed. As a result of this construction, a first comb tooth-shaped electrode which has a laminated structure comprising first conductive parts originating in the third conductive layer, insulating parts originating in the second insulating layer and second conductive parts originating in the second conductive layer, as well as second comb tooth-shaped electrode which has a laminated structure comprising first conductive parts originating in the first conductive layer, insulating parts originating in the first insulating layer and second conductive parts originating in the second conductive layer, can be formed. Furthermore, in such a construction, the first and second comb tooth-shaped electrodes partially overlap in the direction of thickness of the substrate.

In a second aspect of the present invention, a method is provided which is used to manufacture a micro-structural unit by performing machining on a material substrate having a laminated structure comprising a first conductive layer, a second conductive layer, a third conductive layer, a first insulating layer that is interposed between the first conductive layer and second conductive layer, and a second insulating layer that is interposed between the second conductive layer and third conductive layer. This method comprises a first etching step for performing an etching treatment on the first conductive layer via a first mask pattern and second mask pattern formed on the surface of this first conductive layer, until the first insulating layer is reached, a second etching step for performing an etching treatment on the portions of the first insulating layer exposed in the first etching step, until the second conductive layer is reached, a step for removing the second mask pattern, and a third etching step for performing an etching treatment on the first conductive layer via the first mask pattern, for performing an etching treatment on the portions of the second conductive layer that were exposed in the second etching step.

If such a method is used, desired thickness dimensions can be realized with a high degree of freedom for each of a plurality of structural parts with different thicknesses in the micro-structural unit that is manufactured.

The first mask pattern in the second aspect of the present invention covers specified regions on the outer surface of the first conductive layer. In the solid region (first region) which extends in the direction of thickness of the material substrate from the first conductive layer to the third conductive layer of the substrate, and in which the outer surface of the first conductive layer is covered by the first mask pattern, the respective layers (first through third conductive layers and first and second insulating layers) are not deliberately etched in the first through third etching steps. Accordingly, in cases where the respective layers within the first region are not etched by an etching treatment other than the etching treatments performed in the first through third etching steps, a structural part which has the total thickness of the first through third conductive layers and the first and second insulating layers is formed in the first region. Furthermore, a structural part that has a different thickness can be formed in the first region by performing a specified etching treatment other than the etching treatments performed in the first through third etching steps.

The second mask pattern in the second aspect of the present invention covers specified regions on the outer surface of the first conductive layer. In the solid region (second region) which extends in the direction of thickness of the material substrate from the first conductive layer to the third conductive layer of the substrate, and in which the outer surface of the first conductive layer is covered by the second mask pattern, the first conductive layer is not deliberately etched in the first or second etching steps, but is etched at least to an intermediate point in the direction of thickness in the third etching step. The other layers within the second region (second and third conductive layers and first and second insulating layers) are not deliberately etched in the first through third etching steps. Accordingly, in cases where the layers other than the first conductive layer within the second region are not etched by an etching treatment other than the etching treatments performed in the first through third etching steps, a structural part which has the total thickness of the second and third conductive layers and first and second insulating layers is formed in the second region. Furthermore, a structural part that has a different thickness can be formed in the second region by performing a specified etching treatment other than the etching treatments performed in the first through third etching steps.

A region that is not covered by any mask pattern in the first etching step is present on the outer surface of the first conductive layer. In the solid region (third region) which extends in the direction of thickness of the material substrate from the first conductive layer to the third conductive layer of the substrate, and in which the outer surface of the first conductive layer is not covered by any mask pattern, the first conductive layer is removed in the first etching step, the first insulating layer is removed in the second etching step, and the second conductive layer is etched to at least an intermediate point in the direction of thickness in the third etching step. In cases where the second conductive layer within the third region is removed in the third etching step, and the third conductive layer within the third region is not etched by an etching treatment other than the etching treatments performed in the first through third etching steps, a structural part which has the total thickness of the third conductive layer and the second insulating layer is formed in the third region. Furthermore, a structural part that has a different thickness can be formed in the third region by performing a specified etching treatment other than the etching treatments performed in the first through third etching steps.

Thus, if the micro-structural unit manufacturing method of this second aspect of the present invention is used, desired thickness dimensions can be realized with a high degree of freedom or each of a plurality of structural parts in a single micro-structural unit that is manufactured, in the same manner as described above with regard to the first aspect of the present invention. Such a micro-structural unit manufacturing method is suitable for the appropriate formation of respective structural parts in accordance with desired functions in a micro-structural unit used as a specified element.

Preferably, in the third etching step of the second aspect of the present invention, an etching treatment is performed on the first conductive layer until the first insulating layer is reached, and an etching treatment is performed on the portions of the second conductive layer that were exposed in the second etching step until the second insulating layer is reached. If such a construction is used, then a structural part which lacks at least portions originating in the first conductive layer can be formed in the abovementioned second region, and a structural part which lacks at least portions originating in the first conductive layer, portions originating in the first insulating layer and portions originating in the second conductive layer can be formed in the abovementioned third region.

The method of the second aspect of the present invention preferably comprises a fourth etching step for performing an etching treatment on the third conductive layer via a third mask pattern formed on this third conductive layer, until the second insulating layer is reached. Such a construction is suitable for realizing desired thicknesses separately with a high degree of freedom for each of a plurality of structural parts formed in the abovementioned first through third regions, and for forming specified partial shapes as required for specified structural parts. The fourth etching step in which an etching treatment is performed on the material substrate from the side of the third conductive layer may be performed at any timing prior to the first etching step (involved in the etching treatment that is performed from the side of the first conductive layer), following the third etching step, or at some point following the first etching step and prior to the third etching step. The same is true regarding the timing of other etching treatments (described later) that are performed from the side of the third conductive layer in the second aspect of the present invention.

In a preferred embodiment of the second aspect of the present invention, the first mask pattern comprises mask parts for a comb tooth-shaped electrode, first conductive parts of the comb tooth-shaped electrode are formed (corresponding to the comb tooth-shaped electrode mask parts) in the first conductive layer in the first etching step, insulating parts of the comb tooth-shaped electrode are formed (corresponding to the first conductive parts) in the first insulating layer in the second etching step, and second conductive parts of the comb tooth-shaped electrode are formed (corresponding to the insulating parts) in the in the second conductive layer in the third etching step. As a result of such a construction, comb tooth-shaped electrode with a laminated structure comprising first conductive parts originating in the first conductive layer, insulating parts originating in the first insulating layer and second conductive parts originating in the second conductive layer can be formed.

In another preferred embodiment of the second aspect of the present invention, the third mask pattern comprises first mask parts for a comb tooth-shaped electrode, the second mask pattern comprises second mask parts for the comb tooth-shaped electrode, first conductive parts of the comb tooth-shaped electrode are formed (corresponding to the first mask parts for the comb tooth-shaped electrodes) in the third conductive layer in the fourth etching step, residual mask parts for the comb tooth-shaped electrode are formed (corresponding to the second mask parts for the comb tooth-shaped electrode) in the first conductive layer in the first etching step, and the residual mask parts for the comb tooth-shaped electrodes are removed by etching while second conductive parts of the comb tooth-shaped electrode are formed (corresponding to the residual mask parts for the comb tooth-shaped electrodes) in the second conductive layer in the third etching step. Furthermore, in this preferred embodiment, a fifth etching step for forming insulating parts of the comb tooth-shaped electrode that are interposed between the first conductive parts and second conductive parts in the second insulating layer is further performed. As a result of such a construction, comb tooth-shaped electrode with a laminated structure comprising first conductive parts originating in the third conductive layer, insulating parts originating in the second insulating layer and second conductive parts originating in the second conductive layer can be formed.

In another preferred embodiment of the second aspect of the present invention, the third mask pattern comprises first mask parts for first comb tooth-shaped electrodes, the second mask pattern comprises second mask parts for the first comb tooth-shaped electrodes, the first mask pattern comprises mask parts for the second comb tooth-shaped electrodes, first conductive parts of the first comb tooth-shaped electrode are formed (corresponding to the first mask parts for the first comb tooth-shaped electrode parts) in the third conductive layer in the fourth etching step, residual mask parts for the first comb tooth-shaped electrodes are formed (corresponding to the second mask parts for the first comb tooth-shaped electrodes) in the first conductive layer, and first conductive parts of the second comb tooth-shaped electrode parts are also formed (corresponding to the mask parts for the second comb tooth-shaped electrodes) in the first conductive layer, in the first etching step, insulating parts of the second comb tooth-shaped electrode are formed (corresponding to the first conductive parts of the second comb tooth-shaped electrode parts) in the first insulating layer in the second etching step, and second conductive parts of the first comb tooth-shaped electrode are formed (corresponding to the residual mask parts for the first comb tooth-shaped electrodes) in the second conductive layer, second conductive parts of the second comb tooth-shaped electrode are also formed (corresponding to the insulating parts of the second comb tooth-shaped electrode parts) in the second conductive layer, and the residual mask parts for the first comb tooth-shaped electrodes are removed by etching, in the third etching step. Furthermore, in this preferred embodiment, a fifth etching step for forming insulating parts of the first comb tooth-shaped electrode that are interposed between the first and second conductive parts of the first comb tooth-shaped electrode in the second insulating layer is further performed. As a result of this construction, first comb tooth-shaped electrode parts that have a laminated structure comprising first conductive parts originating in the third conductive layer, insulating parts originating in the second insulating layer and second conductive parts originating in the second conductive layer, and second comb tooth-shaped electrode part s that have a laminated structure comprising first conductive parts originating in the first conductive layer, insulating parts originating in the first insulating layer and second conductive parts originating in the second conductive layer, can be formed. Furthermore, in such a construction, the first and second comb tooth-shaped electrodes partially overlap in the direction of thickness.

Preferably, the method of the second aspect of the present invention further comprises a fifth etching step for performing an etching treatment on the portions of the second insulating layer that were exposed in the fourth etching step until the second conductive layer is reached, and a sixth etching step for performing an etching treatment on the portions of the second conductive layer that were exposed in the fifth etching step until the first insulating layer is reached. Such a construction is suitable for separately realizing desired thicknesses with a high degree of freedom for each of a plurality of structural parts that are formed in the above-mentioned first through third regions, and for forming specified partial shapes as required for specified structural parts.

In another preferred embodiment of the second aspect of the present invention, the third mask pattern comprises mask parts for comb tooth-shaped electrodes, first conductive parts of comb tooth-shaped electrode are formed (corresponding to the mask parts for the comb tooth-shaped electrodes) in the third conductive layer in the fourth etching step, insulating parts of the comb tooth-shaped electrode are formed (corresponding to the first conductive parts) in the second insulating layer in the fifth etching step, and second conductive parts of the comb tooth-shaped electrode are formed (corresponding to the insulating parts) in the second conductive layer in the sixth etching step. If this construction is used, comb tooth-shaped electrode with a laminated structure comprising first conductive parts originating in the third conductive layer, insulating parts originating in the second insulating layer and second conductive parts originating in the second conductive layer can be formed.

In another preferred embodiment of the second aspect of the present invention, the third mask pattern comprises first mask parts for a comb tooth-shaped electrode, the first mask pattern comprises second mask parts for the comb tooth-shaped electrode, first conductive parts of the comb tooth-shaped electrode are formed (corresponding to the first mask parts for the comb tooth-shaped electrodes) in the third conductive layer in the fourth etching step, first insulating parts of the comb tooth-shaped electrode are formed (corresponding to the first conductive parts) in the second insulating layer in the fifth etching step, second conductive parts of the comb tooth-shaped electrode are formed (corresponding to the first insulating parts) in the second conductive layer in the sixth etching step, and third conductive parts of the comb tooth-shaped electrode are formed (corresponding to the second mask parts for the comb tooth-shaped electrodes) in the first conductive layer in the third etching step. Furthermore, in this preferred embodiment, a seventh etching step for forming second insulating parts of the comb tooth-shaped electrode that are interposed between the second conductive parts and third conductive parts in the first insulating layer is further performed. As a result of such a construction, comb tooth-shaped electrode with a laminated structure comprising first conductive parts originating in the third conductive layer, first insulating parts originating in the second insulating layer, second conductive parts originating in the second conductive layer, second insulating parts originating in the first insulating layer and third conductive parts originating in the first conductive layer can be formed.

In another preferred embodiment of the second aspect of the present invention, the third mask pattern comprises mask parts for a first comb tooth-shaped electrode and mask parts for a second comb tooth-shaped electrode, the first mask pattern comprises second mask parts for the second comb tooth-shaped electrode, first conductive parts of the first comb tooth-shaped electrode are formed (corresponding to the mask parts for the first comb tooth-shaped electrodes) in the third conductive layer, and first conductive parts of the second comb tooth-shaped electrode are also formed (corresponding to the first mask parts for the second comb tooth-shaped electrodes) in the third conductive layer, in the fourth etching step, insulating parts of the first comb tooth-shaped electrode are formed (corresponding to the first conductive parts of the first comb tooth-shaped electrode parts) in the second insulating layer, and first insulating parts of the second comb tooth-shaped electrode are also formed (corresponding to the first conductive parts of the second comb tooth-shaped electrode parts) in the second insulating layer, in the fifth etching step, second conductive parts of the first comb tooth-shaped electrode are formed (corresponding to the insulating parts of the first comb tooth-shaped electrode parts) in the second conductive layer, and second conductive parts of the second comb tooth-shaped electrode parts are also formed (corresponding to the first insulating parts of the second comb tooth-shaped electrode parts) in the second conductive layer, in the sixth etching step, and third conductive parts of the second comb tooth-shaped electrode are formed (corresponding to the second mask parts for the second comb tooth-shaped electrodes) in the first conductive layer in the third etching step. Furthermore, in this preferred embodiment, a seventh etching step for forming second insulating parts of the second comb tooth-shaped electrode that are interposed between the second and third conductive parts of the second comb tooth-shaped electrode in the first insulating layer is further performed. As a result of this construction, first comb tooth-shaped electrode with a laminated structure comprising first conductive parts originating in the third conductive layer, insulating parts originating in the second insulating layer and second conductive parts originating in the second conductive layer, as well as second comb tooth-shaped electrode parts that have a laminated structure comprising first conductive parts originating in the third conductive layer, first insulating parts originating in the second insulating layer, second conductive parts originating in the second conductive layer, second insulating parts originating in the first insulating layer and third conductive parts originating in the first conductive layer can be formed.

Furthermore, in such a construction, the first and second comb tooth-shaped electrodes partially overlap in the direction of thickness.

Preferably, the method of the second aspect of the present invention further comprises a fourth etching step for performing an etching treatment on the third conductive layer via a third mask pattern and fourth mask pattern formed on the surface of the third conductive layer, until the second insulating layer is reached, a fifth etching step for performing an etching treatment on the portions of the second insulating layer that were exposed in the fourth etching step, a step for removing the fourth mask pattern, and a sixth etching step for performing an etching treatment on the third conductive layer via the third mask pattern until the second insulating layer is reached, and for performing an etching treatment on the portions of the second conductive layer that were exposed in the fifth etching step, until the first insulating layer is reached. Such a construction is suitable for separately realizing desired thicknesses with a high degree of freedom for each of a plurality of structural parts that are formed in the abovementioned first through third regions, and for forming specified partial shapes as required for specified structural parts.

In another preferred embodiment of the second aspect of the present invention, the third mask pattern comprises mask parts for first comb tooth-shaped electrodes and first mask parts for second comb tooth-shaped electrodes, the second mask pattern comprises second mask parts for the first comb tooth-shaped electrodes, first comb tooth-shaped electrode parts are formed (corresponding to the mask parts for the first comb tooth-shaped electrodes) in the third conductive layer, and first residual mask parts for the second comb tooth-shaped electrodes are also formed (corresponding to the first mask parts for the second comb tooth-shaped electrodes) in the third conductive layer, in the fourth etching step, residual mask parts for the first comb tooth-shaped electrodes are formed (corresponding to the first comb tooth-shaped electrode parts) in the second conductive layer, second comb tooth-shaped electrodes are also formed (corresponding to the first residual mask parts for the second comb tooth-shaped electrodes) in the second conductive layer, and the first residual mask parts for the second comb tooth-shaped electrodes are removed, in the sixth etching step, second residual mask parts for the second comb tooth-shaped electrodes are formed (corresponding to the second mask parts for the second comb tooth-shaped electrodes) in the in the first conductive layer in the first etching step, and the residual mask parts for the first comb tooth-shaped electrodes and second residual mask parts for the second comb tooth-shaped electrodes are removed by etching in the third etching step. If such a construction is used, patterning on the third conductive layer can be performed by means of the mask parts for the first comb tooth-shaped electrodes and the first mask parts for the second comb tooth-shaped electrodes for each of a set of comb tooth-shaped electrode parts used to generate an electrostatic force between these comb tooth-shaped electrode parts. This construction, which allows the patterning of both electrode parts on the same plane, is suitable for accomplishing high-precision and easy positioning of both electrode parts.

Preferably, the methods of the first and second aspects of the present invention further comprise a step for forming first conductive connecting parts that pass through the first insulating layer and electrically connect the first conductive layer and second conductive layer, and/or a step for forming second conductive connecting parts that pass through the second insulating layer and electrically connect the third conductive layer and second conductive layer. If such a construction is used, specified parts that are formed with an origin in the first conductive layer and specified parts that are formed with an origin in the second conductive layer can be electrically connected, and specified parts that are formed with an origin in the third conductive layer and specified parts that are formed with an origin in the second conductive layer can be electrically connected.

Preferably, the methods of the first and second aspects of the present invention further comprise a step for forming first conductive connecting parts that pass through the first insulating layer and electrically connect the respective conductive parts in each of the comb tooth-shaped electrode parts, and/or a step for forming second conductive connecting parts that pass through the second insulating layer and electrically connect the respective conductive parts in each of the comb tooth-shaped electrode parts. As a result of such a construction, a plurality of conductive parts belonging to a single comb tooth-shaped electrode part can be electrically connected to each other.

BRIEF DESCRIPTION OF THE DRAWINGS

FIG. 12 is a plan view of a micro-mirror element obtained by the method of the present invention;

DESCRIPTION OF THE PREFERRED EMBODIMENTS

Figure 1:
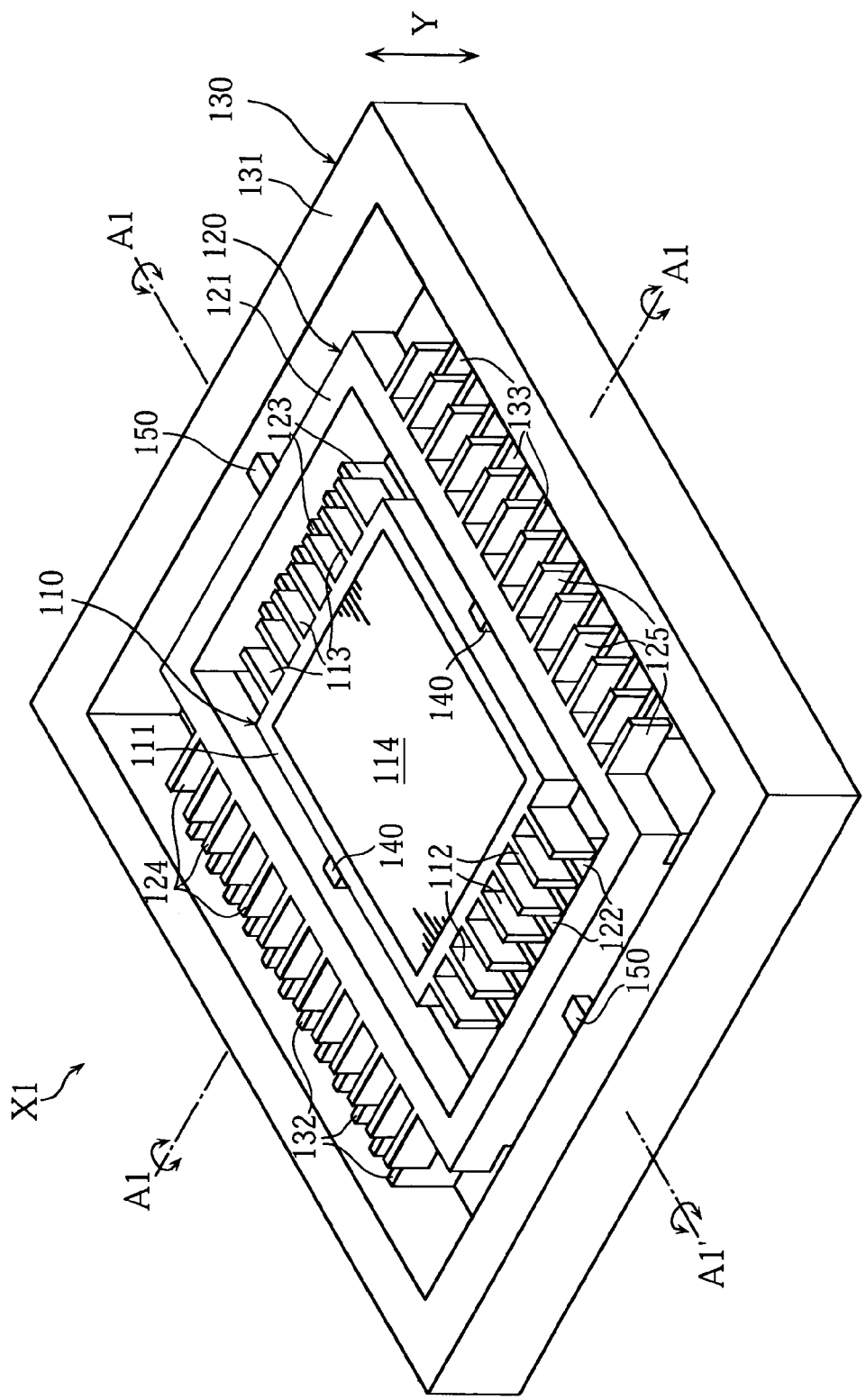
FIG. 1 is a perspective view of a micro-mirror element obtained by a micro-structural unit manufacturing method according to a first embodiment of the present invention.
Figure 2:
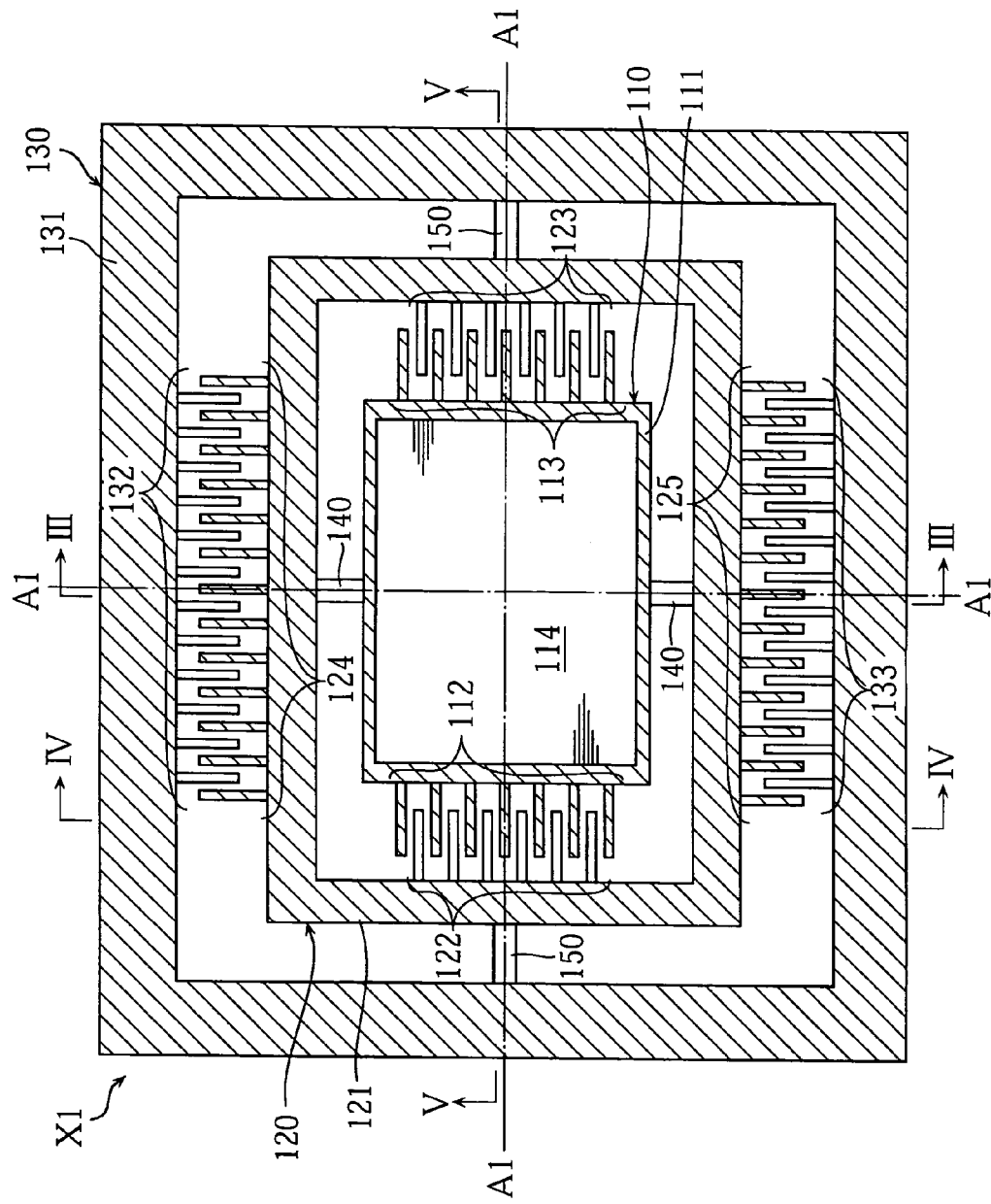
FIG. 2 is a plan view of the micro-mirror element shown in FIG. 1.
Figure 3:
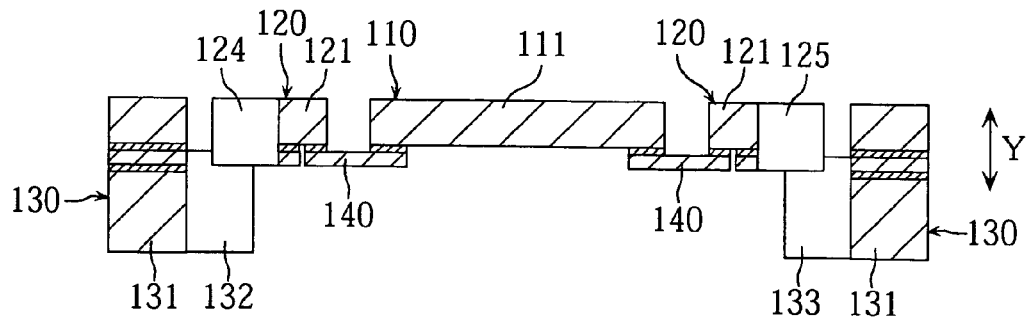
FIG. 3 is a sectional view along line III—III in FIG. 2.
Figure 4:
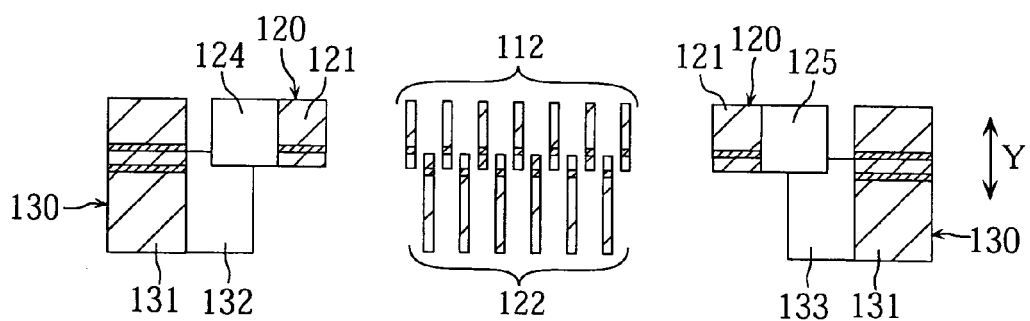
FIG. 4 is a sectional view along line IV—IV in FIG. 2.
Figure 5:
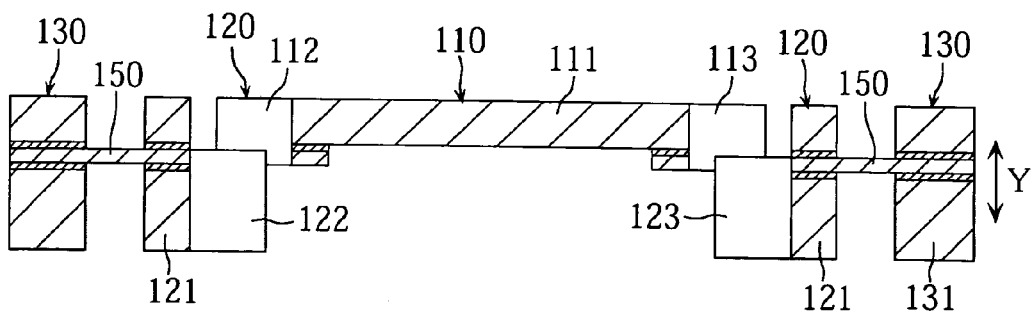
FIG. 5 is a sectional view along line V—V in FIG. 2.

FIGS. 1–5 show a micro-mirror element X1 constituting one example of a micro-structural unit that can be manufactured by a micro-structural unit manufacturing method of the present invention. FIG. 1 is a perspective view of the micro-mirror element X1, and FIG. 2 is a plan view of the micro-mirror element X1. FIGS. 3–5 are respective sectional views along line III—III, line IV—IV and line V—V in FIG. 2.

The micro-mirror element X1 comprises a mirror part 110, an inner frame 120 that surrounds the mirror part 110, an outer frame 130 that surrounds the inner frame 120, a pair of torsion bars 140 that connect the mirror part 110 and inner frame 120, and a pair of torsion bars 150 that connect the inner frame 120 and outer frame 130. The separation distance between the mirror part 110 and the inner frame 120 and the separation distance between the inner frame 120 and the outer frame 130 are 10 to 200 μm, for example. The pair of torsion bars 140 define the axis of rotation A1 of the rotational action of the mirror part 110 with respect to the inner frame 120. The pair of torsion bars 150 define the axis of rotation A1' of the rotational action of the inner frame 120 (and the accompanying rotational action of the mirror part 110) with respect to the outer frame 130. These torsion bars 140 and 150 are disposed so that the respective axes of rotation A1 and A1' are perpendicular to each other. In FIG. 2, the portions that protrude further toward the front with respect to the plane of the page than the torsion bars 140 and 150 (excluding the mirror surface 114 that appears later) are indicated by hatching. Furthermore, the micro-mirror element X1 is formed by a micro-machining technique from a material substrate S1 that will be described later, and, as will be described in detail later, this material substrate S1 has a laminated structure comprising silicon layers 101, 102 and 103, an insulating layer 104 disposed between the silicon layers 101 and 102, and an insulating layer 105 disposed between the silicon layers 102 and 103. In order to simplify the figures, this laminated structure is not shown in FIG. 1

The mirror part 110 has a main body part 111 and a pair of comb tooth-shaped electrodes 112 and 113. A mirror surface 114 is disposed on the upper surface of the main body part 111. The comb tooth-shaped electrodes 112 and 113 each comprise a plurality of electrode teeth, and extend from a pair of the end portions of the main body part 111.

The inner frame 120 has a main body part 121, a pair of comb tooth-shaped electrodes 122 and 123, and a pair of comb tooth-shaped electrodes 124 and 125. Each of the comb tooth-shaped electrodes 122-125 comprises a plurality of electrode teeth; the comb tooth-shaped electrodes 122 and 123 extend inward from the main body part 121, and the comb tooth-shaped electrodes 124 and 125 extend outward from the main body part 121. The comb tooth-shaped electrodes 122 an 123 are respectively disposed in positions corresponding to the comb tooth-shaped electrodes 112 and 113 of the mirror part 110. As is shown most clearly in FIG. 4, the comb tooth-shaped electrodes 112 and 122 are disposed so that these comb tooth-shaped electrodes do not contact each other even when the mirror part 110 is rotationally driven (as described later), and these comb tooth-shaped electrodes 112 and 122 partially overlap with each other in the thickness direction Y. Similarly, the comb tooth-shaped electrodes 113 and 123 are also disposed so that these comb tooth-shaped electrodes do not contact each other even when the mirror part 110 is rotationally driven, and these comb tooth-shaped electrodes 113 and 123 also partially overlap with each other in the thickness direction Y.

As is shown most clearly in FIG. 3, each of the pair of torsion bars 140 is thinner than the mirror part 110 and inner frame 120, and is connected to the main body part 111 of the mirror part 110 and the main body part 121 of the inner frame 120.

The outer frame 130 has a main body part 131 and a pair of comb tooth-shaped electrodes 132 and 133. The comb tooth-shaped electrodes 132 and 133 each comprise a plurality of electrode teeth, and extend inward from the main body part 131; furthermore, these comb tooth-shaped electrodes 132 and 133 are respectively disposed in positions corresponding to the comb tooth-shaped electrodes 124 and 125 of the inner frame 120. The comb tooth-shaped electrodes 124 and 132 are disposed so that these comb tooth-shaped electrodes do not contact each other even when the mirror part 110 is rotationally driven; furthermore, as shown most clearly in FIGS. 3 and 4, these comb tooth-shaped electrodes 124 and 132 partially overlap with each other in the thickness direction Y. Similarly, the comb tooth-shaped electrodes 125 and 133 are also disposed so that these comb tooth-shaped electrodes do not contact each other even when the mirror part 110 is rotationally driven, and these comb tooth-shaped electrodes 125 and 133 also partially overlap with each other in the thickness direction Y.

As is shown most clearly in FIG. 5, each of the pair of torsion bars 150 is thinner than the inner frame 120 and outer frame 130, and is connected to the main body part 121 of the inner frame 120 and the main body part 131 of the outer frame 130.

In such a micro-mirror element X1, the mirror part 110 can be rotationally displaced about the axis of rotation A1 with respect to the inner frame 120 by applying desired potentials as required to each of the comb tooth-shaped electrodes 112, 113, 122 and 123 so that an electrostatic force is generated between the comb tooth-shaped electrodes 112 and 122 and/or between the comb tooth-shaped electrodes 113 and 123. The amount of displacement can be adjusted by adjusting the applied potentials. Furthermore, the inner frame 120 and accompanying mirror part 110 can be rotationally displaced about the axis of rotation A1' with respect to the outer frame 130 by applying desired potentials as required to each of the comb tooth-shaped electrodes 124, 125, 132 and 133 so that an electrostatic force is generated between the comb tooth-shaped electrodes 124 and 132 and/or between the comb tooth-shaped electrodes 125 and 133. The amount of displacement can be adjusted by adjusting the applied potentials. As a result of such rotational driving of the mirror part 110, the direction of reflection of the light that is reflected by the mirror surface 114 disposed on the mirror part 110 can be switched.

FIGS. 6–10 show the series of steps in the micro-structural unit manufacturing method constituting a first embodiment of the present invention. This method is one method for manufacturing the micro-mirror element X1 by micro-machining techniques. In FIGS. 6–10, the formation processes of the mirror part M1, torsion bars T1–T3, inner frames F1 and F2, set of comb tooth-shaped electrodes E1 and E2 and outer frames F3 and F4 shown in FIG. 10C are shown in a single cross section. This single cross section is shown as a continuous cross section by modeling the cross sections of a plurality of specified locations contained in a single micro-mirror element formation region in the material substrate (wafer with a multi-layer structure) on which machining is performed. The mirror part M1 shown in FIG. 10C corresponds to a portion of the mirror part 110. The torsion bars T1 correspond to the torsion bars 140; a sectional view in the direction of extension is shown. The inner frame F1 corresponds to a portion of the inner frame 120. The comb tooth-shaped electrode E1 corresponds to portions of the comb tooth-shaped electrodes 112, 113, 124 and 125. The comb tooth-shaped electrode E2 corresponds to portions of the comb tooth-shaped electrodes 122, 123, 132 and 133. The torsion bars T2 correspond to the torsion bars 140 and 150, and are shown in cross section. The inner frame F2 corresponds to another portion of the inner frame 120. The torsion bars T3 correspond to the torsion bars 150; a sectional view in the direction of extension is shown. The outer frame F3 corresponds to a portion of the outer frame 130. The outer frame F4 corresponds to another portion of the outer frame 130.

Figure 6A:
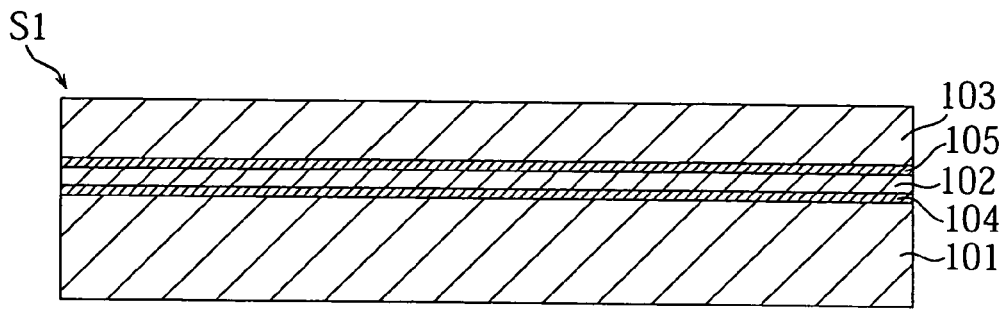
FIGS. 6A–6D show some of the steps in the micro-structural unit manufacturing method according to the first embodiment of the present invention.

In the micro-structural unit manufacturing method constituting this first embodiment, a material substrate S1 such as that shown in FIG. 6A is first prepared. The material substrate S1 has a laminated structure comprising silicon layers 101, 102 and 103, an insulating layer 104 disposed between the silicon layers 101 and 102, and an insulating layer 105 disposed between the silicon layers 102 and 103. The silicon layer 101–103 are constructed from a silicon material that is endowed with conductivity by doping with impurities. p type impurities such as B or the like or n type impurities such as P, Sb or the like can be used as impurities. The insulating layers 104 and 105 consist of (for example) an oxide material. The respective thicknesses of the silicon layers 101–103 are (for example) 200 $\mu$m, 3 $\mu$m and 100 $\mu$m. The respective thicknesses of the insulating layers 104 and 150 are (for example) 500 nm. The material substrate S1 can be manufactured utilizing oxide film formation techniques and silicon substrate joining techniques (via the surface oxide film) on the surface of a silicon substrate, and utilizing (as necessary) silicon substrate thickness adjustment techniques based on grinding and polishing methods or chemical mechanical polishing (CMP) methods. In cases where a CMP method is utilized in the manufacturing process of the material substrate, highly precise thickness dimensions can be realized for specified silicon substrates or silicon layers.

Figure 6B:
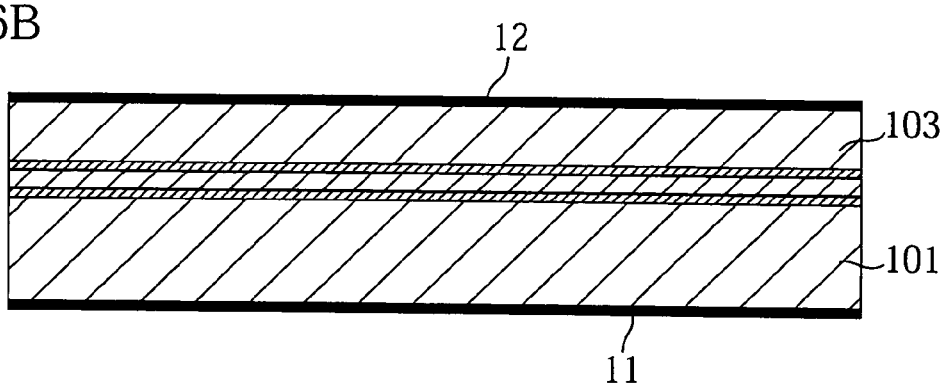

Next, as shown in FIG. 6B, oxide films 11 and 12 are respectively formed on the surfaces of the silicon layers 101 and 103. The oxide films 11 and 12 can be formed by forming films of silicon dioxide on the surfaces of the silicon layers 101 and 103 by a CVD method. Alternatively, the oxide films 11 and 12 can be formed by oxidizing the surfaces of the silicon films 101 and 103 using a thermal oxidation method (heating temperature: e.g., 900° C.). The thicknesses of the oxide films are (for example) 0.5 to 2 $\mu$m. In this step, nitride films may also be formed on the surfaces of the silicon layers 101 and 103 instead of the oxide films 11 and 12. For example, nitride films can be formed by a CVD method using $NH_3$ or $N_2$ as a nitrogen source.

Figure 6C:
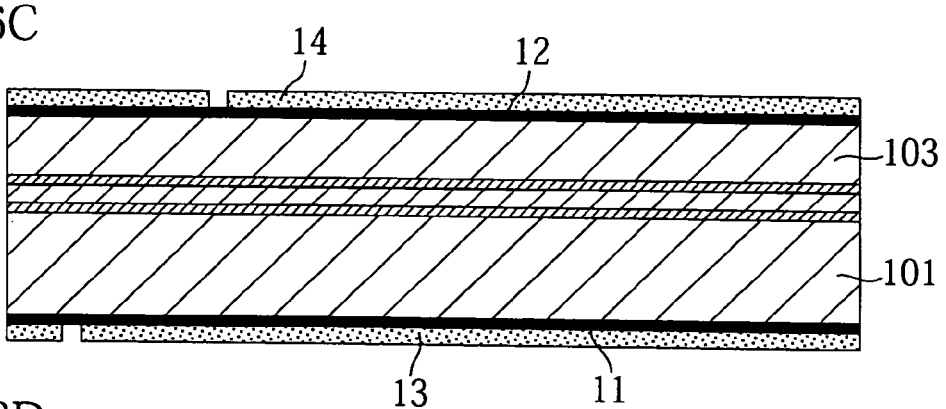

Next, as shown in FIG. 6C, resist patterns 13 and 14 that have specified opening parts are respectively formed on the silicon layers 101 and 103. In the formation of the resist patterns 13 and 14, a liquid-form photoresist is first formed into a film on the surfaces of the oxide films 11 and 12 by spin coating. Next, this photoresist film is hardened by an exposure treatment and subsequent developing treatment. For example, AZP 4210 (manufactured by Clariant Japan) or AZ 1500 (manufactured by Clariant Japan) can be used as the photoresist. Resist patterns described later can also be formed using such photoresist film formation and subsequent exposure and developing treatments.

Figure 6D:
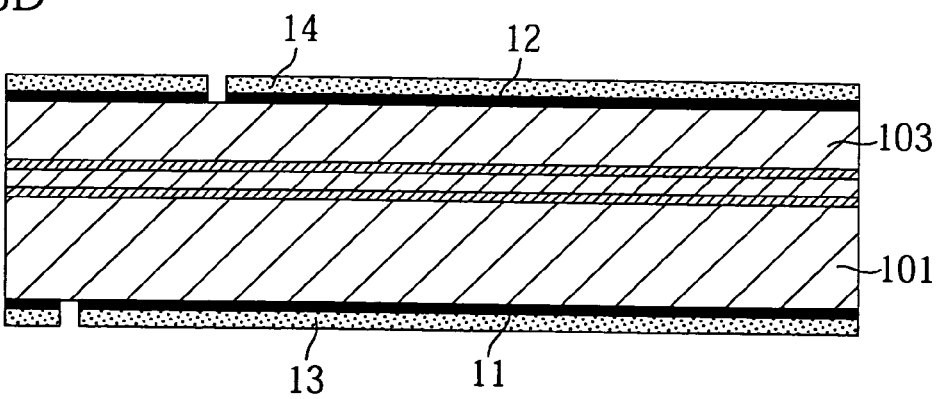

Next, as shown in FIG. 6D, the oxide films 11 and 12 are etched using the resist patterns 13 and 14 as masks. Dry etching or wet etching can be used as the etching method. In cases where dry etching is used, for example, $CF_4$ or $CHF_3$ can be used as the etching gas. In cases where wet etching is used, for example, buffered hydrofluoric acid (BHF) consisting of hydrofluoric acid and ammonium fluoride can be used as the etching liquid. Such dry etching or wet etching can also be used as the etching method or removal method (described later) for oxide films, oxide film patterns or insulating layers. It is desirable that the resist patterns 13 and 14 be left without being removed following the patterning of such oxide films 11 and 12.

Figure 7A:
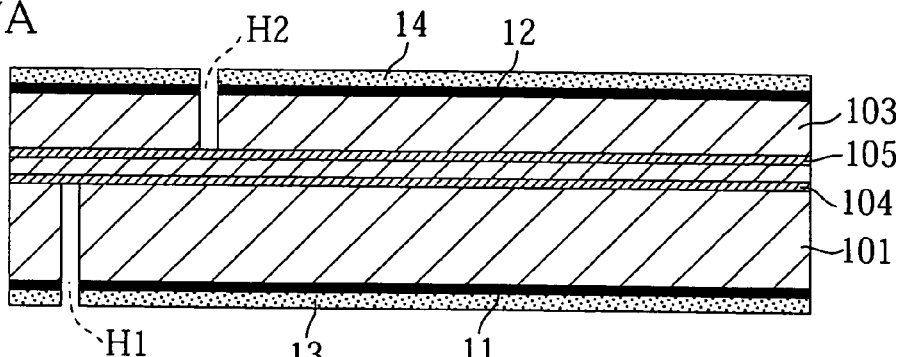
FIGS. 7A–7D show steps that follow the procedure shown in FIGS. 6A–6D.

Next, holes H1' that pass through the silicon layer 101 and holes H2' that pass through the silicon layer 103 are formed as shown in FIG. 7A. In the formation of the holes H1', an etching treatment is performed on the silicon layer 101 by DRIE (deep reactive ion etching) using the oxide film 11 patterned in the preceding step, or the resist pattern 13 (in cases where this resist pattern remains), as a mask until the insulating layer 104 is reached. In DRIE, a favorable etching treatment can be performed in the Bosch process in which etching and side wall protection are alternately performed. Such a Bosch process can also be used for DRIE described later. Meanwhile, in the formation of the holes H2', an etching treatment is performed on the silicon layer 103 by DRIE using the oxide film 12 patterned in the preceding step, or the resist patter 14 (in cases where this resist pattern remains), as a mask until the insulating layer 105 is reached.

Figure 7B:
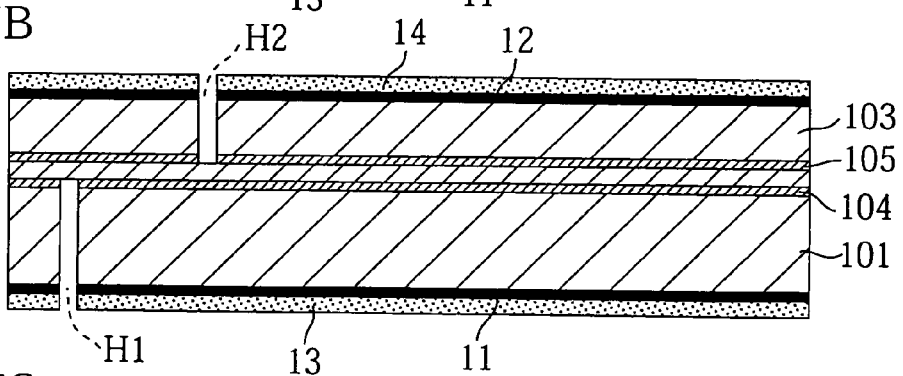

Next, as shown in FIG. 7B, holes H1 that pass through the insulating layer 104 in addition to the silicon layer 101 are formed by using etching to remove the portions of the insulating layer 104 exposed in the holes H1', and holes H2 that pass through the insulating layer 105 in addition to the silicon layer 103 are formed by using etching to remove the portions of the insulating layer 105 exposed in the holes H2'. If the resist patterns 13 and 14 are left following the completion of the step shown in FIG. 6D, these resist patterns 13 and 14 can also function as masks in this step, so that the process is efficient.

Figure 7C:
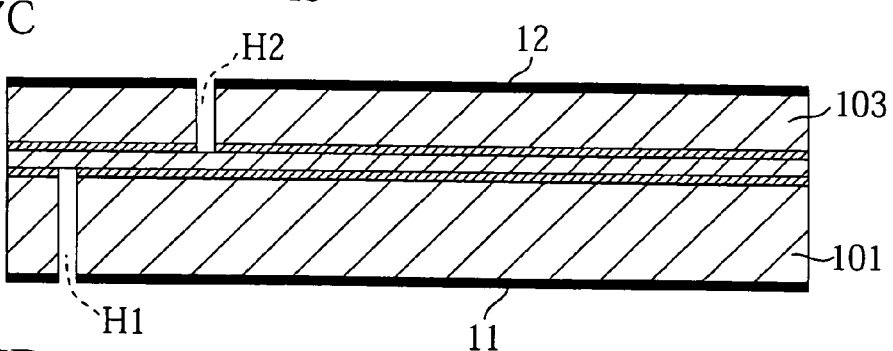

Next, as shown in FIG. 7C, the resist patterns 13 and 14 (as well as the separate resist patterns in cases where such separate resist patterns were used in the preceding step) are stripped by causing a stripping solution to act on these resist patterns. AZ Remover 700 (manufactured by Clariant Japan) can be used as the stripping solution. This stripping solution can also be used in the stripping of resist patterns described later.

Figure 7D:
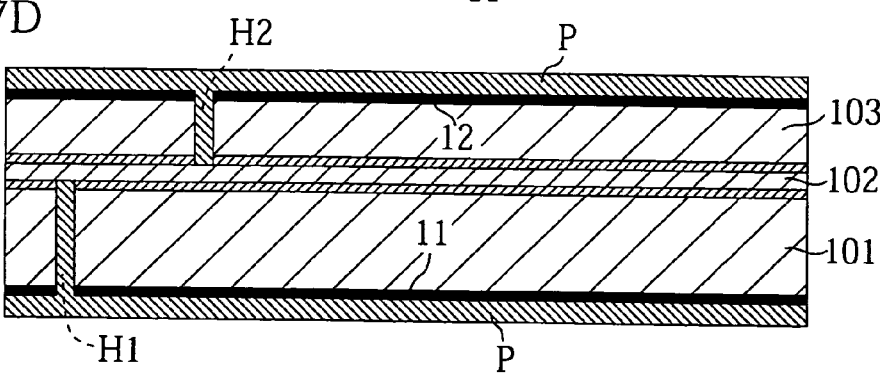

Next, as shown in FIG. 7D, a conductive material P' is deposited inside the holes H1 and H2 by (for example) a CVD method. In this case, a sufficient amount of the conductive material P' is supplied to the holes H1 and H2 until this material is also deposited on the oxide films 11 and 12. Poly-silicon doped with a specified impurity can be used as the conductive material P'. Alternatively, a metal such as Cu, W or the like may also be used as the conductive material P'. In order to ensure good electrical connections between the conductive material P' and the silicon layers 101—103, it is desirable to remove the natural oxide film on the surfaces of the holes H1 and H2 by causing BHF or the like to act on this film immediately prior to the deposition of the conductive material P'.

Figure 8A:
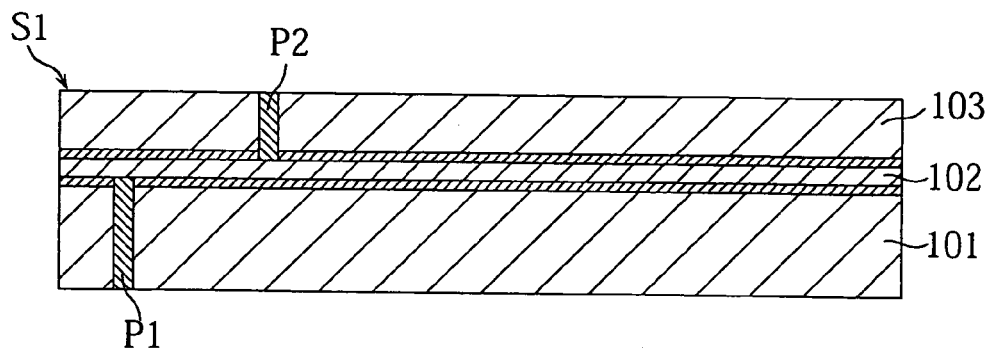
FIGS. 8A–8D show steps that follow the procedure shown in FIGS. 7A–7D.

Next, as shown in FIG. 8A, the surfaces of the silicon layer 101 and 103 are exposed. Specifically, the conductive material P' outside the holes H1 and H2 is removed by etching, and the oxide films 11 and 12 are then removed by etching. In cases where wet etching is used as the method of removal of a conductive material P' that consists of poly-silicon, an aqueous solution of potassium hydroxide or an aqueous solution of a so-called "hydrofluoricnitric acid" (containing hydrofluoric acid and nitric acid) can be used as the etching liquid. In this step, it would also be possible to use a method in which the conductive material P' outside the holes H1 and H2 and the oxide films 11 and 12 are removed by polishing using a CMP process instead of the method described above. In this step, plugs P1 and P2 that are embedded in the material substrate S1 are formed. The plugs P1 electrically connect the silicon layer 101 and silicon layer 102, and the plugs P2 electrically connect the silicon layer 103 and silicon layer 102.

Figure 8B:
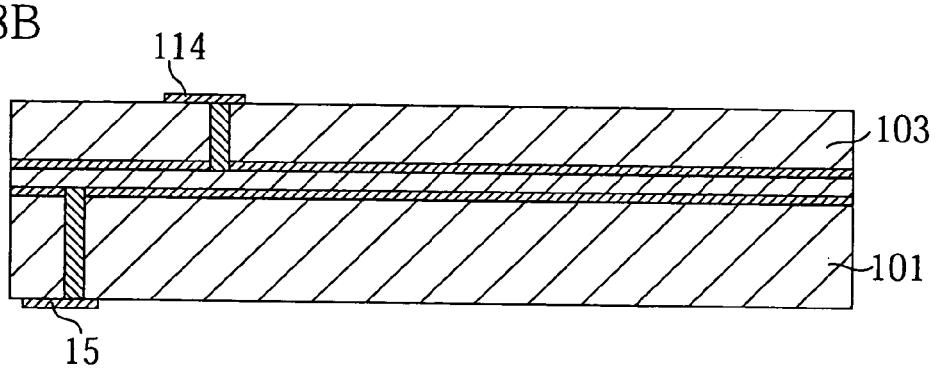

Next, as shown in FIG. 8B, a mirror surface 114 is formed on the silicon layer 103, and electrode pads 15 (not shown in FIGS. 1–5) used for external connections are formed on the silicon layer 101. In the formation of the mirror surface 114, for example, Cr (50 nm) and then Au (200 nm) are first formed as films on the silicon layer 103 by a sputtering method. Next, the mirror surface 114 is patterned and formed by successively performing etching treatments on these metal films via a specified mask. For example, an aqueous solution of potassium iodide—iodine can be used as the etching liquid for the Au film. Furthermore, for example, an aqueous solution of ceric ammoniun nitrate can be used as the etching liquid for the Cr film. The method used to form the electrode pads 15 with specified pattern shapes is that same as the formation method of the mirror surface 114.

Figure 8C:
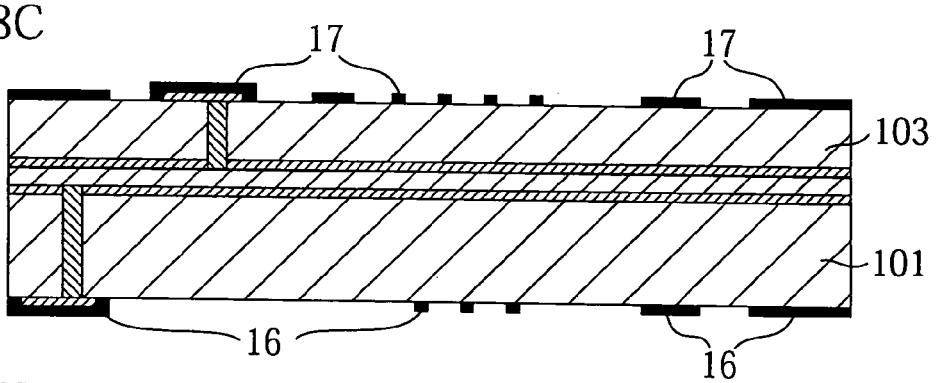

Next, as shown in FIG. 8C, an oxide film pattern 16 is formed on the silicon layer 101, and an oxide film pattern 17 is formed on the silicon layer 103. The oxide film pattern 16 has pattern shapes corresponding to the inner frame F2, comb tooth-shaped electrode E2 and outer frames F3 and F4, and the oxide film pattern 17 has pattern shapes corresponding to the mirror part M1, inner frames F1 and F2, comb tooth-shaped electrode E1 and outer frames F3 and F4. In the formation of the oxide film pattern 16, for example, silicon dioxide is first formed as a film with a thickness of (e.g.) 1 $\mu$m on the surface of the silicon layer 101 by a CVD method. Next, this oxide film on the silicon layer 101 is patterned by etching using a specified resist pattern as a mask. The oxide film pattern 17 and other oxide film patterns described below are also formed by the formation of an oxide material into a film, the formation of a resist pattern on the oxide film, and subsequent etching treatment.

Figure 8D:
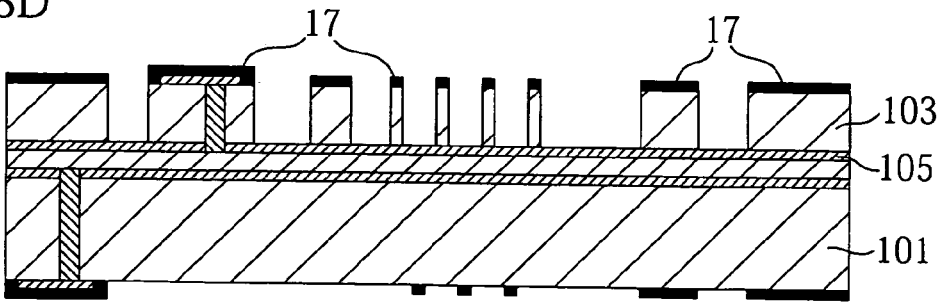

Next, as shown in FIG. 8D, an etching treatment is performed on the silicon layer 103 by DRIE using the oxide film pattern 17 as a mask until the insulating layer 105 is reached. As a result of this etching treatment, a portion of the mirror part M1, portions of the inner frames F1 and F2, a portion of the comb tooth-shaped electrode E1 and portions of the outer frames F3 and F4 are formed.

Figure 9A:
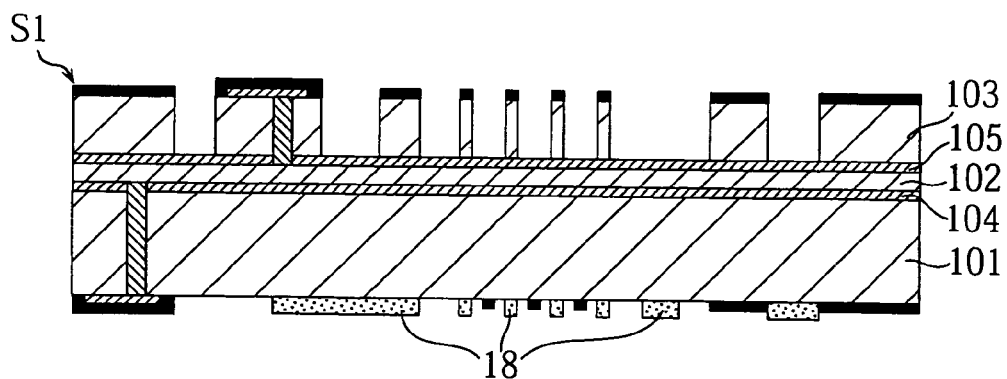
FIGS. 9A–9D show the procedure shown in FIGS. 8A–8D.

Next, as shown in FIG. 9A, a resist pattern 18 is formed on the silicon layer 101. The resist pattern 18 masks a portion of the mirror part M1, and has a pattern shape that corresponds to the inner frame F1, torsion bars T1–T3 and comb tooth-shaped electrode E2.

Figure 9B:
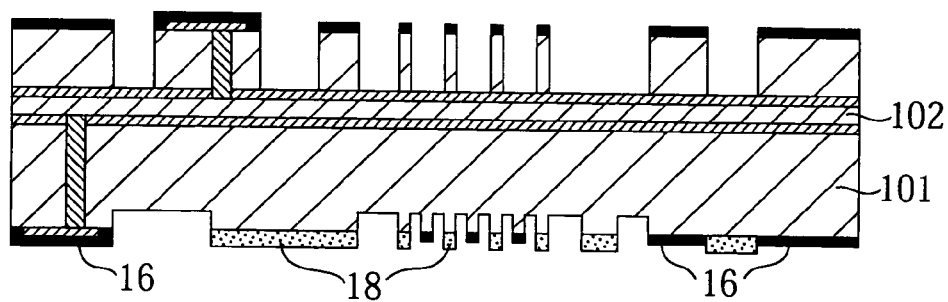
Figure 9C:
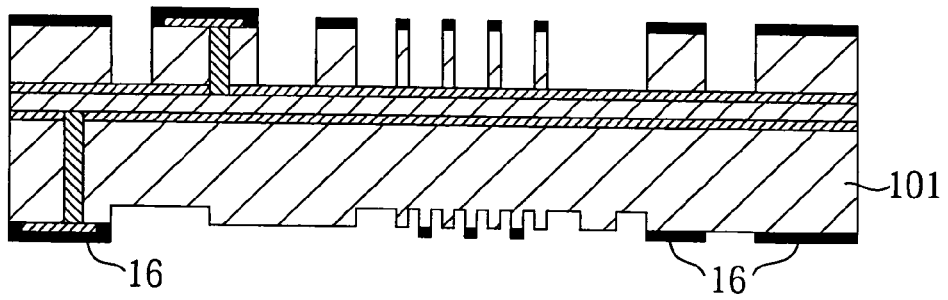

Next, as shown in FIG. 9B, an etching treatment is performed to a specified depth on the silicon layer 101 by DRIE using the oxide film pattern 16 and resist pattern 18 as masks. This specified depth is appropriately determined in accordance with the thickness of the torsion bars T1–T3, i.e., the thickness of the silicon layer 102, and is (for example) 10 $\mu$m. As a result of the etching treatment of this step, a portion of the inner frame F2, a portion of the comb tooth-shaped electrode E2 and portions of the outer frames F3 and F4 are formed. Following this step, the resist pattern 18 is removed as shown in FIG. 9C.

Figure 9D:
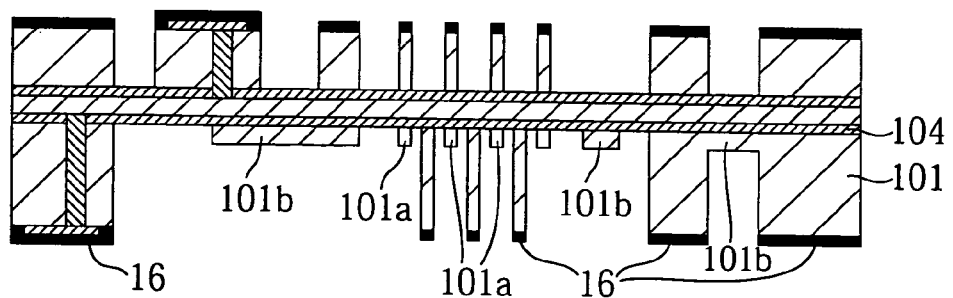

Next, as shown in FIG. 9D, an etching treatment is performed on the silicon layer 101 by DRIE using the oxide film pattern 16 as a mask until the insulating layer 104 is reached, so that residual mask pats 101a for the comb tooth-shaped electrode E1 and residual mask parts 101b for the torsion bars are left. The residual mask pats 101a and 101b together have a pattern shape that corresponds to the resist pattern 18 described later. The thickness of the residual mask parts 101a and 101b substantially corresponds to the specified depth in the preceding step, and is (for example) 10 $\mu$m. As a result of the etching treatment of this step, a portion of the inner frame F2, a portion of the comb tooth-shaped electrode E2 and portions of the outer frames F3 and F4 are formed.

Figure 10A:
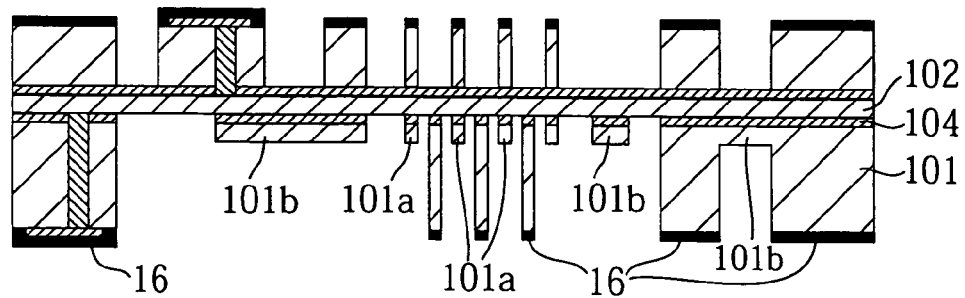
FIGS. 10A–10C show the steps that follow the procedure shown in FIGS. 9A–9D.

Next, as shown in FIG. 10A, an etching treatment is performed on the insulating layer 104 using the portions originating in the silicon layer 101 (including the residual mask parts 101a and 101b) as a mask, until the silicon layer 102 is reached. In this step, it is necessary to set the thicknesses of the insulating layer 104 and oxide film pattern 16 so that the oxide film pattern 16 is not removed to an extent that prevents the functioning of this pattern as a mask before a portion of the insulating layer 104 is sufficiently removed by etching. Alternatively, in order to utilize the etching selectivity in this step, a pattern comprising a nitride film or metal film may be used instead of the oxide film pattern 16 as a mask for the silicon layer 101.

Figure 10B:
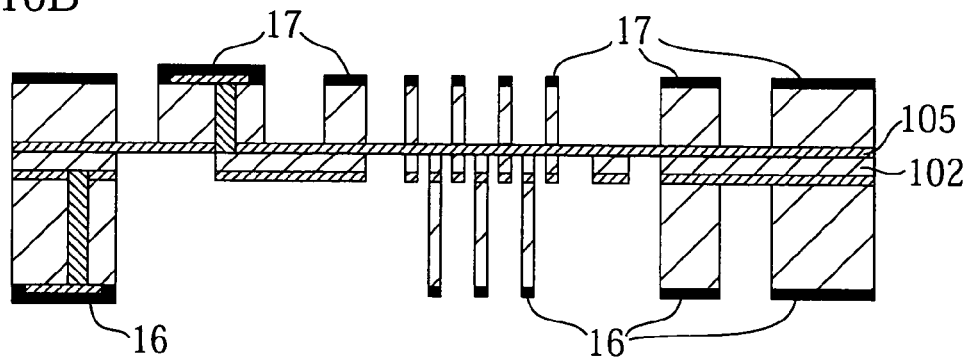
Figure 10C:
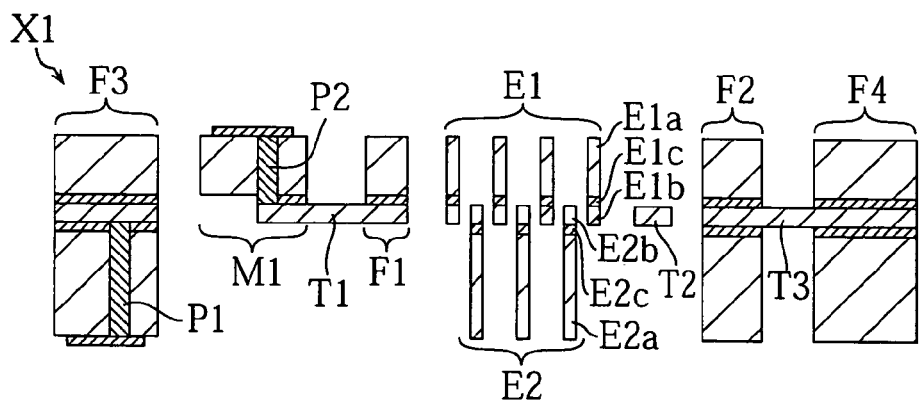

Next, as shown in FIG. 10B, an etching treatment is performed by DRIE on the portions of the silicon layer 102 that were exposed in the preceding step, until the insulating layer 105 is reached. In this case, the residual mask parts 101a and 101b are also removed by etching. As a result of the etching treatment performed in this step, a portion of the mirror part M1, the torsion bars T1–T3, portions of the inner frames F1 and F2, portions of the set of comb tooth-shaped electrodes E1 and E2 and portions of the outer frames F3 and F4 are formed. Subsequently, as shown in FIG. 10C, the exposed portions of the insulating layers 104 and 105 and the oxide film patterns 16 and 17 are removed by etching.

As a result of the above series of steps, the mirror part M1, torsion bars T1–T3, inner frames F1 and F2, comb tooth-shaped electrodes E1 and E2 and outer frames F3 and F4 are formed, so that the micro-mirror element X1 shown in FIGS. 1–5 is manufactured.

Figure 11A:
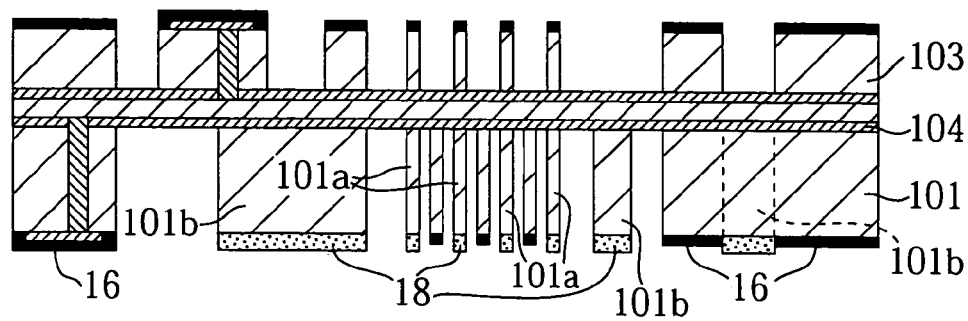
FIGS. 11A–11C show substitute steps for some of the steps in the first embodiment of the present invention.
Figure 11B:
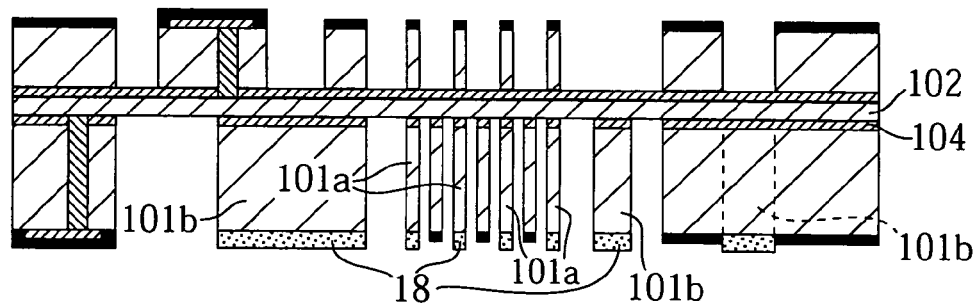
Figure 11C:
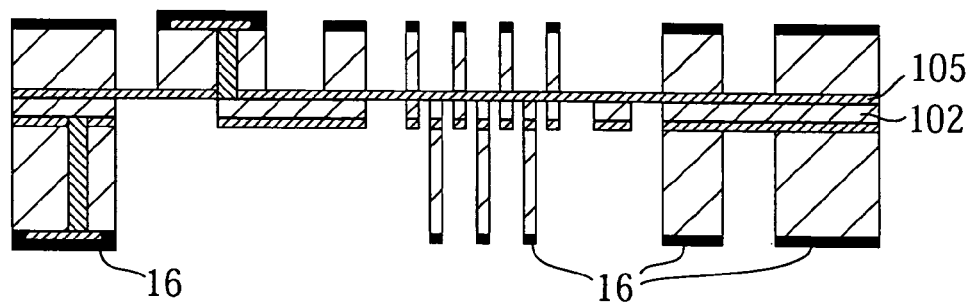

In the present embodiment, it would also be possible to use the series of steps shown in FIGS. 11A–11C following the step described above with reference to FIG. 9A, instead of the steps described above with reference to FIGS. 9B–10B. In this substitute method, after the resist pattern 18 has been formed on the silicon layer 101 as shown in FIG. 9A, an etching treatment is first performed on the silicon layer 101 by DRIE using the oxide film pattern 16 and resist pattern 18 as masks, until the insulating layer 104 is reached (as shown in FIG. 11A). As a result of this etching treatment, residual mask parts 101a for the comb tooth-shaped electrode E1, residual mask parts 101b for the torsion bars, a portion of the inner frame F2, a portion of the comb tooth-shaped electrode E2 and portions of the outer frames F3 and F4 are formed. Next, as shown in FIG. 11B, an etching treatment is performed on the portions of the insulating layer 104 that were exposed in the preceding step until the silicon layer 102 is reached. Next, after the resist patter 18 is removed, an etching treatment is performed on the silicon layer 101 by DRIE using the oxidation mask patter 16 as a mask until the insulating layer 104 is reached, and an etching treatment is performed on the portions of the silicon layer 102 that were exposed in the preceding step until the insulating layer 105 is reached, as shown in FIG. 11C. As a result of this etching treatment, the residual mask parts 101a and 101b are removed, and a portion of the mirror part M1, the torsion bars T1–T3, portions of the inner frames F1 and F2, portions of the set of comb tooth-shaped electrodes E1 and E2 and portions of the outer frames F3 and F4 are formed. Subsequently, the micro-mirror element X1 shown in FIGS. 1–5 is obtained by performing the step described above with reference to FIG. 10C.

In this substitute method, notching tends to occur in the silicon layer 102 in the step described above with reference to FIG. 11C in cases where the difference between the thicknesses of the silicon layer 101 and silicon layer 102 is extremely large. Specifically, notches tend to be formed in the 1a 102. The reason for this is that in cases where the difference in the thicknesses of the two silicon layers 101 and 102 is extremely large, the time extending from the etching of the silicon layer 102 until the insulating layer 105 is reached to the etching of the silicon layer 101 until the insulating layer 104 is reached is excessively long, and the silicon layer 102 is exposed to the etching environment during this long period of time. Accordingly, in cases where the difference in the thicknesses of the two silicon layers 101 and 102 is extremely large, it is more desirable to use the method described above with reference to FIGS. 9B–10B than to use this substitute method.

In the present embodiment, torsion bars T1–T3 which are thinner than the mirror part M1, inner frames F1 and F2 and outer frames F3 and F4, and which have a highly precise thickness dimension, can be formed. The reason for this is that a silicon layer 102 which is thinner than the silicon layers 101 and 103, and which has a highly precise thickness dimension, can be formed in the manufacturing process of the material substrate S1 described above with reference to FIG. 6A, and the torsion bars T1–T3 can be formed from such a silicon layer 102 with the same thickness as this silicon layer 102. The thickness of the torsion bars T1–T3 can be adjusted by appropriately setting the thickness of the silicon layer 102 in the material substrate S1. The thicknesses of the mirror part M1, inner frames F1 and F2 and outer frames F3 and F4 can also be adjusted with a high degree of precision by (for example) setting the thicknesses of the silicon layers 101 and 103 in accordance with the thickness of the silicon layer 102. Thus, when the microstructural unit manufacturing method of this first embodiment is used, desired thickness dimensions can be realized with a high degree of freedom and a high degree of precision for each of a plurality of structural parts (mirror part 110, inner frame 120, outer frame 130 and torsion bars 140 and 150) in the single micro-mirror element X1 that is being manufactured.

In the present embodiment, a set of comb tooth-shaped electrodes E1 and E2 that partially overlap with each other in the thickness direction Y in the natural state of the mirror part 110 and inner frame 120 can be formed. As is shown in FIG. 10C, the comb tooth-shaped electrode E1 has a laminated structure comprising conductive parts E1$a$ and E1$b$ and insulating parts E1$c$ that are disposed between these conductive parts, and the comb tooth-shaped electrode E2 has a laminated structure comprising conductive parts E2$a$ and E2$b$ and insulating parts E2$c$ that are disposed between these conductive parts. In a natural state, both comb tooth-shaped electrodes E1 and E2 overlap with each other in the conductive parts E1$b$ and conductive parts E2$b$ originating in the silicon layer 102. With reference to the mirror part 110, the term "natural state" refers to a state in which the rotational angle of the mirror part 110 with respect to the inner frame 120 is 0°; with reference to the inner frame 120, this term refers to a state in which the rotational angle of the inner frame 120 with respect to the outer frame 130 is 0°.

Such comb tooth-shaped electrodes E1 and E2 are suitable for the appropriate driving of the movable parts. Specifically, when the rotational angle of the mirror part 110 with respect to the inner frame 120 is 0°, the comb tooth-shaped electrodes 112 and 122 partially overlap with each other, and the comb tooth-shaped electrodes 113 and 123 partially overlap with each other, in the thickness direction Y. Accordingly, even in cases where the mirror part 110 is started into motion from a rotational angle of 0°, an electrostatic force can be efficiently generated between the driving electrodes. Furthermore, during the rotational operation of the mirror part 110, since at least one of the two sets of driving electrodes always overlaps in the direction of the rotational operation at or near a rotational angle of 0°, such a construction is suitable for the appropriate generation of a continuous driving force in the driving of the mirror part 110. Furthermore, when the rotational angle of the inner frame 120 with respect to the outer frame 130 is 0°, the comb tooth-shaped electrodes 124 and 132 partially overlap with each other, and the comb tooth-shaped electrodes 125 and 133 partially overlap with each other, in the thickness direction Y. Accordingly, even in cases where the inner frame 120 is started into motion from a rotational angle of 0°, an electrostatic force can be efficiently generated between the driving electrodes. Furthermore, since at least one of the two sets of driving electrodes always overlaps in the direction of the rotational operation at or near a rotational angle of 0° during the rotational operation of the inner frame 120, such a construction is suitable for the appropriate generation of a continuous driving force in the driving of the inner frame 120.

The extent to which the set of comb tooth-shaped electrodes E1 and E2 overlap, i.e., the length of the overlapping portions of the comb tooth-shaped electrodes E1 and E2 in the thickness direction Y, can be adjusted with a high degree of precision by appropriately setting the thickness of the silicon layer 102 in the material substrate S1. The length of the comb tooth-shaped electrode E1 in the thickness direction Y depends mainly on the thicknesses of the silicon layers 102 and 103, and the length of the comb tooth-shaped electrode E2 in the thickness direction Y depends mainly on the thicknesses of the silicon layers 101 and 102, so that these two lengths can be set with a high degree of freedom as described above. In the present embodiment, the comb tooth-shaped electrode E2 is longer than the comb tooth-shaped electrode E1. Such a construction is especially suitable for lightening the weight of the mirror part 110.

In the present embodiment, the mirror part M1 has parts that originate in the silicon layer 102 and that are continuous with the torsion bars T1 (which likewise originate in the silicon layer 102), and the inner frame F1 also has parts that originate in the silicon layer 102 and that are continuous with the torsion bars T1. Accordingly, the mirror part M1 (mirror par 110) and inner frame F1 (inner frame 120) are electrically connected via the torsion bars T1 (torsion bars 140). Furthermore, the inner frame F2 has parts that originate in the silicon layer 102 and that are continuous with the torsion bars T3 (which likewise originate in the silicon layer 102), and the outer frame F4 also has parts that originate in the silicon layer 102 and that are continuous with the torsion bars T3. Accordingly, the inner frame F2 (inner frame 120) and outer frame F4 (outer frame 130) are electrically connected via the torsion bars T3 (torsion bars 150).

In the present embodiment, the outer frame F3 has parts that originate in the silicon layer 101 and parts that originate in the silicon layer 102. As was described above, these two types of parts possess conductivity, and are electrically connected by the plugs P1. Furthermore, the mirror part M1 has parts that originate in the silicon layer 102 and parts that originate in the silicon layer 103. As was described above, these two types of parts possess conductivity, and are electrically connected by the plugs P2. The plugs P1 that are used for the electrical connection of the parts originating in the silicon layer 101 and the parts originating in the silicon layer 102, and the plugs P2 that are used for the electrical connection of the parts originating in the silicon layer 102 and the parts originating in the silicon layer 103 can be embedded in appropriate locations in the mirror part 110, inner frame 120 and outer frame 130. For example, the conductive parts E2$a$ and E2$b$ of the comb tooth-shaped electrode E2 can be electrically connected by forming the plugs P1 in appropriate locations. Similarly, for example, the conductive pats E1$a$ and E1$b$ of the comb tooth-shaped electrode E1 can be electrically connected by forming the plugs P2 in appropriate locations.

Figure 13:
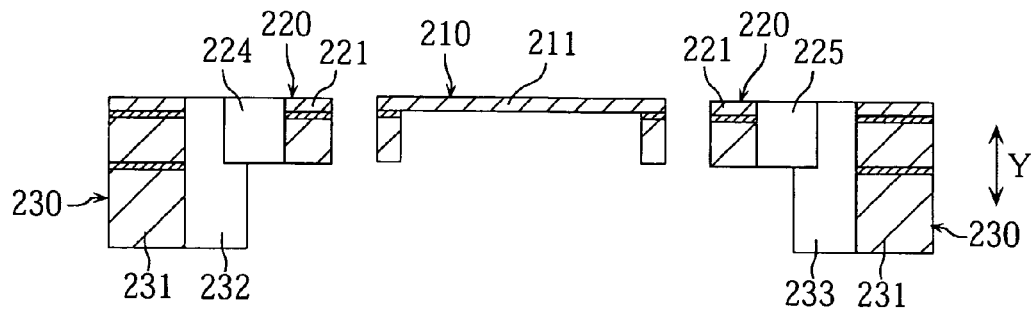
FIG. 13 is a sectional view along line XIII—XIII in FIG. 12.
Figure 14:
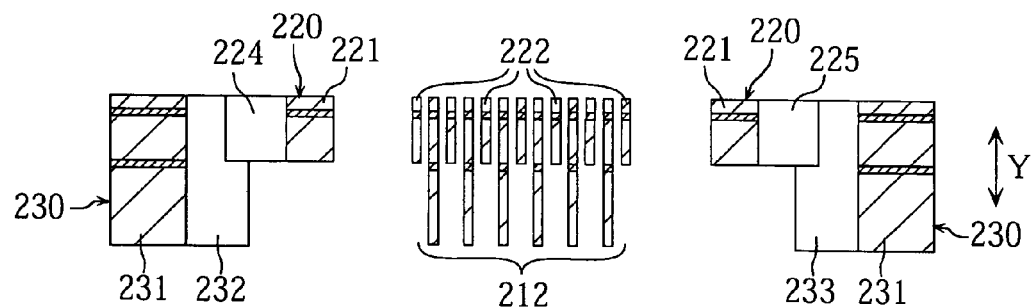
FIG. 14 is a sectional view along line XIV—XIV in FIG. 12.
Figure 15:
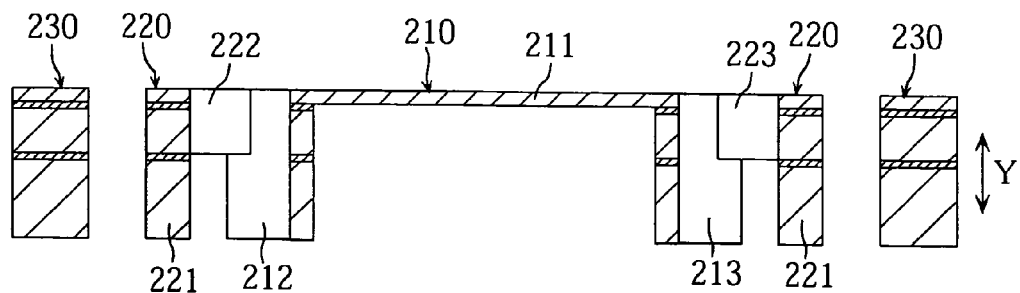
FIG. 15 is a sectional view along line XV—XV in FIG. 12.

FIGS. 12–15 show a micro-mirror element X2 which is one example of a micro-structural unit that can be manufactured by the micro-structural unit manufacturing method of the present invention. FIG. 12 is a plan view of the micro-mirror element X2, and FIGS. 13–15 are respective sectional views along line XIII—XIII, line XIV—XIV and line XV—XV in FIG. 12.

The micro-mirror element X2 comprises a mirror part 210, an inner frame 220 that surrounds this mirror part, an outer frame 230 that surrounds this inner frame, a pair of torsion bars 240 that connect the mirror part 210 and inner frame 220, and a pair of torsion bars 250 that connect the inner frame 220 and outer frame 230. The separation distance between the mirror part 210 and inner frame 220, and the separation distance between the inner frame 220 and outer frame 230, are (for example) 10 to 200 $\mu$m. The pair of torsion bars 240 define the axis of rotation A2 of the rotational operation of the mirror part 210 with respect to the inner frame 220. The pair of torsion bars 250 define the axis of rotation A2' of the rotational operation of the inner frame 220 and accompanying mirror part 210 with respect to the outer frame 230. These torsion bars 240 and 250 are disposed so that the two axes of rotation A2 and A2' are perpendicular to each other. In FIG. 12, the portions that protrude further toward the front with respect to the plane of the page than the torsion bars 240 and 250 (excluding the mirror surface 214 that appears later) are indicated by hatching. Furthermore, the micro-mirror element X2 is formed by a micro-machining technique from a material substrate S2 that will be described later, and, as will be described in detail later, this material substrate S2 has a laminated structure comprising silicon layers 201, 202 and 203, an insulating layer 204 disposed between the silicon layers 201 and 202, and an insulating layer 205 disposed between the silicon layers 202 and 203.

The mirror part 210 has a main body part 211 and comb tooth-shaped electrodes 212 and 213. A mirror surface 214 is disposed on the upper surface of the main body part 211. In the present embodiment, the main body part 211 is formed with a small thickness except for the peripheral edge parts. In the present invention, specified ribs may be formed beneath the thin part of the main body part 211 in order to ensure the strength of the thin part of the main body part 211. The comb tooth-shaped electrodes 212 and 213 each comprise a plurality of electrode teeth, and extend from a pair of the end portions of the main body part 211.

The inner frame 220 has a main body part 221, a pair of comb tooth-shaped electrodes 222 and 223, and a pair of comb tooth-shaped electrodes 224 and 225. The comb tooth-shaped electrodes 222-225 each comprise a plurality of electrode teeth; the comb tooth-shaped electrodes 222 and 223 extend inward from the main body part 221, and the comb tooth-shaped electrodes 224 and 225 extend outward from the main body part 221. The comb tooth-shaped electrodes 222 and 223 are respectively disposed in positions corresponding to the comb tooth-shaped electrodes 212 and 213 of the mirror part 210. As is shown most clearly in FIGS. 14 and 15, the comb tooth-shaped electrodes 212 and 222 overlap with each other in the thickness direction Y. Similarly, the comb tooth-shaped electrodes 213 and 223 also overlap with each other in the thickness direction Y. The electrode teeth of the comb tooth-shaped electrodes 222 and 223 are shorter in the thickness direction Y than the electrode teeth of the comb tooth-shaped electrodes 212 and 213.

The outer frame 230 has a main body part 231 and a pair of comb tooth-shaped electrodes 232 and 233. Each of the comb tooth-shaped electrodes 232 and 233 comprises a plurality of electrode teeth; these comb tooth-shaped electrodes extend inward from the main body part 231, and are disposed in positions corresponding to the comb tooth-shaped electrodes 224 and 225 of the inner frame 220. As is shown most clearly in FIGS. 13 and 14, the comb tooth-shaped electrodes 224 and 232 overlap in the thickness direction Y. Furthermore, the electrode teeth of the comb tooth-shaped electrodes 232 and 233 are longer in the thickness direction Y than the electrode teeth of the comb tooth-shaped electrodes 224 and 225.

The pair of torsion bars 240 are each connected to the main body part 211 of the mirror part 210 and the main body part 221 of the inner frame 220. The pair of torsion bars 250 are each connected to the main body part 221 of the inner frame 220 and the main body part 231 of the outer frame 230.

In such a micro-mirror element X2, the mirror part 210 can be rotationally displaced about the axis of rotation A2 with respect to the inner frame 220 by applying desired potentials as required to each of the comb tooth-shaped electrodes 212, 213, 222 and 223 so that an electrostatic force is generated between the comb tooth-shaped electrodes 212 and 222 and/or between the comb tooth-shaped electrodes 213 and 223. The amount of displacement can be adjusted by adjusting the applied potentials. Furthermore, the inner frame 220 and accompanying mirror part 210 can be rotationally displaced about the axis of rotation A2' with respect to the outer frame 230 by applying desired potentials as required to each of the comb tooth-shaped electrodes 224, 225, 232 and 233 so that an electrostatic force is generated between the comb tooth-shaped electrodes 224 and 232 and/or between the comb tooth-shaped electrodes 225 and 233. The amount of displacement can be adjusted by adjusting the applied potentials. As a result of such rotational driving of the mirror part 210, the direction of reflection of the light that is reflected by the mirror surface 214 disposed on the mirror part 210 can be switched.

FIGS. 16–20 show the series of steps in the micro-structural unit manufacturing method of a second embodiment of the present invention. This method is one method that is used to manufacture the abovementioned micro-mirror element X2 by micro-machining techniques. In FIGS. 16–20, the formation processes of the mirror part M2, inner frames F5 and F6, set of comb tooth-shaped electrodes E3 and E4 and outer frame F7 shown in FIG. 20D are shown as changes in a single cross section. This single cross section is expressed as a continuous cross section by modeling a plurality of cross sections contained in a single micro-switching element formation region in the material substrate (wafer having a multi-layer structure) on which machining is performed. In FIG. 20D, the mirror part M2 corresponds to a portion of the mirror part 210. The inner frame F5 corresponds to a portion of the inner frame 220. The comb tooth-shaped electrode E3 corresponds to portions of the comb tooth-shaped electrodes 222–225. The comb tooth-shaped electrode E4 correspond to portions of the comb tooth-shaped electrodes 212, 213, 232 and 233. The inner frame F6 corresponds to another portion of the inner frame 220. The outer frame F7 corresponds to a portion of the outer frame 230.

Figure 16A:
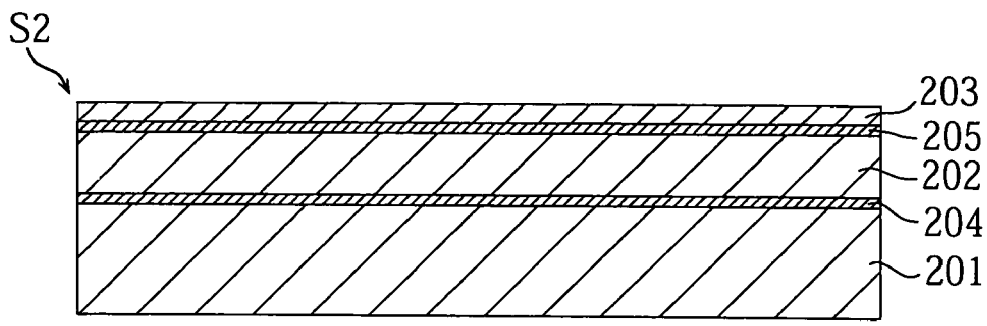
FIGS. 16A–16D show some of the steps in the micro-structural unit manufacturing method according to a second embodiment of the present invention.

In the micro-structural unit manufacturing method of this second embodiment, a material substrate S2 such as that shown in FIG. 16A is first prepared. The material substrate S2 has a laminated structure comprising silicon layers 201, 202 and 203, an insulating layer 204 disposed between the silicon layers 201 and 202, and an insulating layer 205 disposed between the silicon layers 202 and 203. The silicon layers 201–203 consist of a silicon material endowed with conductivity by doping with an impurity. The insulating layers 204 and 205 consist of (for example) an oxide material. The respective thicknesses of the silicon layers 201–203 are (for example) 200 µm, 100 µm and 20 µm. The respective thicknesses of the insulating layers 204 and 205 are (for example) 500 nm. The material substrate S2 can be manufactured utilizing the method described above in regard to the material substrate S1.

Figure 16B:
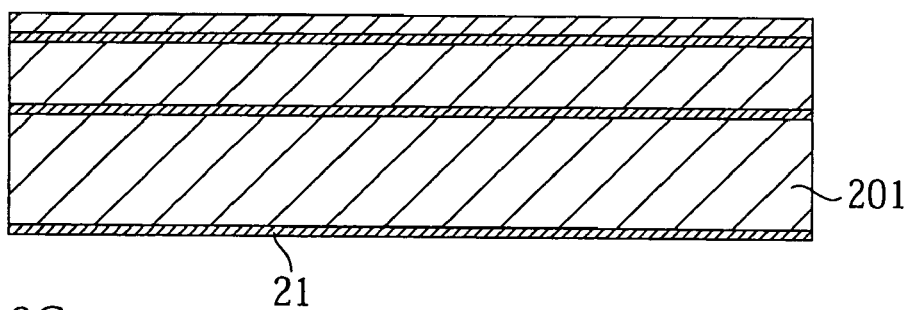

Next, as shown in FIG. 16B, a metal film 21 is formed on the silicon layer 201. For example, this metal film 21 can be formed by using a sputtering method to form Cr (50 nm) and then Au (200 nm) into films on the silicon layer 201. As will be described later, a specified wiring pattern including electrode pads is formed from this metal film 21. Accordingly, it is desirable that the formation of this metal film 21 be performed in an early stage in which the degree of cleanness of the material substrate S2 (wafer) is high, as in the present embodiment.

Figure 16C:
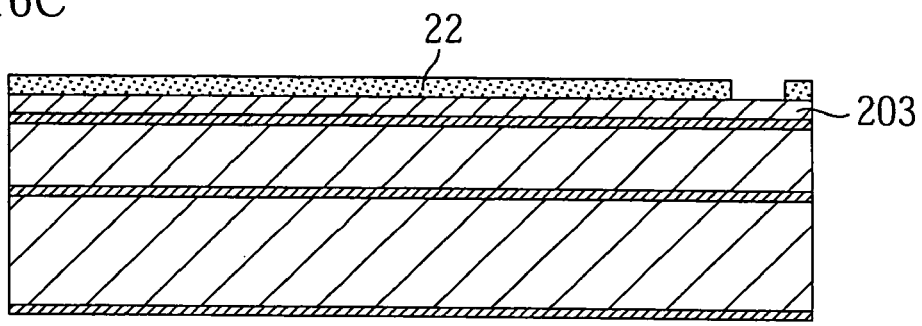
Figure 16D:
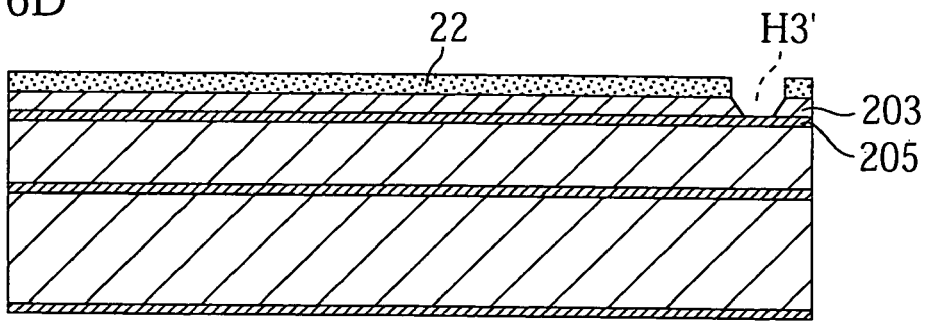

Next, as shown in FIG. 16C, a resist pattern 22 which has specified opening parts is formed on the silicon layer 203. Next, as shown in FIG. 16D, holes H3' that pass through the silicon layer 203 are formed. Specifically, an etching treatment is performed on the silicon layer 203 as far as the insulating layer 205 by dry etching, anisotropic etching or the like using the resist pattern 22 as a mask.

Figure 17A:
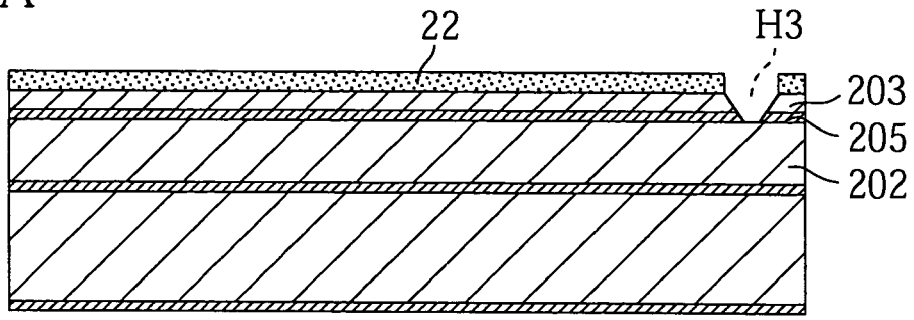
FIGS. 17A–17D show steps that follow the procedure shown in FIGS. 16A–16D.
Figure 17B:
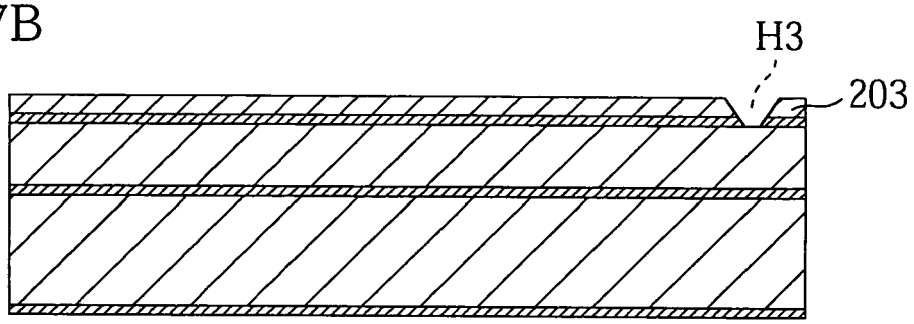

Next, as shown in FIG. 17A, the portions of the insulating layer 205 that are exposed in the holes H3' are removed by etching so that holes H3 that pass through the insulating layer 205 in addition to the silicon layer 203 are formed. Dry etching can be used as the etching method. Subsequently, as shown in FIG. 17B, the resist pattern 22 is stripped by causing a stripping solution to act on this resist pattern.

Figure 17C:
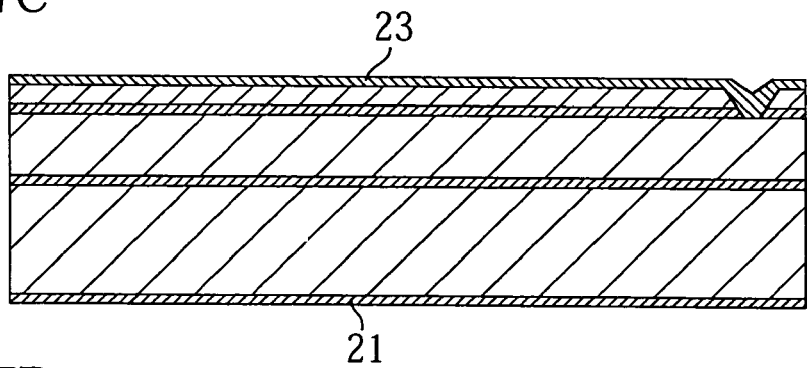
Figure 17D:
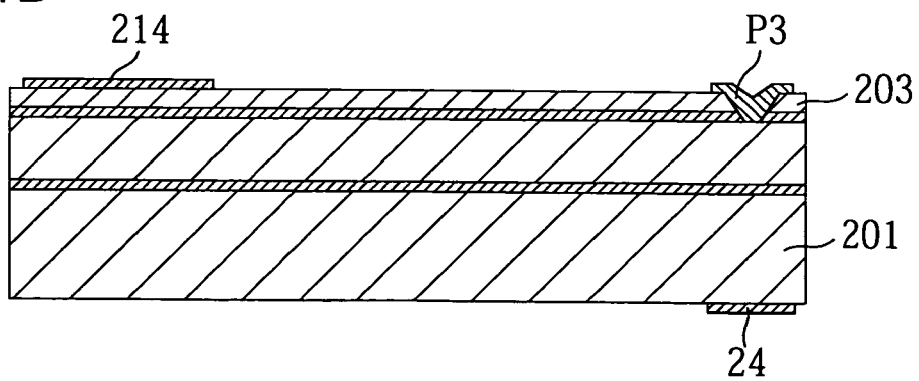

Next, as shown in FIG. 17C, a metal film 23 that covers the silicon layer 203 and the interiors of the holes H3 is formed. For example, the method used to form the metal film 23 is the same as the method described above in regard to the metal film 21. In the present embodiment, since the silicon layer 203 is thin, the metal material can be appropriately deposited on the inside surfaces of the holes H3 even by sputtering or vapor deposition if the holes H3 have a tapered shape as shown in FIG. 17B. In cases where the silicon layer 203 is thick, it is desirable to use DRIE as formation method of the holes H3' described above with reference to the FIG. 16D, and to fill the interiors of the holes H3 with a conductive material using a CVD method or CMP method in the same manner as described above with reference to FIGS. 7D and 8A in regard to the first embodiment. Following this step, a specified wiring pattern (not shown in FIGS. 12–15) including electrode pads 24 for external connections is formed in the metal film 21, and a mirror surface 214 and plugs P3 are formed in the metal film 23, by performing an etching treatment on the metal films 21 and 23 via a specified mask as shown in FIG. 17D.

Figure 18A:
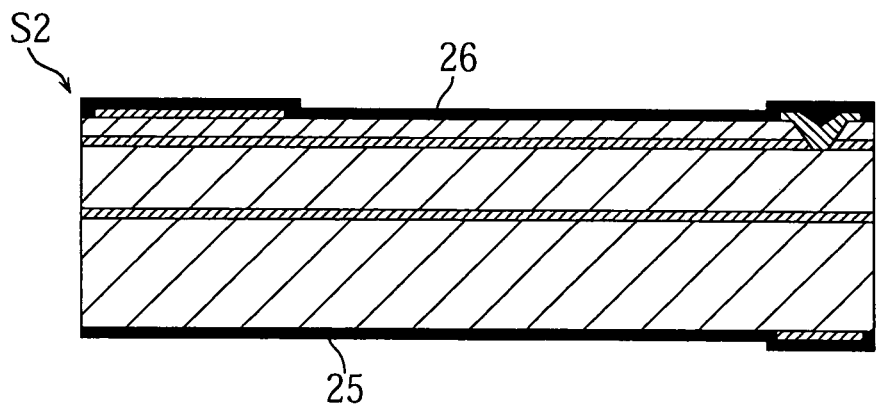
FIGS. 18A–18D show steps that follow the procedure shown in FIGS. 17A–17D.
Figure 18B:
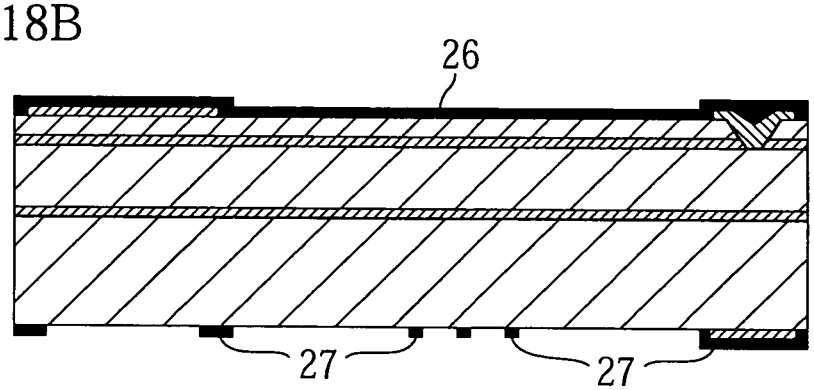

Next, as shown in FIG. 18A, oxide films 25 and 26 are formed on both surfaces of the material substrate S2. For example, the oxide films 25 and 26 consisting of silicon oxide, and have a thickness of 1 $\mu$m. Subsequently, as shown in FIG. 18B, the oxide film 25 is patterned so that an oxide film pattern 27 is formed. The oxide film pattern 27 has a pattern shape that corresponds to a portion of the mirror part M2, the comb tooth-shaped electrode E4 and the outer frame F7.

Figure 18C:
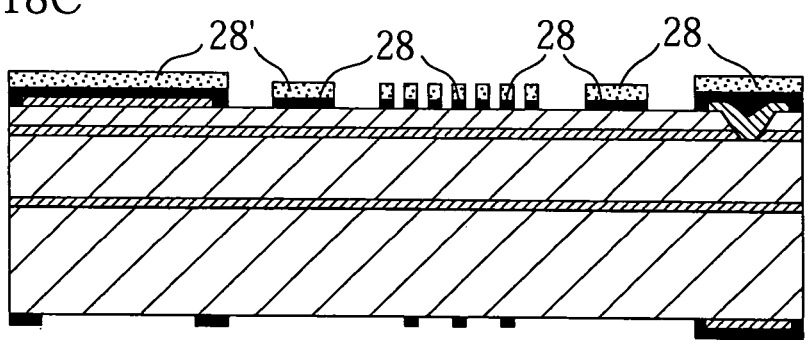

Next, as shown in FIG. 18C, the oxide film 26 is patterned so that an oxide film pattern 28 is formed. Specifically, after a resist pattern 28' is formed on the oxide film 26, an etching treatment is performed on the oxide film 26 with this resist pattern 28' used as a mask. The oxide film pattern 28 has a pattern shape that corresponds to the mirror part M2, inner frames F5 and F6, comb tooth-shaped electrode E1 and outer frame F7. Following the formation of this oxide film pattern 28, the resist pattern 28' is left without being removed.

Figure 18D:
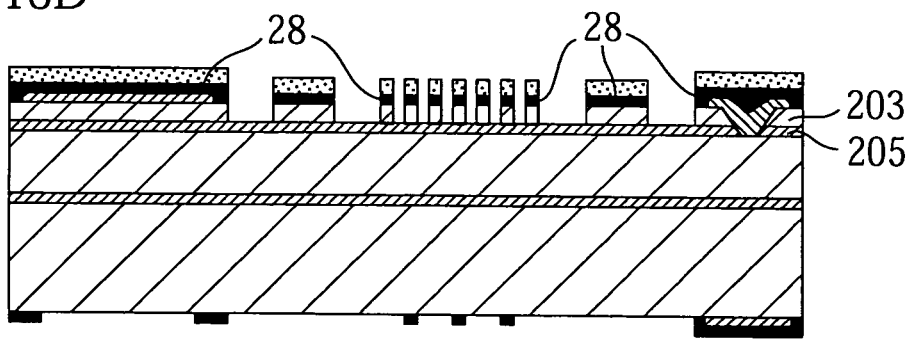

Next, as shown in FIG. 18D, an etching treatment is performed by dry etching, wet etching or the like on the portions of the silicon layer 203 that were exposed in the preceding process, until the insulating layer 205 is reached. As a result of this etching treatment, a portion of the mirror part M2, portions of the inner frames F5 and F6, portions of the comb tooth-shaped electrodes E3 and E4 and a portion of the outer frame F7 are formed.

Figure 19A:
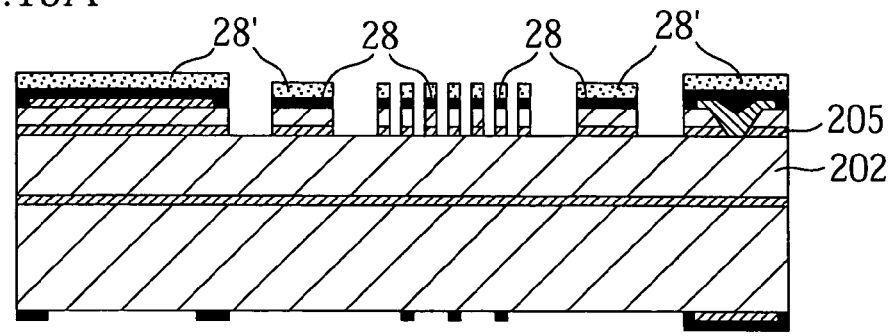
FIGS. 19A–19D show steps that follow the procedure shown in FIGS. 18A–18D.

Next, as shown in FIG. 19A, an etching treatment is performed on the portions of the insulating layer 205 that were exposed in the preceding step, until the silicon layer 202 is reached. As a result of this etching treatment, a portion of the mirror part M2, portions of the inner frames F5 and F6, portions of the comb tooth-shaped electrodes E3 and E4 and a portion of the outer frame F7 are formed. Following this step, the resist pattern 28' is removed by causing a stripping solution to act on this resist pattern.

Figure 19B:
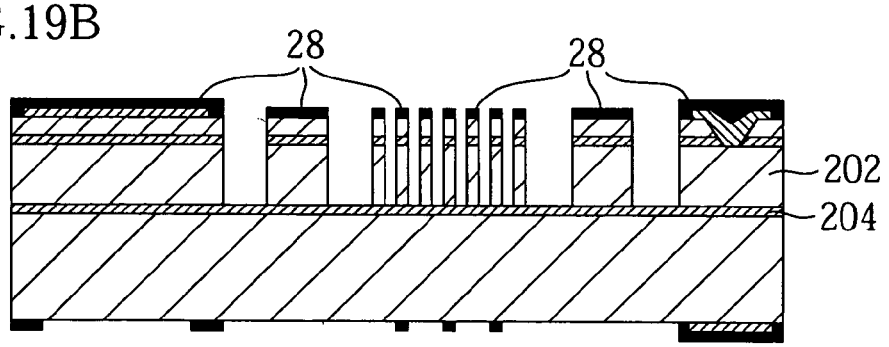

Next, as shown in FIG. 19B, an etching treatment is performed by DRIE on the silicon layer 202 using the oxide film pattern 28 as a mask until the insulating layer 204 is reached. As a result of this etching treatment, a portion of the mirror part M2, the inner frames F5 and F6, portions of the comb tooth-shaped electrode E3 and comb tooth-shaped electrode E4 and a portion of the outer frame F7 are formed.

Figure 19C:
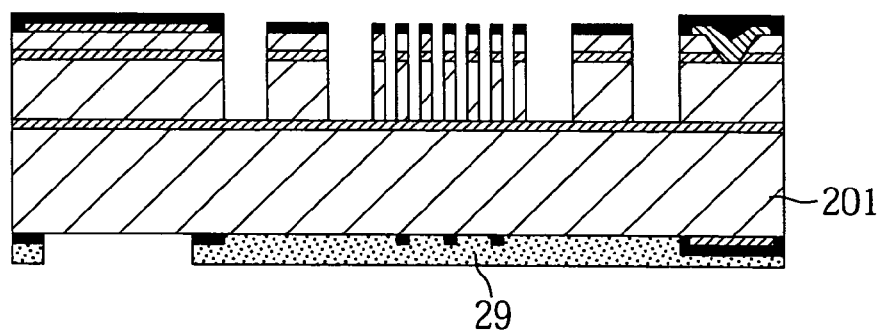
Figure 19D:
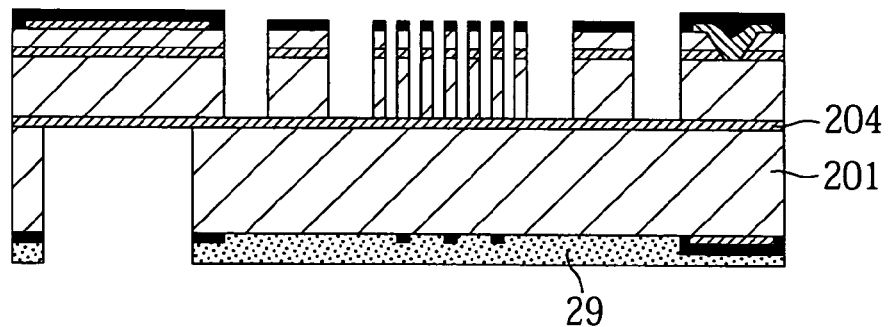

Next, as shown in FIG. 19C, a resist pattern 29 that has specified opening parts is formed on the silicon layer 201. In the present step, it would also be possible to form a nitride film pattern with the same pattern shape instead of the resist pattern 29. Next, as shown in FIG. 19D, an etching treatment is performed by DRIE on the silicon layer 201 using the resist pattern 29 as a mask, until the insulating layer 204 is reached. As a result of this etching treatment, a portion of the mirror part M2 is formed.

Figure 20A:
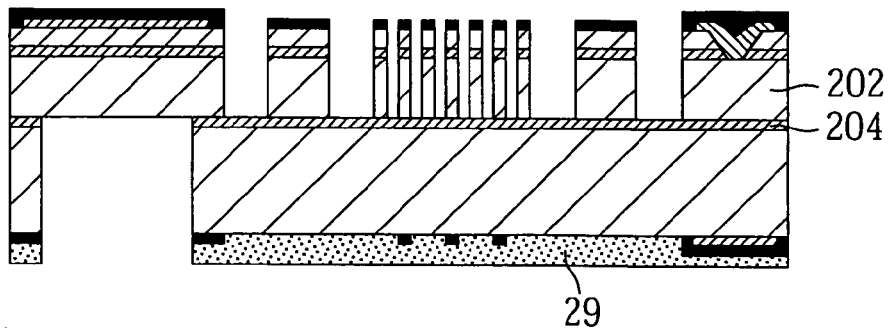
FIGS. 20A–20D show steps that follow the procedure shown in FIGS. 19A–19D.
Figure 20B:
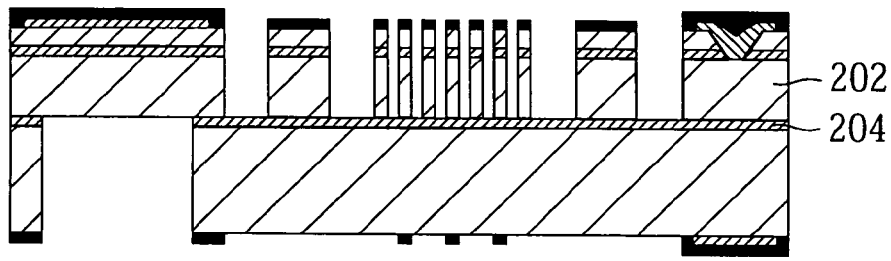

Next, as shown in FIG. 20A, an etching treatment is performed on the portions of the insulating layer 204 that were exposed in the preceding step, until the silicon layer 202 is reached. As a result of this etching treatment, a portion of the mirror part M2 is formed. Subsequently, as shown in FIG. 20B, the resist pattern 29 is removed.

Figure 20C:
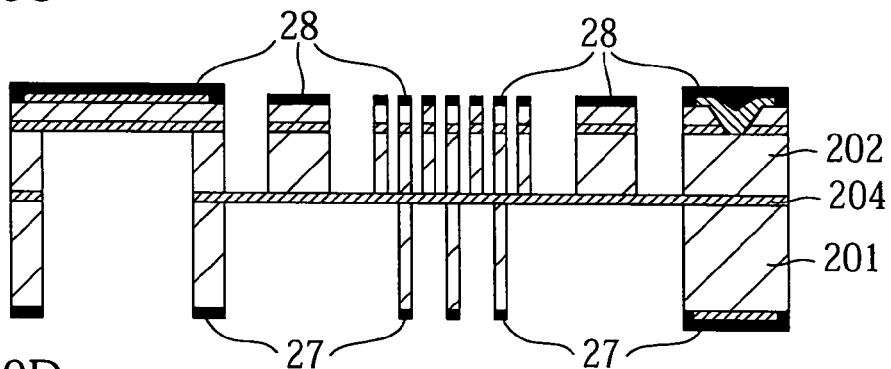
Figure 20D:
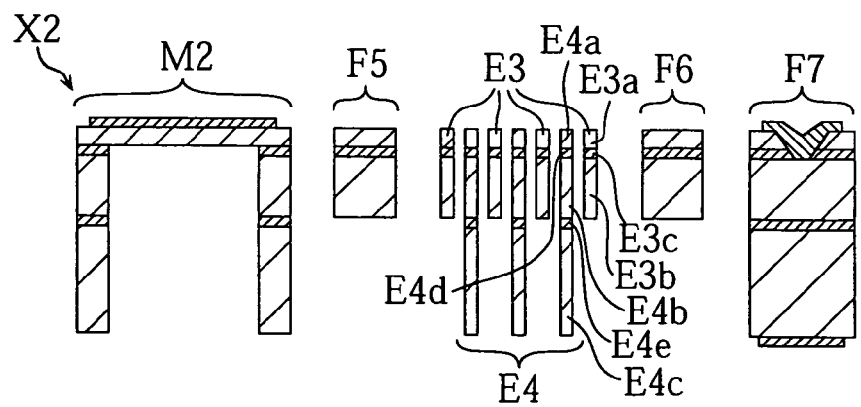

Next, as shown in FIG. 20C, an etching treatment is performed by DRIE on the silicon layer 201 using the oxide film pattern 27 as a mask until the insulating layer 204 is reached, and an etching treatment is performed on the portions of the silicon layer 202 that were exposed in the step described above with reference to FIG. 20A, until the insulating layer 205 is reached. As a result of this etching treatment, a portion of the mirror part M2, a portion of the comb tooth-shaped electrode E4 and a portion of the outer frame F7 are formed. Subsequently, as shown in FIG. 20D, the exposed portions of the insulating layers 204 and 205 and the oxide film patterns 27 and 28 are removed by etching.

As a result of the above series of steps, the mirror part M2, inner frames F5 and F6, comb tooth-shaped electrodes E3 and E4 and outer frame F7 are formed, so that the micro-mirror element X2 shown in FIGS. 12–15 is manufactured.

In the present embodiment, a mirror part M2 can be formed in which the portions other than the peripheral edge parts are thinner than the inner frames F5 and F6, comb tooth-shaped electrodes E3 and E4 and outer frame F7. These thin portions in the mirror part M2 correspond to the thickness of the silicon layer 203 in the material substrate S2. Accordingly, the thickness of the thin portions of the mirror part M2 can be adjusted by appropriately setting the thickness of the silicon layer 203 in the material substrate S2, so that a desired reduction in the weight of the mirror part M2 (mirror part 210) can be achieved. Furthermore, in the present embodiment, the length of the comb tooth-shaped electrode E3 in the thickness direction Y can be adjusted with a high degree of precision by appropriately setting mainly the thickness of the silicon layer 201 in accordance with the silicon layers 203 and 202. Thus, if the micro-structural unit manufacturing method of the second embodiment is used, desired thickness dimensions can be realized with a high degree of freedom and a high degree of precision for the mirror part M2 and the comb tooth-shaped electrodes E3 and E4, which have different thicknesses in the single micro-mirror element X2 that is manufactured.

Since the micro-mirror element X2 comprises a thin (and therefore light-weight) mirror part M2 and a set of comb tooth-shaped electrodes E3 and E4 that include a comb tooth-shaped electrode E4 that is thick in the thickness direction Y, this construction is suitable for achieving a reduction in the driving voltage and an increase in the driving speed.

In the present embodiment, as was described above, a set of comb tooth-shaped electrodes E3 and E4 that overlap with each other in the thickness direction Y can be formed. The comb tooth-shaped electrode E3 has a laminated structure comprising conductive parts E3$a$ and E3$b$ and insulating parts E3$c$ disposed between these conductive parts, and the comb tooth-shaped electrode E4 has a laminated structure comprising conductive parts E4$a$ and E4$b$ and E4$c$ and insulating parts E4$d$ and E4$e$ disposed between these conductive parts. The comb tooth-shaped electrode E3 as a whole, and the conductive parts E4$a$ and E4$b$ and insulating parts E4$d$ of the comb tooth-shaped electrodes E4 overlap with each other in the thickness direction Y.

In the present embodiment, plugs P1 that are used for the electrical connection of parts originating silicon layer 201 and parts originating in the silicon layer 202, and plugs P2 that are used for the electrical connection of parts originating in the silicon layer 202 and parts originating in the silicon layer 203, may also be appropriately embedded in specified locations in the mirror part 210, inner frame 220 and outer frame 230 by the method described above in the first embodiment. The conductive parts E4$b$ and E4$c$ of the comb tooth-shaped electrode E4 can be electrically connected by forming plugs P1 in appropriate locations. Similarly, the conductive parts E3$a$ and E3$b$ of the comb tooth-shaped electrode E3 can be electrically connected, and the conductive parts E4$a$ and E4$b$ of the comb tooth-shaped electrode E4 can be electrically connected, by forming plugs P2 in appropriate locations.

Figure 21:
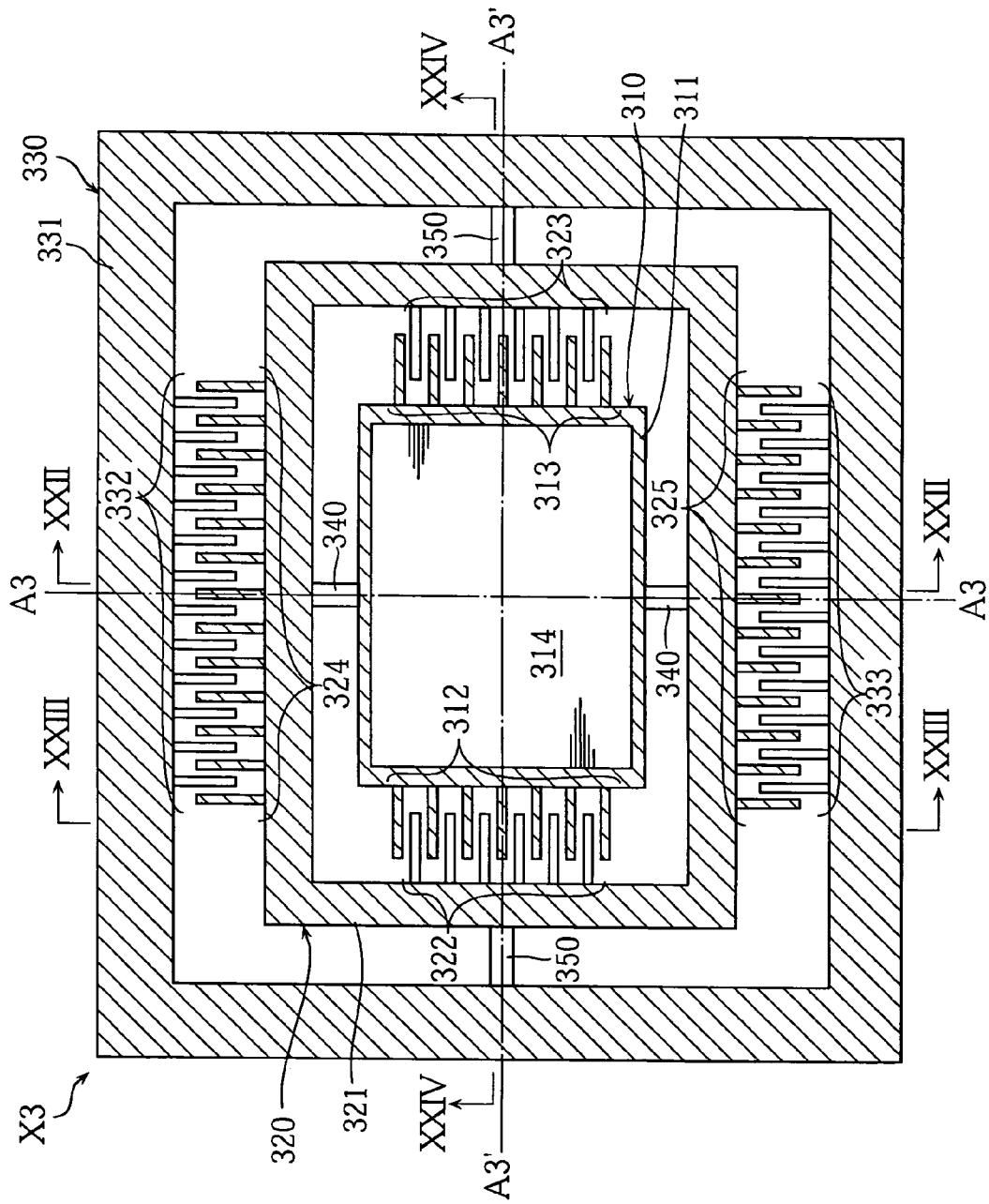
FIG. 21 is a plan view of a micro-mirror element obtained by a method of the present invention.
Figure 22:
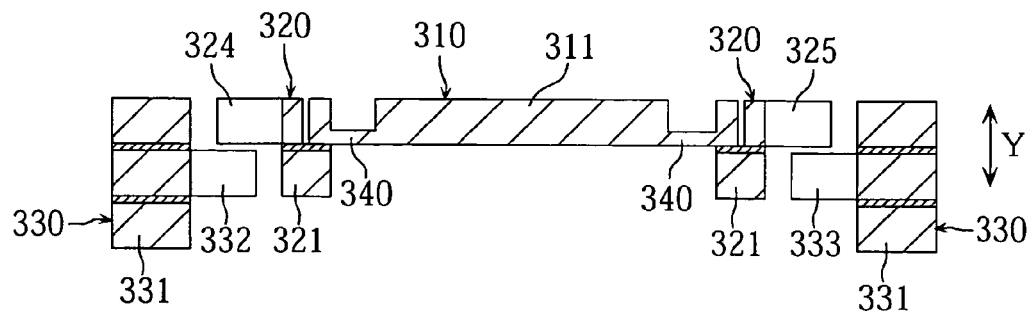
FIG. 22 is a sectional view along line XXII—XXII in FIG. 21.
Figure 23:
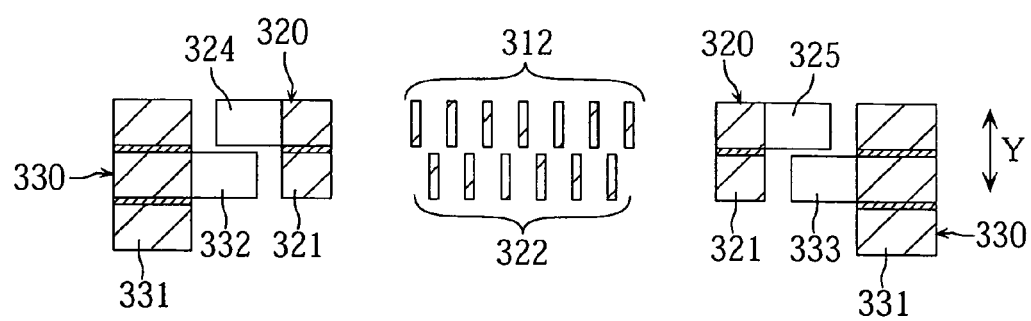
FIG. 23 is a sectional view along line XXIII—XXIII in FIG. 21.
Figure 24:
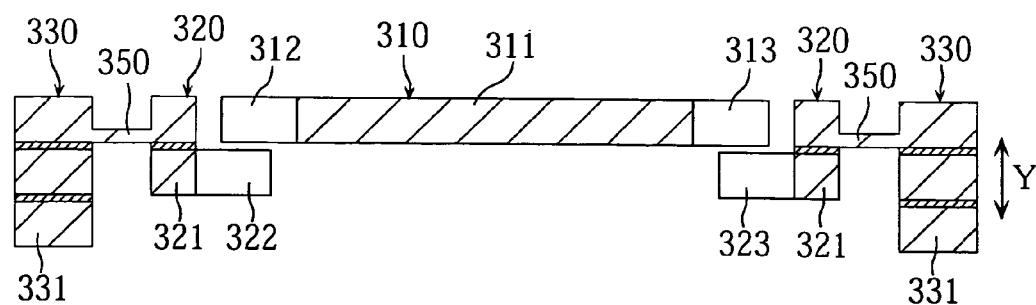
FIG. 24 is a sectional view along line XXIV—XXIV in FIG. 21.

FIGS. 21–24 show a micro-mirror element X3 which is one example of a micro-structural unit that can be manufactured by the micro-structural unit manufacturing method of the present invention. FIG. 21 is a plan view of the micro-mirror element X3, and FIGS. 22–24 are respective sectional views along line XXII—XXII, line XXIII—XXIII and line XXIV—XXIV in FIG. 21.

The micro-mirror element X3 comprises a mirror part 310, an inner frame 320 that surrounds this mirror part, an outer frame 330 that surrounds this inner frame, a pair of torsion bars 340 that connect the mirror part 310 and inner frame 320, and a pair of torsion bars 350 that connect the inner frame 320 and outer frame 330. The separation distance between the mirror part 310 and inner frame 320 and the separation distance between the inner frame 320 and outer frame 330 are (for example) 10 to 200 $\mu$m. The pair of torsion bars 340 define the axis of rotation A3 of the rotational operation of the mirror part 310 with respect to the inner frame 320. The pair of torsion bars 350 define the axis of rotation A3' of the rotational operation of the inner frame 320 and accompanying mirror part 310 with respect to the outer frame 330. These torsion bars 340 and 350 are disposed so that the two axes of rotation A3 and A3' are perpendicular to each other. In FIG. 21, the portions that protrude further toward the front with respect to the plane of the page than the torsion bars 340 and 350 (excluding the mirror surface 314 that appears later) are indicated by hatching. Furthermore, the micro-mirror element X3 is formed by a micro-machining technique from a material substrate S3 that will be described later, and, as will be described in detail later, this material substrate S3 has a laminated structure comprising silicon layers 301, 302 and 303, an insulating layer 304 disposed between the silicon layers 301 and 302, and an insulating layer 305 disposed between the silicon layers 302 and 303.

The mirror part 310 has a main body part 311 and comb tooth-shaped electrodes 312 and 313. A mirror surface 314 is disposed on the upper surface of the main body part 311. The comb tooth-shaped electrodes 312 and 313 each comprise a plurality of electrode teeth, and extend from a pair of end portions of the main body part 311.

The inner frame 320 has a main body part 321, a pair of comb tooth-shaped electrodes 322 and 323, and a pair of comb tooth-shaped electrodes 324 and 325. The comb tooth-shaped electrodes 322–325 each comprise a plurality of electrode teeth; the comb tooth-shaped electrodes 322 and 323 extend inward from the main body part 321, and the comb tooth-shaped electrodes 324 and 325 extend outward from the main body part 321. The comb tooth-shaped electrodes 322 and 323 are respectively disposed in positions corresponding to the comb tooth-shaped electrodes 312 and 313 of the mirror part 310. As is shown most clearly in FIG. 23, the comb tooth-shaped electrodes 312 and 322 are disposed so that these electrodes do not contact each other even when the mirror part 310 is rotationally driven as described later. Similarly, the comb tooth-shaped electrodes 313 and 323 are also disposed so that these electrodes do not contact each other even when the mirror part is rotationally driven.

As is shown most clearly in FIG. 22, the pair of torsion bars 340 are respectively thinner than the mirror part 310 and inner frame 320, and are connected to the main body part 311 of the mirror part 310 and the main body part 321 of the inner frame 320.

The outer frame 330 has a main body part 331 and a pair of comb tooth-shaped electrodes 332 and 333. The comb tooth-shaped electrodes 332 and 333 each comprise a plurality of electrode teeth, and extend inward from the main body part 331; furthermore, these electrodes are disposed in positions corresponding to the comb tooth-shaped electrodes 324 and 325 of the inner frame 320. The comb tooth-shaped electrodes 224 and 332 are disposed so that these electrodes do not contact each other even when the mirror part 310 is rotationally driven as describe later. Similarly, the comb tooth-shaped electrodes 325 and 333 are also disposed so that these electrodes do not contact each other when the mirror part 310 is rotationally driven. As is shown most clearly in FIGS. 22–24, the main body part 331 of the outer frame 330 is longer in the downward direction than the comb tooth-shaped electrodes 322, 323, 332 and 333 (in the thickness direction Y of the substrate). As a result of having such an outer frame 330, the micro-mirror element X3 can be mounted on a circuit board without interposing spacers or the like. If the micro-mirror element X3 is mounted on a specified circuit board via (for example) the lower end of the main body part 331 shown in FIG. 23, a specified distance is maintained between the circuit board and the main body part 321 of the inner frame 320 and comb tooth-shaped electrodes 322 and 323 by the portions of the main body part 331 that extend further downward than the other portions. In cases where this distance is sufficiently long, the contact of the main body part 321 of the inner frame 320 and the comb tooth-shaped electrodes 322 and 323 with the circuit board can be avoided even when the inner frame 320 performs a rotational operation as described later.

As is shown most clearly in FIG. 24, the pair of torsion bars 350 are respectively thinner than the inner frame 320 and outer frame 330, and are connected to the main body part 321 of the inner frame 320 and the main body part 332 of the outer frame 321.

In such a micro-mirror element X3, the mirror part 310 can be rotationally displaced about the axis of rotation A3 with respect to the inner frame 320 by applying desired potentials as required to each of the comb tooth-shaped electrodes 312, 313, 322 and 323 so that an electrostatic force is generated between the comb tooth-shaped electrodes 312 and 322 and/or between the comb tooth-shaped electrodes 313 and 323. The amount of displacement can be adjusted by adjusting the applied potentials. Furthermore, the inner frame 320 and accompanying mirror part 310 can be rotationally displaced about the axis of rotation A3' with respect to the outer frame 330 by applying desired potentials as required to each of the comb tooth-shaped electrodes 324, 325, 332 and 333 so that an electrostatic force is generated between the comb tooth-shaped electrodes 324 and 332 and/or between the comb tooth-shaped electrodes 325 and 333. The amount of displacement can be adjusted by adjusting the applied potentials. As a result of such rotational driving of the mirror part 310, the direction of reflection of the light that is reflected by the mirror surface 314 disposed on the mirror part 310 can be switched.

Figure 26A:
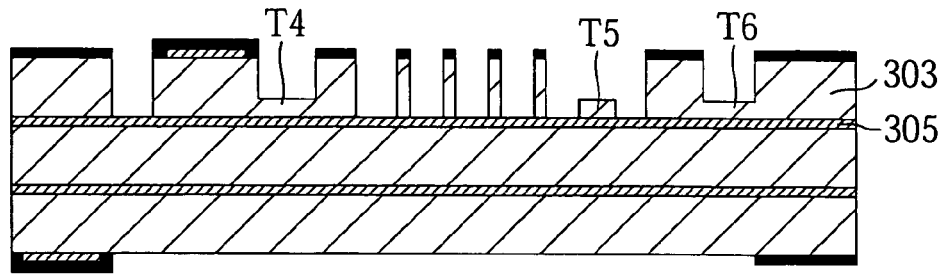
FIGS. 26A–26D show steps that follow the procedure shown in FIGS. 25A–25D.
Figure 26B:
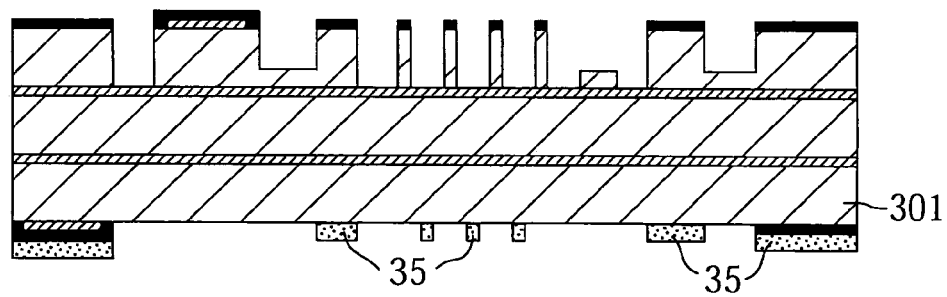
Figure 26C:
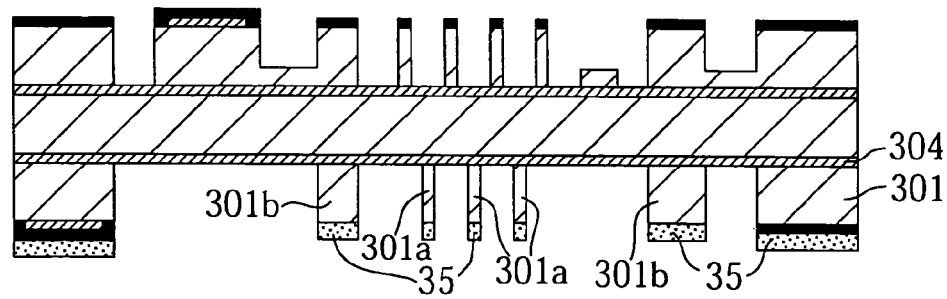
Figure 26D:
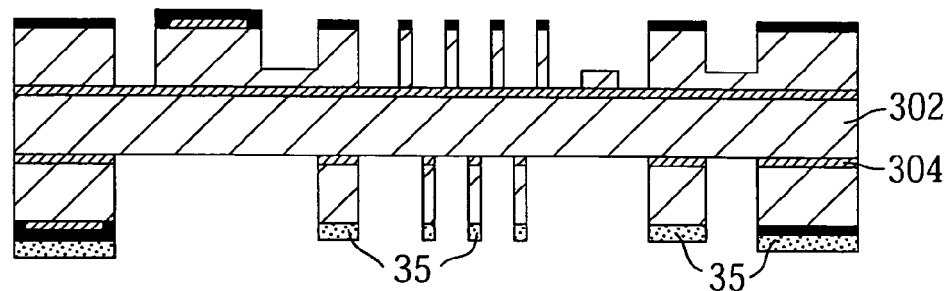
Figure 27A:
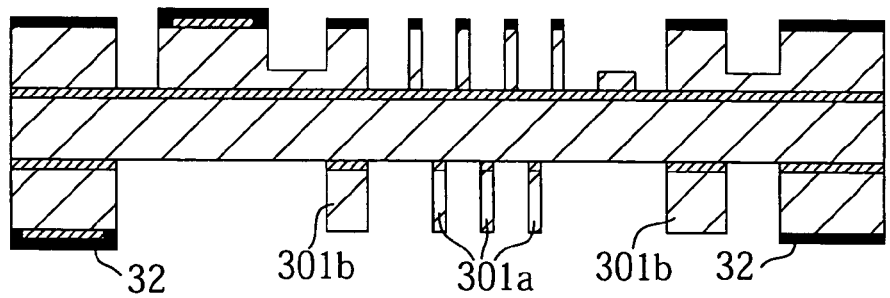
FIGS. 27A–27C show the steps that follow the procedure shown in FIGS. 26A–26D.
Figure 27B:
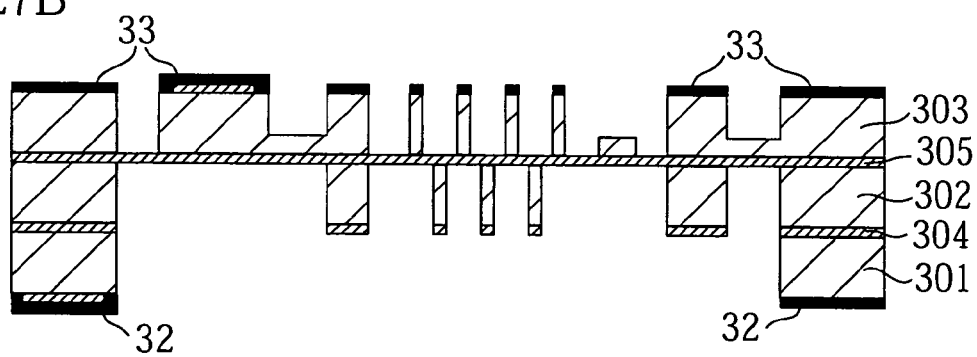
Figure 27C:
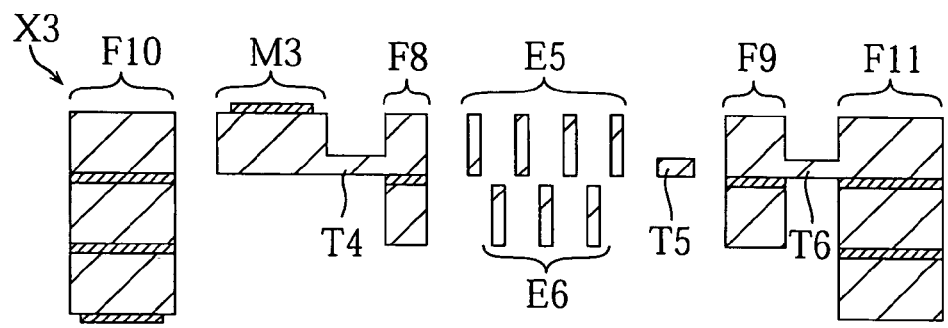

FIGS. 25–27 show the series of steps in the micro-structural unit manufacturing method of a third embodiment of the present invention. This method is one method that is used to manufacture the abovementioned micro-mirror element X3 by micro-machining techniques. In FIGS. 25–27, the formation processes of the mirror part M3, torsion bars T4–T6, inner frames F8 and F9, set of comb tooth-shaped electrodes E5 and E6 and outer frames F10 and F11 shown in FIG. 27C are shown as changes in a single cross section. This single cross section is shown as a continuous cross section by modeling the cross sections of a plurality of specified locations contained in a single micro-mirror element formation region in the material substrate (wafer with a multi-layer structure) on which machining is performed. The mirror part M3 shown in FIG. 27C corresponds to a portion of the mirror part 310. The torsion bars T4 correspond to the torsion bars 340; a sectional view in the direction of extension is shown. The inner frame F8 corresponds to a portion of the inner frame 320. The comb tooth-shaped electrode E5 corresponds to portions of the comb tooth-shaped electrodes 312, 313, 324 and 325. The comb tooth-shaped electrode E6 corresponds to portions of the comb tooth-shaped electrodes 322, 323, 332 and 333. The torsion bars T5 correspond to the torsion bars 340 and 350; a cross section is shown. The inner frame F9 corresponds to another portion of the inner frame 320. The torsion bars T6 correspond to the torsion bars 350; a sectional view in the direction of extension is shown. The outer frame F10 corresponds to a portion of the outer frame 330. The outer frame F11 corresponds to another portion of the outer frame 330.

Figure 25A:
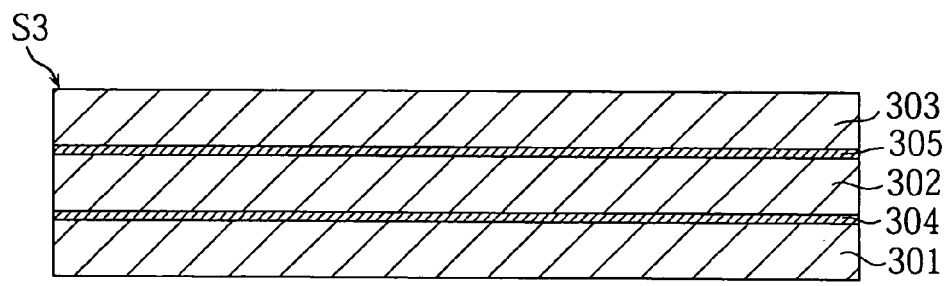
FIGS. 25A–25D show some of the steps in a micro-structural unit manufacturing method according to a third embodiment of the present invention.

In the micro-structural unit manufacturing method of the third embodiment, a material substrate S3 such as that shown in FIG. 25A is first prepared. The material substrate S3 has a laminated structure comprising silicon layers 301, 302 and 303, an insulating layer 304 disposed between the silicon layers 301 and 302, and an insulating layer 305 disposed between the silicon layers 302 and 303. The silicon layers 301–303 consist of a silicon material endowed with conductivity by doping with an impurity. The insulating layers 304 and 305 consist of (for example) an oxide material. The respective thicknesses of the silicon layers 301–303 are (for example) 100 $\mu$m. The respective thicknesses of the insulating layers 304 and 305 are (for example) 500 nm. The material substrate S3 can be manufactured using the method described above in regard to the manufacture of the material substrate S1.

Figure 25B:
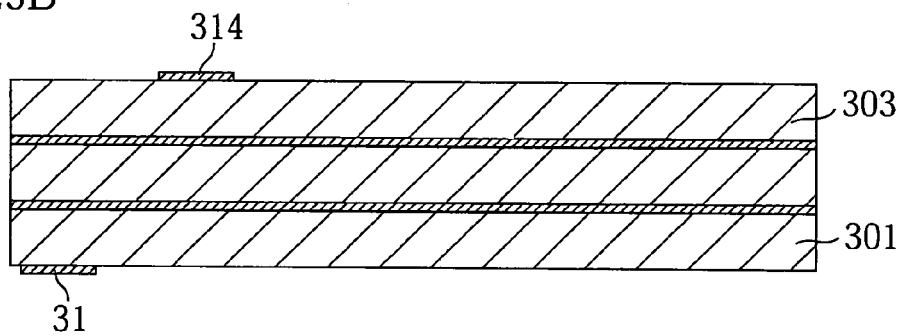

Next, as shown in FIG. 25B a mirror surface 314 is formed on the silicon layer 303, and electrode pads 31 (not shown in FIGS. 21–24) used for external connections are formed on the silicon layer 301. The formation methods of the mirror surface 314 and electrode pads 31 are the same as the formation methods of the mirror surface 114 and electrode pads 15 in the first embodiment.

Figure 25C:
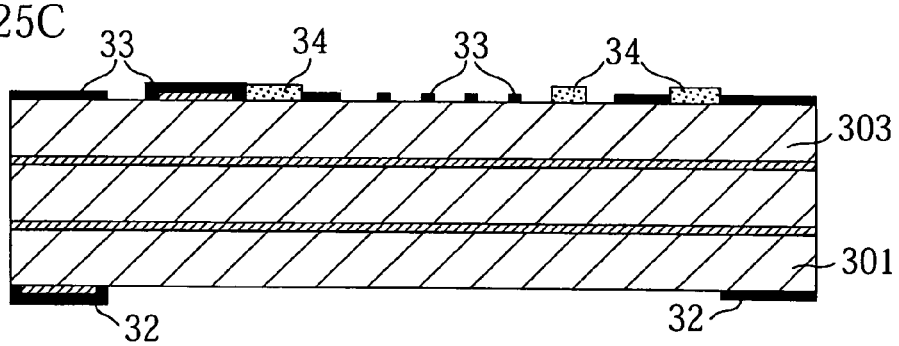

Next, as shown in FIG. 25C, an oxide film pattern 32 is formed on the silicon layer 301, and an oxide film pattern 33 and resist pattern 34 are formed on the silicon layer 303. The oxide film pattern 32 has a pattern shape corresponding to the outer frames F10 and 11, and the oxide film pattern 33 has a pattern shape corresponding to the mirror pat M3, inner frames F8 and F9, comb tooth-shaped electrode E5 and outer frames F10 and F11. Furthermore, the resist pattern 34 has a pattern shape corresponding to the torsion bars T4–T6.

Figure 25D:
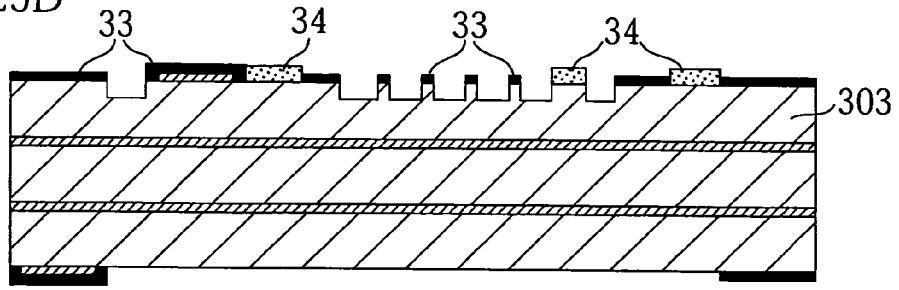

Next, as shown in FIG. 25D, an etching treatment is performed on the silicon layer 303 to a specified depth by DRIE using the oxide film pattern 33 and resist pattern 34 as masks. This specified depth is a depth corresponding to the thickness of the torsion bars T4–T6, and is (for example) 10 $\mu$m. As a result of the etching treatment of this step, a portion of the mirror part M3, portions of the inner frames F8 and F9, a portion of the comb tooth-shaped electrode E5 and portions of the outer frames F10 and F11 are formed.

Next, after the resist pattern 34 is removed, an etching treatment is performed on the silicon layer 303 until the insulating layer 304 is reached, while leaving the torsion bars T4–T6, as shown in FIG. 26A. As a result of this etching treatment, the mirror part M3, the torsion bars T4–T6, portions of the inner frames F8 and F9, the comb tooth-shaped electrode E5 and portions of the outer frames F10 and F11 are formed.

Next, as shown in FIG. 26B, a resist pattern 35 is formed on the silicon layer 301. The resist pattern 35 has a pattern shape corresponding to the inner frames F8 and F9, the comb tooth-shaped electrode E6 and the outer frames F10 and F11. Next, as shown in FIG. 26C, an etching treatment is performed on the slayer 301 by DRIE using the resist pattern 35 as a mask, until the insulating layer 304 is reached. As a result of this etching treatment, residual mask parts 301a for the comb tooth-shaped electrode E6, residual mask parts 301b for the inner frame, and portions of the outer frames F10 and F11, are formed. Next, as shown in FIG. 26D, an etching treatment is performed on the portions of the insulating layer 304 that were exposed in the preceding step, until the silicon layer 302 is reached. As a result of this etching treatment, portions of the outer frames F10 and F11 are formed.

Next, as shown in FIG. 27A, the resist pattern 35 is removed. Next, as shown in FIG. 27B, an etching treatment is performed on the silicon layer 301 by DRIE using the oxide film pattern 32 as a mask until the insulating layer 304 is reached, and an etching treatment is performed on the portions of the silicon layer 302 that were exposed in the step described above with reference to FIG. 26D until the insulating layer 305 is reached. As a result of this etching treatment, the residual mask parts 301a and 301b are removed, and portions of the inner frames F8 and F9, the comb tooth-shaped electrode E6 and portions of the outer frames F10 and F11 are formed. Subsequently, as shown in FIG. 27C, the exposed portions of the insulating layers 304 and 305 and the oxide film patterns 32 and 33 are removed by etching.

As a result of the above series of steps, the mirror part M3, torsion bars T4–T6, inner frames F8 and F9, comb tooth-shaped electrodes E5 and E6 and outer frames F10 and F11 are formed, so that the micro-mirror element X3 shown in FIGS. 21–24 is manufactured.

In the present embodiment, the thicknesses of the mirror part M3, set of comb tooth-shaped electrodes E5 and E6 and inner frames F8 and F9 can be adjusted by appropriately setting the thicknesses of the silicon layers 302 and 303 in the material substrate S3. Furthermore, the thicknesses of the outer frames F10 and F11 can vacuum evaporation adjusted by further appropriately adjusting the thickness of the silicon layer 301. In the present embodiment, furthermore, torsion bars T4–T6 that are thinner than the mirror part M, inner frames F8 and F9, comb tooth-shaped electrodes E5 and E6 and outer frames F10 and F11 can be formed. Thus, if the micro-structural unit manufacturing method of the third embodiment is used, desired thickness dimensions can be realized with a high degree of freedom and a high degree of precision for each of a plurality of structural parts (mirror part 310, inner frame 320, outer frame 330 and torsion bars 340 and 350) in a single micro-mirror element X3 that is manufactured. By setting a sufficient thickness for the outer frames F10 and F11 whose thickness can be adjusted independently from the other parts, it is possible to use a material substrate S3 that has a sufficient thickness; accordingly, damage to the material substrate S3 in the manufacturing process can be prevented.

Furthermore, in the present embodiment, plugs P1 that are used for the electrical connection of parts originating in the silicon layer 301 and parts originating in the silicon layer 302, and plugs P2 used for the electrical connection of parts originating in the silicon layer 302 and parts originating in the silicon layer 303, may also be appropriately embedded in the mirror part 310, inner frame 320 and outer frame 330 by the method described above in the first embodiment.

FIGS. 28–31 show the series of steps in the micro-structural unit manufacturing method of a fourth embodiment of the present invention. This method is one method for manufacturing the abovementioned micro-mirror element X3 by micro-machining techniques. In FIGS. 28–31, as in FIGS. 25–27, the formation processes of the mirror part M3, torsion bars T4–T6, inner frames F8 and F9, set of comb tooth-shaped electrodes E5 and E6 and outer frames F10 and F11 are expressed as changes in a single sectional view.

Figure 28A:
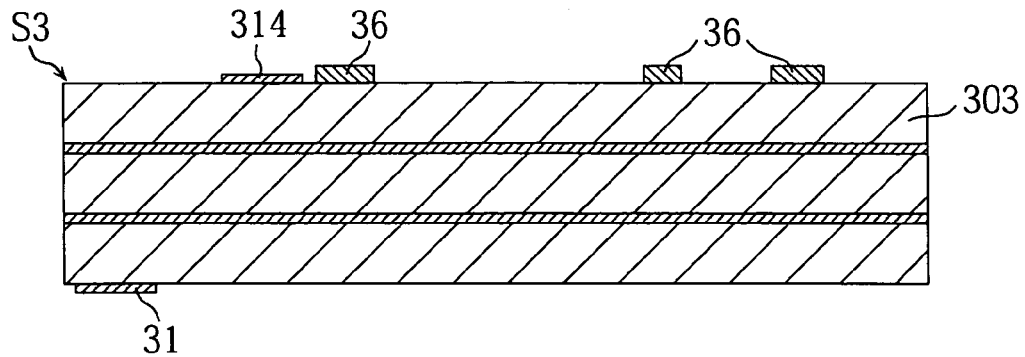
FIGS. 28A–28D show some of the steps in a micro-structural unit manufacturing method according to a fourth embodiment of the present invention.

In the micro-structural unit manufacturing method of the fourth embodiment, as shown in FIG. 28A, a nitride film pattern 36 is first formed on the silicon layer 303 in a material substrate S3 that has been machined into the state shown in FIG. 25B. For example, this nitride film pattern 36 can be formed by forming a nitride material such as silicon nitride or the like into a film on the surface of the silicon layer 303 by a CVD method, and then etching this nitride film using a specified resist pattern as a mask. The nitride film pattern 36 has a pattern shape that corresponds to the torsion bars T4–T6.

Figure 28B:
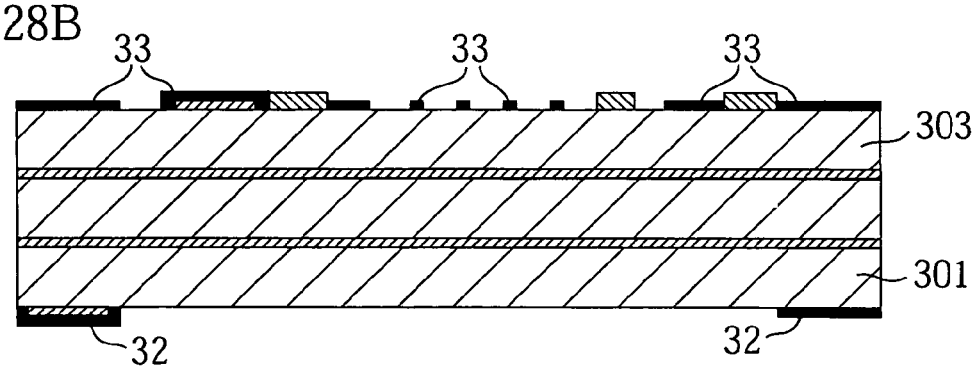

Next, as shown in FIG. 28B, an oxide film pattern 32 is formed on the silicon layer 301, and an oxide film pattern 33 is formed on the silicon layer 303. As was described above, the oxide film pattern 32 has a pattern shape that corresponds to the outer frames F10 and F11, and the oxide film pattern 33 has a pattern shape that corresponds to the mirror part M3, inner frames F8 and F9, comb tooth-shaped electrode E5 and outer frames F10 and F11.

Figure 28C:
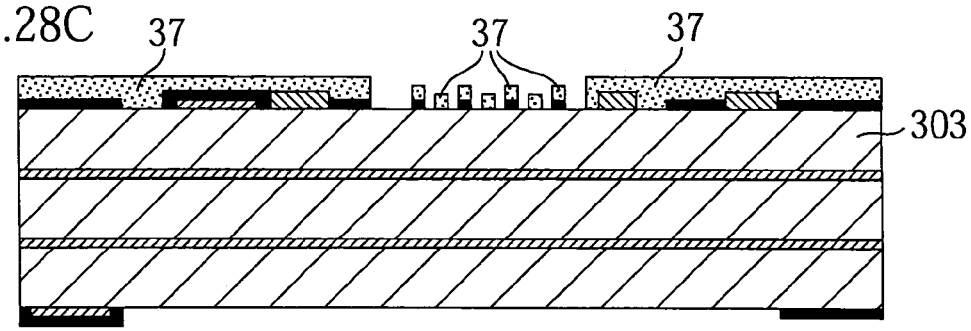
Figure 28D:
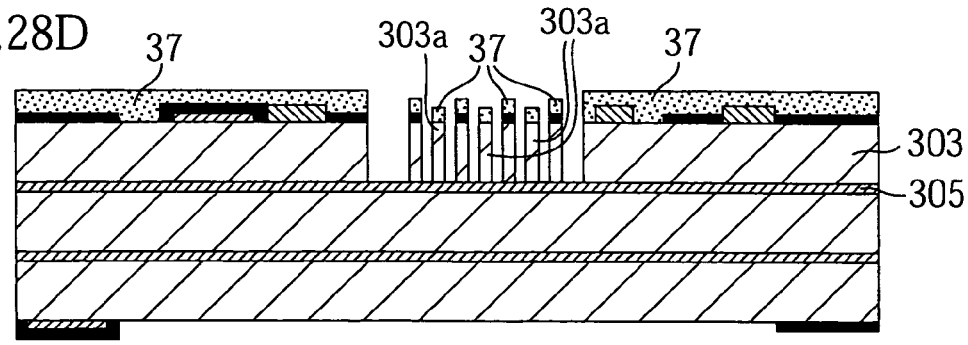

Next, as shown in FIG. 28C, a resist pattern 37 is formed on the silicon layer 303. The resist pattern 37 includes a pattern shape that corresponds to the inner frames F8 and F9, outer frames F10 and F11 and comb tooth-shaped electrodes E5 and E6. Next, as shown in FIG. 28D, an etching treatment is performed on the silicon layer 303 by DRIE using the resist pattern 37 as a mask until the insulating layer 305 is reached. As a result of this etching treatment, residual mask parts 303a for the comb tooth-shaped electrode E6, a portion of the mirror part M3, portions of the inner frames F8 and F9 and the comb tooth-shaped electrode E5 are formed.

Figure 29A:
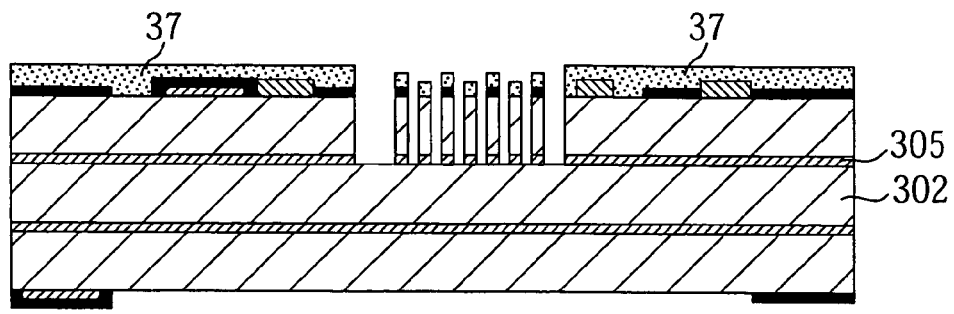
FIGS. 29A–29D show steps that follow the procedure shown in FIGS. 28A–28D.
Figure 29B:
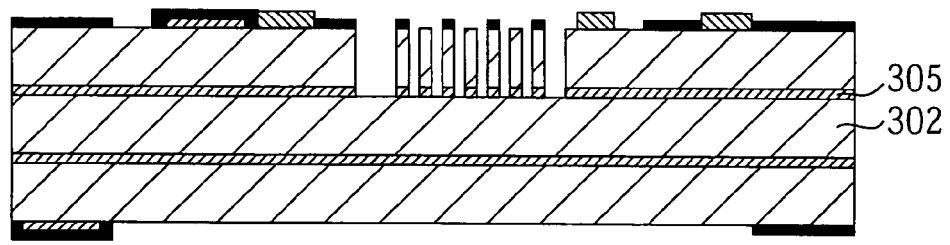

Next, as shown in FIG. 29A, an etching treatment is performed on the portions of the insulating layer 305 that were exposed in the preceding step, until the silicon layer 302 is reached. Subsequently, as shown in FIG. 29B, the resist pattern is removed.

Figure 29C:
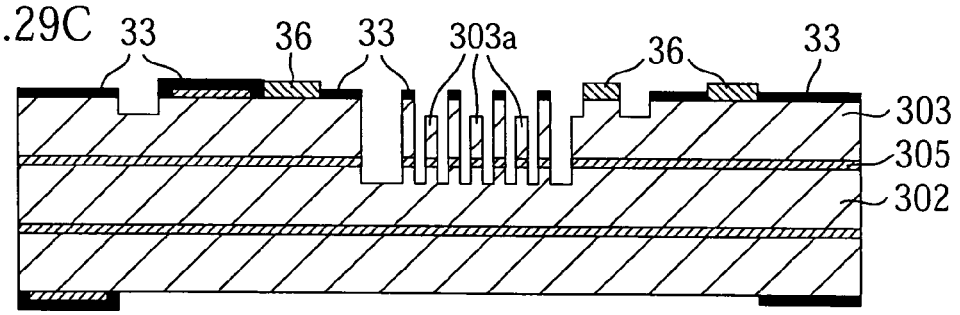
Figure 29D:
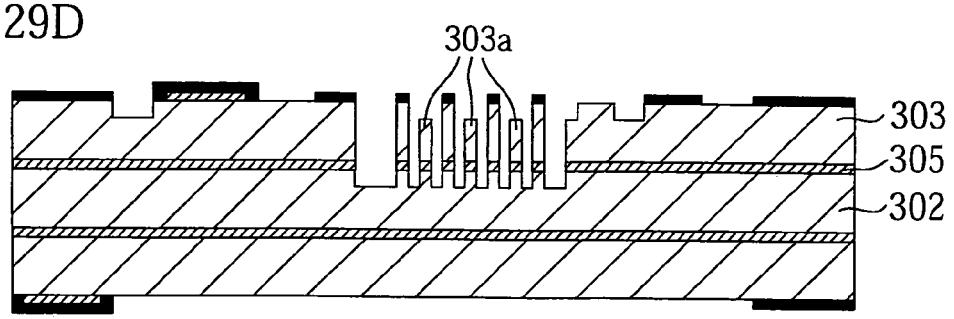

Next, as shown in FIG. 29C an etching treatment is performed on the silicon layer 303 to a specified depth by DRIE using the nitride film pattern 36 and oxide film pattern 33 as masks, and an etching treatment is performed to a specified depth on the portions of the silicon layer 302 that were exposed in the step shown in FIG. 29A. This specified depth is a depth that corresponds to the thickness of the torsion bars T4–T6, and is (for example) 10 $\mu$m. As a result of the etching treatment of this step, portions of the residual mask parts 303a are removed, and a portion of the mirror part M3, portions of the inner frames F8 and F9, a portion of the comb tooth-shaped electrode E6 and portions of the outer frames F10 and F11 are formed. Subsequently, the nitride film pattern 36 is removed as shown in FIG. 29D.

Figure 30A:
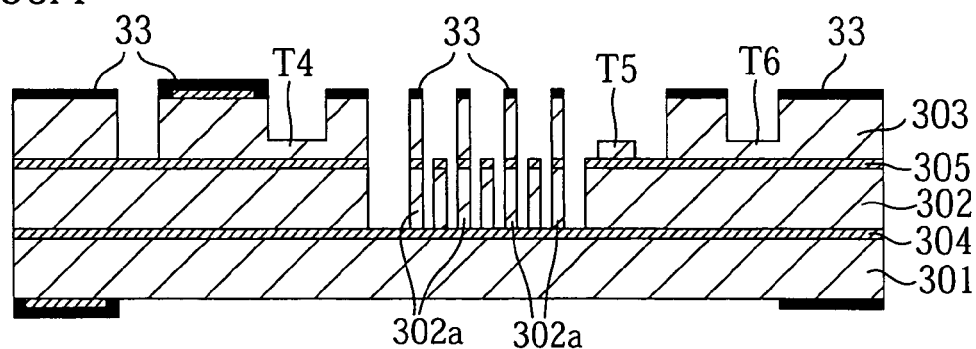
FIGS. 30A–30D show steps that follow the procedure shown in FIGS. 29A–29D.

Next, as shown in FIG. 30A, an etching treatment is performed on the silicon layer 303 until the insulating layer 305 is reached, while the torsion bars T4–T6 are left. Furthermore, an etching treatment is performed on the silicon layer 302 until the insulating layer 304 is reached. As a result of this etching treatment, the residual mask parts 303a are removed; furthermore, residual mask parts 302a for the comb tooth-shaped electrode E5, the mirror part M3, the torsion bars T4–T6, the inner frames F8 and F9, the comb tooth-shaped electrode E6 and portions of the outer frames F10 and F11 are formed.

Figure 30B:
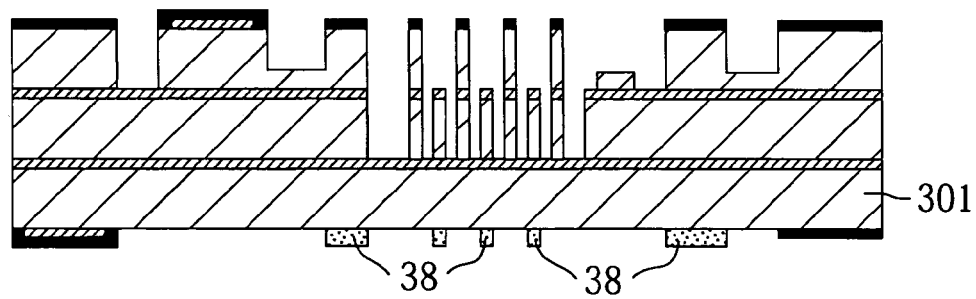
Figure 30C:
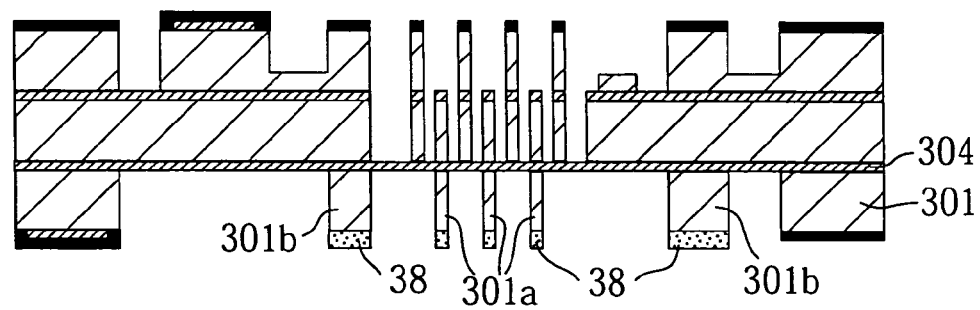

Next, as shown in FIG. 30B, a resist pattern 38 is formed on the silicon layer 301. The resist pattern 38 has a pattern shape that corresponds to the inner frames F8 and F9 and comb tooth-shaped electrode E6. Next, as shown in FIG. 30C, an etching treatment is performed on the silicon layer 301 using the resist pattern 38 as a mask until the insulating layer 304 is reached. As a result of this etching treatment, residual mask parts 301a failover the comb tooth-shaped electrode E6, residual mask parts 301b for the inner frame, and a portion of the outer frame F11, are formed.

Figure 30D:
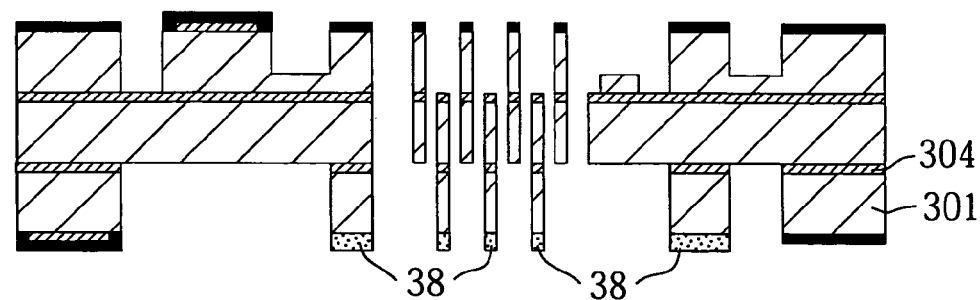
Figure 31A:
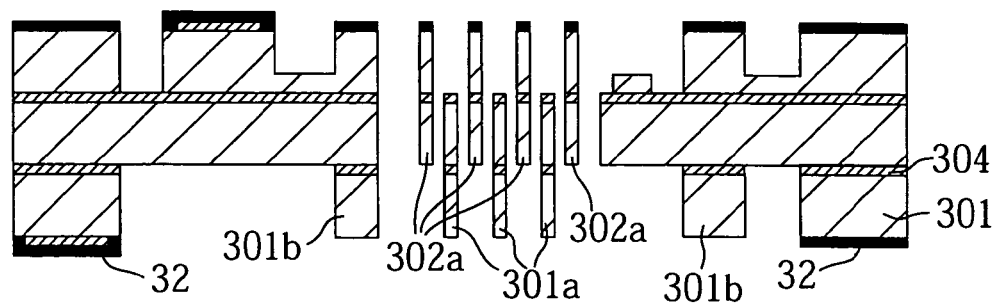
FIGS. 31A–31C show the steps that follow the procedure shown in FIGS. 30A–30D.
Figure 31B:
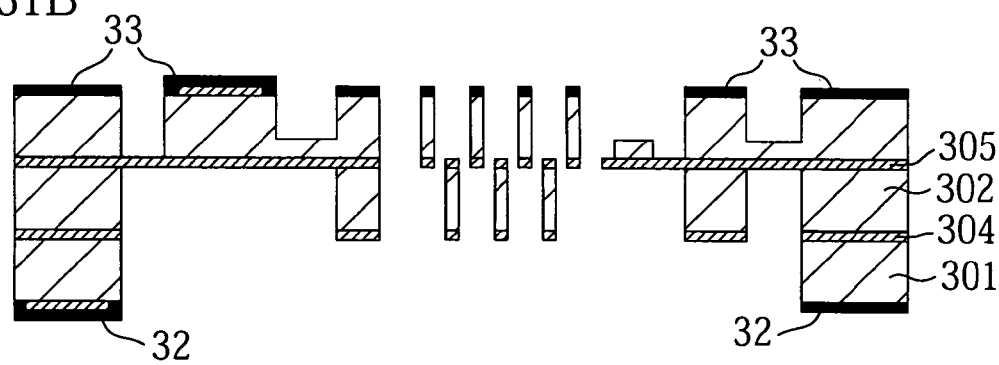
Figure 31C:
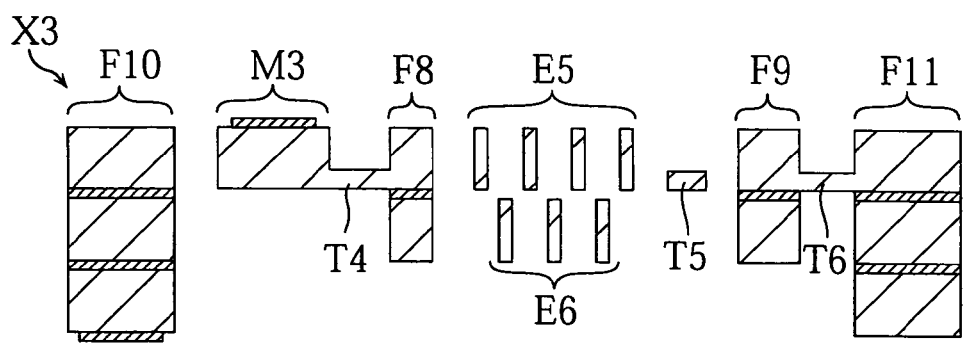
Figure 32:
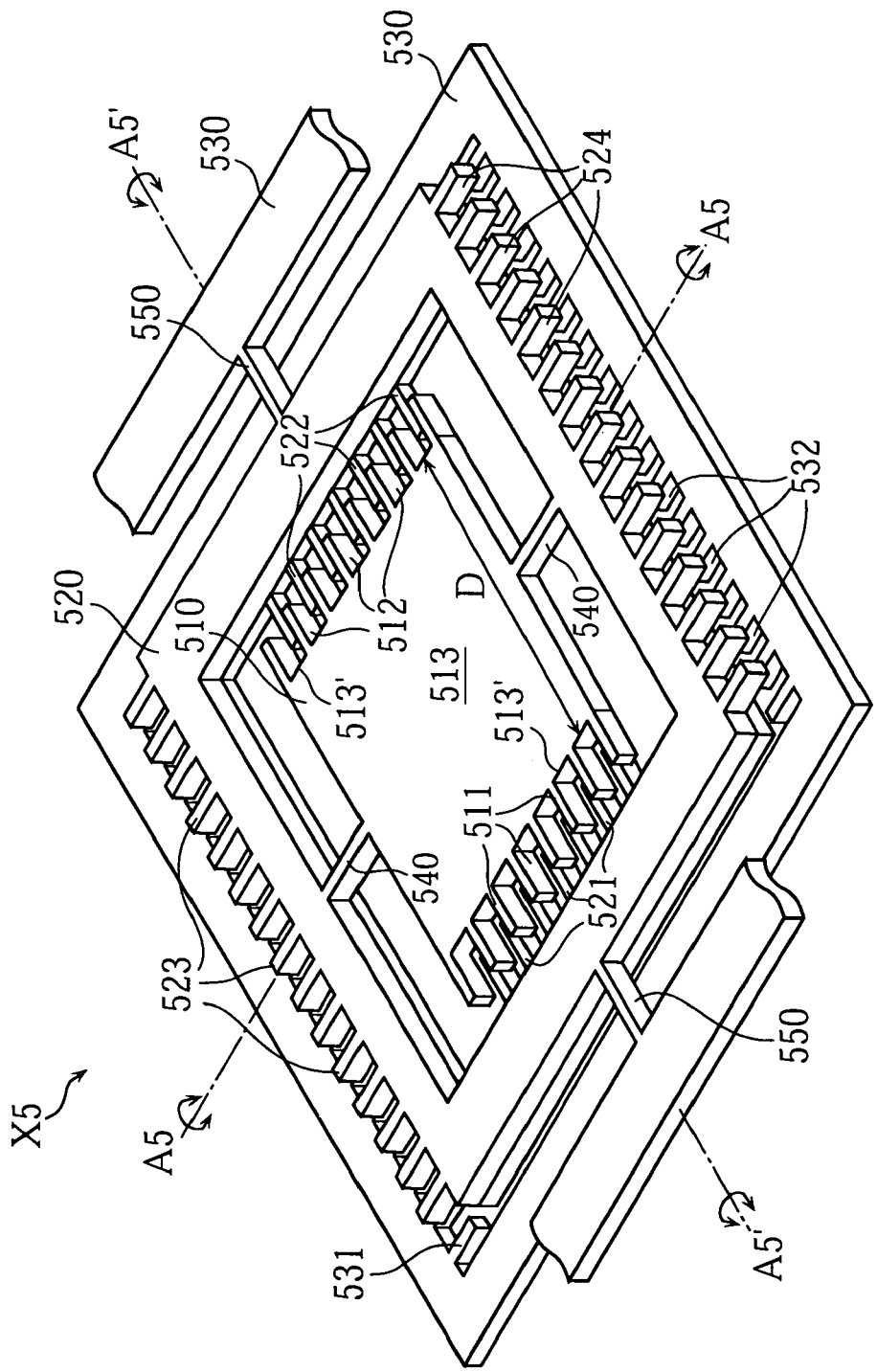
FIG. 32 is a partially cut-away perspective view of a conventional micro-mirror element.
Figure 33A:
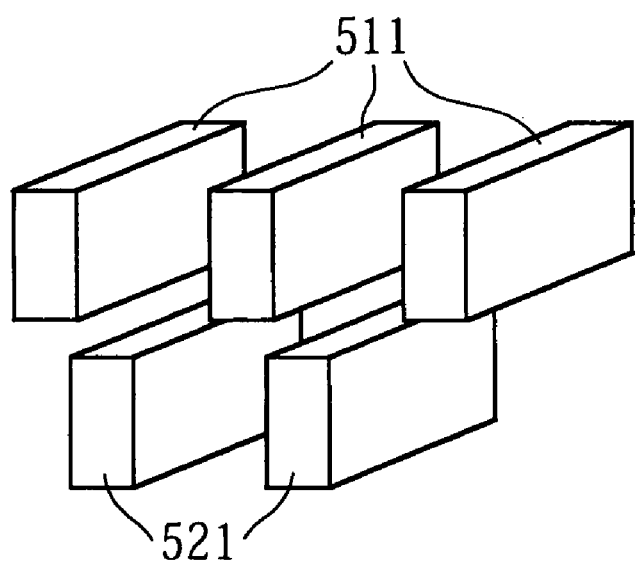
FIGS. 33A and 33B show the orientations of some cooperating comb tooth-shaped electrodes.
Figure 33B:
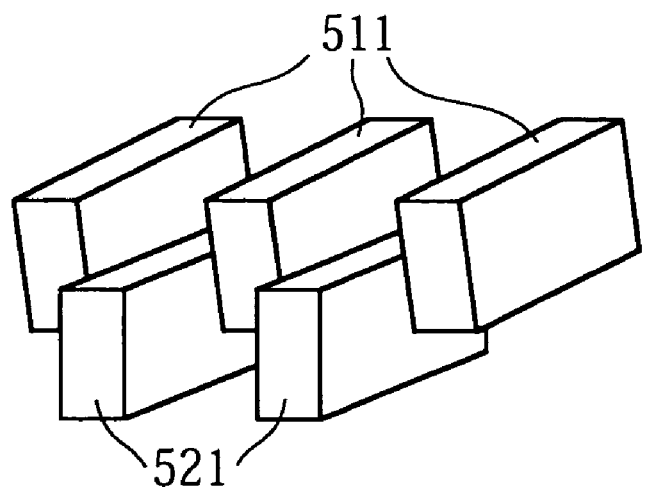
Figure 34A:
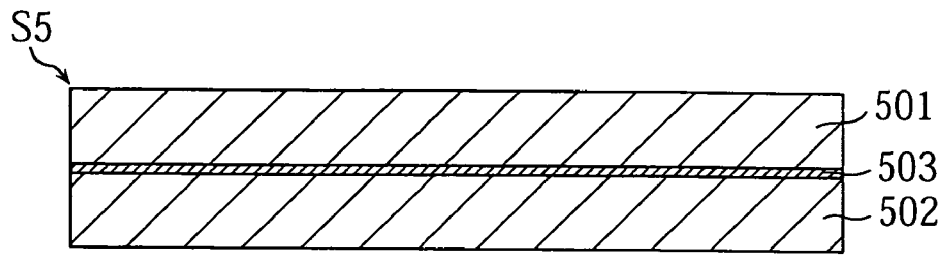
FIGS. 34A–34D show some of the steps in the manufacturing method of the micro-mirror element shown in FIG. 32.
Figure 34B:
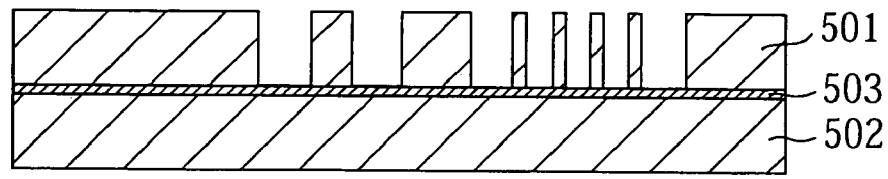
Figure 34C:
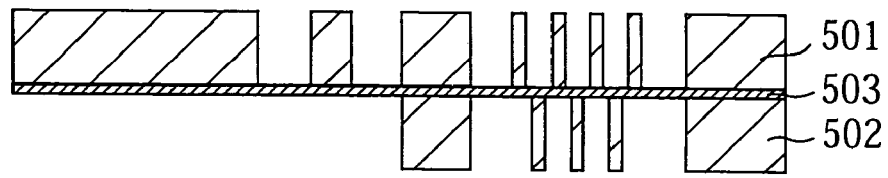
Figure 34D:
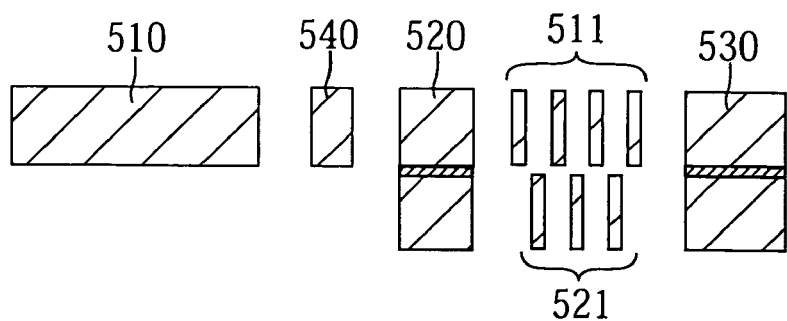

Next, as shown in FIG. 30D, the exposed portions of the insulating layer 304 are removed by etching. Next, as shown in FIG. 31A, the resist pattern 38 is removed. Next, as shown in FIG. 31B, an etching treatment is preformed on the silicon layer 301 using the oxide film pattern 32 as a mask until the insulating layer 304 is reached, and an etching treatment is performed on the portions of the silicon layer 302 that were exposed in the step described above with reference to FIG. 30D until the insulating layer 305 is reached. As a result of the etching treatment of this step, the residual mask parts 301a, 301b and 302a are removed, and portions of the inner frames F8 and F9, the comb tooth-shaped electrode E6 and portions of the outer frames 10 and 11 are formed. Subsequently, as shown in FIG. 31C, the exposed portions of the insulating layers 304 and 305 and the oxide film patterns 32 and 33 are removed by etching.

As a result of the above series of steps, the mirror part M3, torsion bars T4–T6, inner frames F8 and F9, comb tooth-shaped electrodes E5 and E6 and outer frames F10 and F11 are formed, so that the micro-mirror element X3 shown in FIGS. 21–24 is manufactured.

In the present embodiment, the same micro-mirror element X3 as that of the third embodiment can be manufactured. Accordingly, if the micro-structural unit manufacturing method of the present embodiment is used, desired thickness dimensions can be realized with a high degree of freedom and a high degree of precision for each of a plurality of structural parts in the single micro-mirror element X3 that is manufactured, and benefits similar to those described above in regard to the third embodiment can be obtained.

In addition, in the present embodiment, the patterning of the comb tooth-shaped electrode E5 is performed on the silicon layer 303 by means of the oxide film pattern 33, and the patterning of the comb tooth-shaped electrode E6 is performed on the silicon layer 303 by means of the resist pattern 37. Thus, in the present embodiment, patterning for each of the set of comb tooth-shaped electrodes E5 and E6 is performed on the same plane in a micro-structural unit manufacturing method that is accomplished by performing machining on a material substrate S3 that has three silicon layers 301, 302 and 303. Accordingly, the positioning of the two comb tooth-shaped electrodes E5 and E6 can be accomplished easily and with high precision.

Furthermore, in the present embodiment, plugs P1 that are used for the electrical connection of parts originating in the silicon layer 301 and parts originating in the silicon layer 302, and plugs P2 that are used for the electrical connection of parts originating in the silicon layer 302 and parts originating in the silicon layer 303, can also be appropriately embedded in specified locations in the mirror part 310, inner frame 320 and outer frame 330 by the method described above in the first embodiment.

What is claimed is:

1. A method for manufacturing a micro-structural unit by performing machining on a material substrate which has a laminated structure comprising a first conductive layer, a second conductive layer, a third conductive layer, a first insulating layer interposed between the first conductive layer and the second conductive layer, and a second insulating layer interposed between the second conductive layer and the third conductive layer, the method comprising:
   a first etching step for performing an etching treatment on the first conductive layer to an intermediate point in a direction of thickness of the first conductive layer via a first mask pattern and a second mask pattern formed on the first conductive layer;
   a step for removing the second mask pattern;
   a second etching step for performing an etching treatment on the first conductive layer via the first mask pattern until the first insulating layer is reached, so that residual mask parts that contact the first insulating layer are left;
   a third etching step for performing an etching treatment via the residual mask parts on portions of the first insulating layer that are exposed in the second etching step until the second conductive layer is reached; and
   a fourth etching step for removing the residual mask parts by etching, and for performing an etching treatment on portions of the second conductive layer that are exposed in the third etching step.

2. The method according to claim 1, wherein in the fourth etching step, the etching treatment performed on the exposed portions of the second conductive layer is continued until the second insulating layer is reached.

3. The method according to claim 1, further comprising a fifth etching step for performing an etching treatment on the third conductive layer via a third mask pattern formed on the third conductive layer, the etching treatment on the third conductive layer being continued until the second insulating layer is reached.

4. The method according to claim 2, wherein: the first mask pattern comprises mask parts for a comb tooth-shaped electrode;
   first conductive parts of the comb tooth-shaped electrode are formed in the first conductive layer in the second etching step;
   insulating parts of the comb tooth-shaped electrode are formed in the first insulating layer in the third etching step; and
   second conductive parts of the comb tooth-shaped electrode are formed in the second conductive layer in the fourth etching step.

5. The method according to claim 3, wherein:
   the third mask pattern comprises first mask parts for a comb tooth-shaped electrode;
   the second mask pattern comprises second mask parts for the comb tooth-shaped electrode;
   first conductive parts of the comb tooth-shaped electrode are formed in the third conductive layer in the fifth etching step;
   residual mask parts for the comb tooth-shaped electrode are formed in the first conductive layer in the second etching step; and
   second conductive parts of the comb tooth-shaped electrode are formed in the second conductive layer, and the residual mask parts are removed by etching, in the fourth etching step;
   the method further comprising a sixth etching step for forming insulating parts of the comb tooth-shaped electrode in the second insulating layer, the insulating parts being interposed between the first conductive parts and the second conductive parts.

6. The method according to claim 3, wherein:
   the third mask pattern comprises first mask parts for a first comb tooth-shaped electrode;
   the second mask pattern comprises second mask parts for the first comb tooth-shaped electrode;
   the first mask pattern comprises mask parts for a second comb tooth-shaped electrode;
   first conductive parts of the first comb tooth-shaped electrode are formed in the third conductive layer in the fifth etching step;
   residual mask parts for the first comb tooth-shaped electrode and first conductive parts of the second comb tooth-shaped electrode are formed in the first conductive layer in the second etching step;
   insulating parts of the second comb tooth-shaped electrode are formed in the first insulating layer in the third etching step; and
   second conductive parts of the first comb tooth-shaped electrode and second conductive parts of the second comb tooth-shaped electrode are formed in the second conductive layer, and the residual mask parts for the first comb tooth-shaped electrode are removed by etching, in the fourth etching step;
   the method further comprising a sixth etching step for forming insulating parts of the first comb tooth-shaped electrode in the second insulating layer, the insulating parts being interposed between the first and second conductive parts of the first comb tooth-shaped electrode.

7. The method according to claim 1, further comprising a step for forming a first conductive connecting part that passes through the first insulating layer and electrically connect the first conductive layer and the second conductive layer, and/or a step for forming a second conductive connecting part that passes through the second insulating layer and electrically connect the third conductive layer and the second conductive layer.

8. The method according to claim 4, further comprising a step for forming a first conductive connecting part that passes through the first insulating layer and electrically connect respective conductive parts in each comb tooth-shaped electrode, and/or a step for forming a second conductive connecting part that passes through the second insulating layer and electrically connect respective conductive parts in each comb tooth-shaped electrode.

* * * * *